US 11,055,121 B1
Jul. 6, 2021

(12) United States Patent
Lawrence

(54) COMPUTER ARCHITECTURE FOR EMULATING AN INTEGRATOR IN A CORRELITHM OBJECT PROCESSING SYSTEM

(71) Applicant: BANK OF AMERICA CORPORATION, Charlotte, NC (US)

(72) Inventor: Patrick N. Lawrence, Plano, TX (US)

(73) Assignee: Bank of America Corporation, Charlotte, NC (US)

(*) Notice: Subject to any disclaimer, the term of this patent is extended or adjusted under 35 U.S.C. 154(b) by 0 days.

(21) Appl. No.: 16/777,496

(22) Filed: Jan. 30, 2020

(51) Int. Cl.
G06F 9/455 (2018.01)

(52) U.S. Cl.
CPC .................................... G06F 9/455 (2013.01)

(58) Field of Classification Search
CPC ...................................................... G06F 9/455
See application file for complete search history.

(56) References Cited

U.S. PATENT DOCUMENTS

| | | | |
|---|---|---|---|
| 5,249,274 A | 9/1993 | Sztipanovits et al. | |
| 5,777,512 A * | 7/1998 | Tripathi | H03F 3/217 330/110 |
| 5,946,673 A | 8/1999 | Francone et al. | |
| 6,035,057 A | 3/2000 | Hoffman | |
| 6,044,366 A | 3/2000 | Graffe et al. | |
| 6,167,391 A | 12/2000 | Lawrence | |
| 6,278,799 B1 | 8/2001 | Hoffman | |
| 6,553,365 B1 | 4/2003 | Summerlin et al. | |
| 6,741,120 B1 * | 5/2004 | Tan | H03H 11/1291 327/554 |
| 6,941,287 B1 | 9/2005 | Vaidyanathan et al. | |
| 6,943,686 B2 | 9/2005 | Allen | |
| 6,947,913 B1 | 9/2005 | Lawrence | |
| 7,015,835 B2 | 3/2006 | Lawrence et al. | |
| 7,031,969 B2 | 4/2006 | Lawrence et al. | |
| 7,246,129 B2 | 7/2007 | Lawrence et al. | |
| 7,310,622 B2 | 12/2007 | Lawrence et al. | |

(Continued)

OTHER PUBLICATIONS

Lawrence, P. N., "Computer Architecture for Emulating a Differentiator in a Correlithm Object Processing System," U.S. Appl. No. 16/777,535, filed Jan. 30, 2020, 107 pages.

(Continued)

*Primary Examiner* — Doon Y Chow
*Assistant Examiner* — Kimberly L Jordan
(74) *Attorney, Agent, or Firm* — Michael A. Springs

(57) ABSTRACT

A device includes a memory and a node engine. The memory stores a table that includes input values represented by first correlithm objects, feedback values represented by second correlithm objects, and output values represented by third correlithm objects. Each output value in the table is the sum of a corresponding input value and a corresponding feedback value. The node engine receives an input correlithm object and a feedback correlithm object. The node engine determines a first correlithm object in the table based on the input correlithm object and a second correlithm object in the table based on the feedback correlithm object. The node engine then determines a third correlithm object from the table based on the determined first correlithm object and the determined second correlithm object, and outputs the third correlithm object as an output correlithm object.

20 Claims, 24 Drawing Sheets

(56) References Cited

U.S. PATENT DOCUMENTS

| | | | |
|---|---|---|---|
| 7,349,928 | B2 | 3/2008 | Lawrence et al. |
| 7,418,470 | B2 | 8/2008 | Howard et al. |
| 7,526,461 | B2 | 4/2009 | Srinivasa et al. |
| 7,730,121 | B2 | 7/2010 | Howard et al. |
| 7,941,479 | B2 | 5/2011 | Howard et al. |
| 8,412,651 | B2 | 4/2013 | Paiva et al. |
| 8,521,669 | B2 | 8/2013 | Knoblauch |
| 8,762,130 | B1 | 6/2014 | Diaconescu et al. |
| 9,286,291 | B2 | 3/2016 | Bufe et al. |
| 9,460,075 | B2 | 10/2016 | Mungi et al. |
| 9,495,355 | B2 | 11/2016 | Mungi et al. |
| 9,720,998 | B2 | 8/2017 | Wang et al. |
| 9,721,190 | B2 | 8/2017 | Vijayanarasimhan et al. |
| 9,785,983 | B2 | 10/2017 | Zhao et al. |
| 10,019,650 | B1 | 7/2018 | Lawrence |
| 10,037,478 | B1 | 7/2018 | Lawrence |
| 10,049,305 | B2 | 8/2018 | Vijayanarasimhan et al. |
| 10,169,329 | B2 | 1/2019 | Futrell et al. |
| 10,210,428 | B1 | 2/2019 | Lawrence |
| 10,217,026 | B1 | 2/2019 | Lawrence |
| 10,228,940 | B1 | 3/2019 | Lawrence |
| 10,282,388 | B2 | 5/2019 | Lawrence |
| 2001/0004222 | A1* | 6/2001 | Lupia ................. G06G 7/62 327/336 |
| 2003/0158850 | A1 | 8/2003 | Lawrence et al. |
| 2003/0172368 | A1 | 9/2003 | Alumbaugh et al. |
| 2004/0044940 | A1 | 3/2004 | Lawrence et al. |
| 2005/0203947 | A1 | 9/2005 | Matzke et al. |
| 2015/0149155 | A1 | 5/2015 | Zadeh |
| 2017/0161606 | A1 | 6/2017 | Duan et al. |
| 2018/0012993 | A1 | 1/2018 | Cheng et al. |
| 2018/0157994 | A1 | 6/2018 | Levy |

OTHER PUBLICATIONS

Lawrence, P. N., "Computer Architecture for Emulating a Differential Amlpifier in a Correlithm Object Processing System," U.S. Appl. No. 16/777,572, filed Jan. 30, 2020, 107 pages.

Meersman, R. et al., "On the Move to Meaningful Internet Systems 2005: CoopIS, DOA and ODBASE," OTM Confederated International Conferences CoopIS, DOA and ODBASE Oct. 2005 Agia Napa, Cyprus, Proceedings, Part I, Oct. 31-Nov. 4, 2005, pp. 763-779.

Lawrence, P. N., "Correlithm Object Technology," Apr. 2004, 229 pages.

Stoll, C., "When Slide Rules Ruled," Scientific American, May 2006, pp. 81-87.

\* cited by examiner

FIG. 27B

COMPUTER ARCHITECTURE FOR EMULATING AN INTEGRATOR IN A CORRELITHM OBJECT PROCESSING SYSTEM

TECHNICAL FIELD

The present disclosure relates generally to computer architectures for emulating a processing system, and more specifically to a computer architecture for emulating an integrator in a correlithm object processing system.

BACKGROUND

Conventional computers are highly attuned to using operations that require manipulating ordinal numbers, especially ordinal binary integers. The value of an ordinal number corresponds with its position in a set of sequentially ordered number values. These computers use ordinal binary integers to represent, manipulate, and store information. These computers rely on the numerical order of ordinal binary integers representing data to perform various operations such as counting, sorting, indexing, and mathematical calculations. Even when performing operations that involve other number systems (e.g. floating point), conventional computers still resort to using ordinal binary integers to perform any operations.

Ordinal based number systems only provide information about the sequence order of the numbers themselves based on their numeric values. Ordinal numbers do not provide any information about any other types of relationships for the data being represented by the numeric values such as similarity. For example, when a conventional computer uses ordinal numbers to represent data samples (e.g. images or audio signals), different data samples are represented by different numeric values. The different numeric values do not provide any information about how similar or dissimilar one data sample is from another. Unless there is an exact match in ordinal number values, conventional systems are unable to tell if a data sample matches or is similar to any other data samples. As a result, conventional computers are unable to use ordinal numbers by themselves for comparing different data samples and instead these computers rely on complex signal processing techniques. Determining whether a data sample matches or is similar to other data samples is not a trivial task and poses several technical challenges for conventional computers. These technical challenges result in complex processes that consume processing power which reduces the speed and performance of the system. The ability to compare unknown data samples to known data samples is crucial for many security applications such as facial recognition, voice recognition, and fraud detection.

Thus, it is desirable to provide a solution that allows computing systems to efficiently determine how similar different data samples are to each other and to perform operations based on their similarity.

SUMMARY

Conventional computers are highly attuned to using operations that require manipulating ordinal numbers, especially ordinal binary integers. The value of an ordinal number corresponds with its position in a set of sequentially ordered number values. These computers use ordinal binary integers to represent, manipulate, and store information. These computers rely on the numerical order of ordinal binary integers representing data to perform various operations such as counting, sorting, indexing, and mathematical calculations. Even when performing operations that involve other number systems (e.g. floating point), conventional computers still resort to using ordinal binary integers to perform any operations.

Ordinal based number systems only provide information about the sequence order of the numbers themselves based on their numeric values. Ordinal numbers do not provide any information about any other types of relationships for the data being represented by the numeric values such as similarity. For example, when a conventional computer uses ordinal numbers to represent data samples (e.g. images or audio signals), different data samples are represented by different numeric values. The different numeric values do not provide any information about how similar or dissimilar one data sample is from another. Unless there is an exact match in ordinal number values, conventional systems are unable to tell if a data sample matches or is similar to any other data samples. As a result, conventional computers are unable to use ordinal numbers by themselves for comparing different data samples and instead these computers rely on complex signal processing techniques. Determining whether a data sample matches or is similar to other data samples is not a trivial task and poses several technical challenges for conventional computers. These technical challenges result in complex processes that consume processing power which reduces the speed and performance of the system. The ability to compare unknown data samples to known data samples is crucial for many applications such as security application (e.g. face recognition, voice recognition, and fraud detection).

The system described in the present application provides a technical solution that enables the system to efficiently determine how similar different objects are to each other and to perform operations based on their similarity. In contrast to conventional systems, the system uses an unconventional configuration to perform various operations using categorical numbers and geometric objects, also referred to as correlithm objects, instead of ordinal numbers. Using categorical numbers and correlithm objects on a conventional device involves changing the traditional operation of the computer to support representing and manipulating concepts as correlithm objects. A device or system may be configured to implement or emulate a special purpose computing device capable of performing operations using correlithm objects. Implementing or emulating a correlithm object processing system improves the operation of a device by enabling the device to perform non-binary comparisons (i.e. match or no match) between different data samples. This enables the device to quantify a degree of similarity between different data samples. This increases the flexibility of the device to work with data samples having different data types and/or formats, and also increases the speed and performance of the device when performing operations using data samples. These technical advantages and other improvements to the device are described in more detail throughout the disclosure.

In one embodiment, the system is configured to use binary integers as categorical numbers rather than ordinal numbers which enables the system to determine how similar a data sample is to other data samples. Categorical numbers provide information about similar or dissimilar different data samples are from each other. For example, categorical numbers can be used in facial recognition applications to represent different images of faces and/or features of the faces. The system provides a technical advantage by allowing the system to assign correlithm objects represented by categorical numbers to different data samples based on how similar they are to other data samples. As an example, the system is able to assign correlithm objects to different images of people such that the correlithm objects can be directly used to determine how similar the people in the images are to each other. In other words, the system can use correlithm objects in facial recognition applications to quickly determine whether a captured image of a person matches any previously stored images without relying on conventional signal processing techniques.

Correlithm object processing systems use new types of data structures called correlithm objects that improve the way a device operates, for example, by enabling the device to perform non-binary data set comparisons and to quantify the similarity between different data samples. Correlithm objects are data structures designed to improve the way a device stores, retrieves, and compares data samples in memory. Correlithm objects also provide a data structure that is independent of the data type and format of the data samples they represent. Correlithm objects allow data samples to be directly compared regardless of their original data type and/or format.

A correlithm object processing system uses a combination of a sensor table, a node table, and/or an actor table to provide a specific set of rules that improve computer-related technologies by enabling devices to compare and to determine the degree of similarity between different data samples regardless of the data type and/or format of the data sample they represent. The ability to directly compare data samples having different data types and/or formatting is a new functionality that cannot be performed using conventional computing systems and data structures.

In addition, a correlithm object processing system uses a combination of a sensor table, a node table, and/or an actor table to provide a particular manner for transforming data samples between ordinal number representations and correlithm objects in a correlithm object domain. Transforming data samples between ordinal number representations and correlithm objects involves fundamentally changing the data type of data samples between an ordinal number system and a categorical number system to achieve the previously described benefits of the correlithm object processing system.

Using correlithm objects allows the system or device to compare data samples (e.g. images) even when the input data sample does not exactly match any known or previously stored input values. For example, an input data sample that is an image may have different lighting conditions than the previously stored images. The differences in lighting conditions can make images of the same person appear different from each other. The device uses an unconventional configuration that implements a correlithm object processing system that uses the distance between the data samples which are represented as correlithm objects and other known data samples to determine whether the input data sample matches or is similar to the other known data samples. Implementing a correlithm object processing system fundamentally changes the device and the traditional data processing paradigm. Implementing the correlithm object processing system improves the operation of the device by enabling the device to perform non-binary comparisons of data samples. In other words, the device can determine how similar the data samples are to each other even when the data samples are not exact matches. In addition, the device can quantify how similar data samples are to one another. The ability to determine how similar data samples are to each other is unique and distinct from conventional computers that can only perform binary comparisons to identify exact matches.

A string correlithm object comprising a series of adjacent sub-string correlithm objects whose cores overlap with each other to permit data values to be correlated with each other in n-dimensional space. The distance between adjacent sub-string correlithm objects can be selected to create a tighter or looser correlation among the elements of the string correlithm object in n-dimensional space. Thus, where data values have a pre-existing relationship with each other in the real-world, those relationships can be maintained in n-dimensional space if they are represented by sub-string correlithm objects of a string correlithm object. In addition, new data values can be represented by sub-string correlithm objects by interpolating the distance between those and other data values and representing that interpolation with sub-string correlithm objects of a string correlithm object in n-dimensional space. The ability to migrate these relationships between data values in the real world to relationships among correlithm objects provides a significant advance in the ability to record, store, and faithfully reproduce data within different computing environments. Furthermore, the use of string correlithm objects significantly reduces the computational burden of comparing time-varying sequences of data, or multi-dimensional data objects, with respect to conventional forms of executing dynamic time warping algorithms. The reduced computational burden results in faster processing speeds and reduced loads on memory structures used to perform the comparison of string correlithm objects.

The problems associated with comparing data sets and identifying matches based on the comparison are problems necessarily rooted in computer technologies. As described above, conventional systems are limited to a binary comparison that can only determine whether an exact match is found. Emulating a correlithm object processing system provides a technical solution that addresses problems associated with comparing data sets and identifying matches. Using correlithm objects to represent data samples fundamentally changes the operation of a device and how the device views data samples. By implementing a correlithm object processing system, the device can determine the distance between the data samples and other known data samples to determine whether the input data sample matches or is similar to the other known data samples. In addition, the device can determine a degree of similarity that quantifies how similar different data samples are to one another.

Sub-string correlithm objects of a string correlithm object can be used to perform mathematical operations using correlithm objects, which facilitates homomorphic computing. Homomorphic computing offers a way to perform computations in a distributed setting or in the cloud thereby addressing many of the technical problems associated with storing, moving, and converting data back and forth between real-world values and correlithm objects. This increases processing speeds and reduces the amount of memory necessary for performing computations.

Certain embodiments of the present disclosure may include some, all, or none of these advantages. These advantages and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

FIG. 27B is an embodiment of an amplifier value table used by the differential amplifier node engine of FIG. 26.

DETAILED DESCRIPTION

FIGS. 1-5 describe various embodiments of how a correlithm object processing system may be implemented or emulated in hardware, such as a special purpose computer. FIGS. 6-19 describe various embodiments of how a correlithm object processing system can generate and use string correlithm objects to record and faithfully playback data values. FIGS. 20-27 describe various embodiments of how correlithm objects 104 can be used to represent digits of real-world numerical values and how to perform operations on correlithm objects 104 using string correlithm objects 602.

Figure 1:
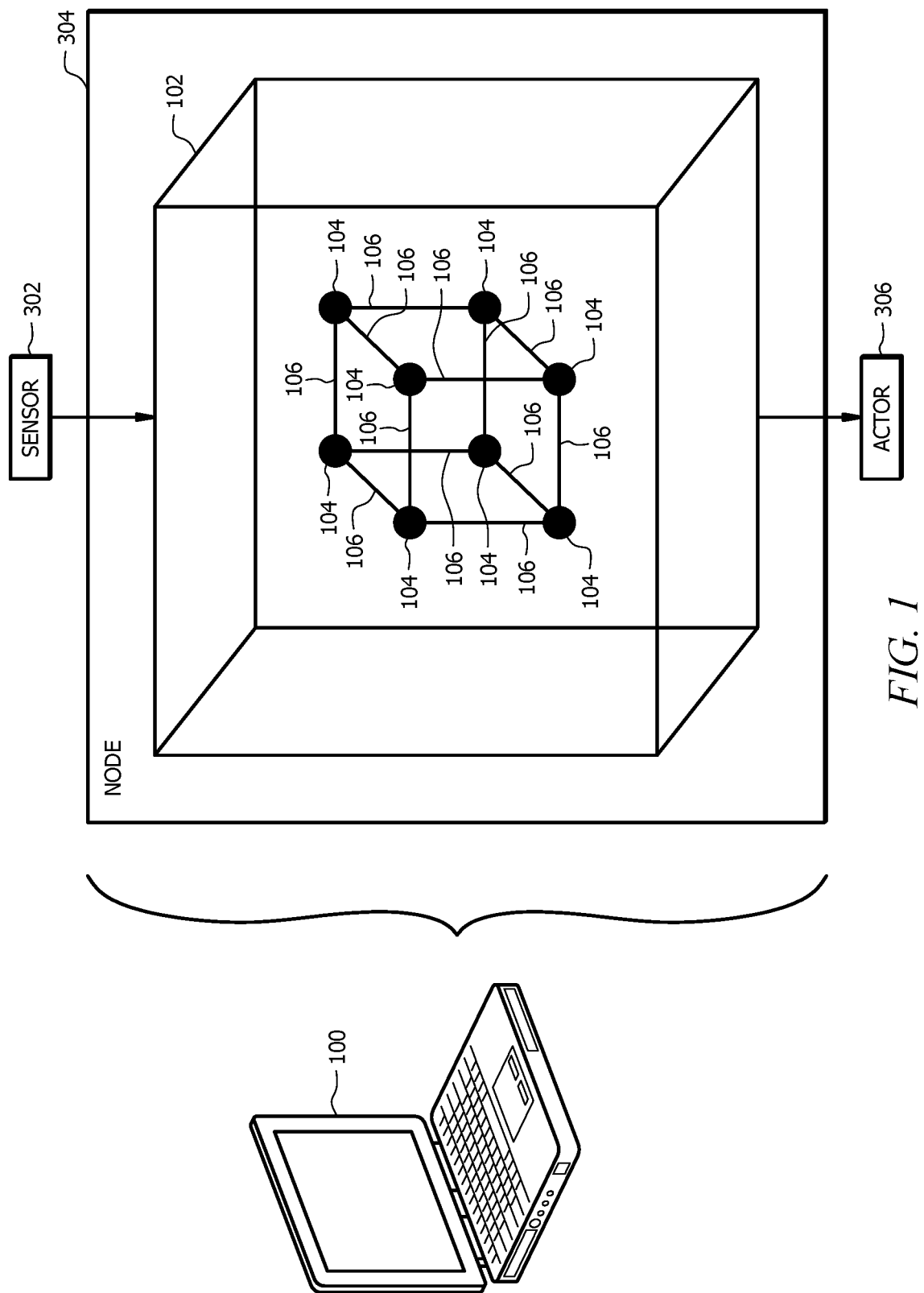
FIG. 1 is a schematic view of an embodiment of a special purpose computer implementing correlithm objects in an n-dimensional space.

FIG. 1 is a schematic view of an embodiment of a user device 100 implementing correlithm objects 104 in an n-dimensional space 102. Examples of user devices 100 include, but are not limited to, desktop computers, mobile phones, tablet computers, laptop computers, or other special purpose computer platform. The user device 100 is configured to implement or emulate a correlithm object processing system that uses categorical numbers to represent data samples as correlithm objects 104 in a high-dimensional space 102, for example a high-dimensional binary cube. Additional information about the correlithm object processing system is described in FIG. 3. Additional information about configuring the user device 100 to implement or emulate a correlithm object processing system is described in FIG. 5.

Conventional computers rely on the numerical order of ordinal binary integers representing data to perform various operations such as counting, sorting, indexing, and mathematical calculations. Even when performing operations that involve other number systems (e.g. floating point), conventional computers still resort to using ordinal binary integers to perform any operations. Ordinal based number systems only provide information about the sequence order of the numbers themselves based on their numeric values. Ordinal numbers do not provide any information about any other types of relationships for the data being represented by the numeric values, such as similarity. For example, when a conventional computer uses ordinal numbers to represent data samples (e.g. images or audio signals), different data samples are represented by different numeric values. The different numeric values do not provide any information about how similar or dissimilar one data sample is from another. In other words, conventional computers are only able to make binary comparisons of data samples which only results in determining whether the data samples match or do not match. Unless there is an exact match in ordinal number values, conventional systems are unable to tell if a data sample matches or is similar to any other data samples. As a result, conventional computers are unable to use ordinal numbers by themselves for determining similarity between different data samples, and instead these computers rely on complex signal processing techniques. Determining whether a data sample matches or is similar to other data samples is not a trivial task and poses several technical challenges for conventional computers. These technical challenges result in complex processes that consume processing power which reduces the speed and performance of the system.

In contrast to conventional systems, the user device 100 operates as a special purpose machine for implementing or emulating a correlithm object processing system. Implementing or emulating a correlithm object processing system improves the operation of the user device 100 by enabling the user device 100 to perform non-binary comparisons (i.e. match or no match) between different data samples. This enables the user device 100 to quantify a degree of similarity between different data samples. This increases the flexibility of the user device 100 to work with data samples having different data types and/or formats, and also increases the speed and performance of the user device 100 when performing operations using data samples. These improvements and other benefits to the user device 100 are described in more detail below and throughout the disclosure.

For example, the user device 100 employs the correlithm object processing system to allow the user device 100 to compare data samples even when the input data sample does not exactly match any known or previously stored input values. Implementing a correlithm object processing system fundamentally changes the user device 100 and the traditional data processing paradigm. Implementing the correlithm object processing system improves the operation of the user device 100 by enabling the user device 100 to perform non-binary comparisons of data samples. In other words, the user device 100 is able to determine how similar the data samples are to each other even when the data samples are not exact matches. In addition, the user device 100 is able to quantify how similar data samples are to one another. The ability to determine how similar data samples are to each other is unique and distinct from conventional computers that can only perform binary comparisons to identify exact matches.

The user device's 100 ability to perform non-binary comparisons of data samples also fundamentally changes traditional data searching paradigms. For example, conventional search engines rely on finding exact matches or exact partial matches of search tokens to identify related data samples. For instance, conventional text-based search engines are limited to finding related data samples that have text that exactly matches other data samples. These search engines only provide a binary result that identifies whether or not an exact match was found based on the search token. Implementing the correlithm object processing system improves the operation of the user device 100 by enabling the user device 100 to identify related data samples based on how similar the search token is to other data sample. These improvements result in increased flexibility and faster search times when using a correlithm object processing system. The ability to identify similarities between data samples expands the capabilities of a search engine to include data samples that may not have an exact match with a search token but are still related and similar in some aspects. The user device 100 is also able to quantify how similar data samples are to each other based on characteristics besides exact matches to the search token. Implementing the correlithm object processing system involves operating the user device 100 in an unconventional manner to achieve these technological improvements as well as other benefits described below for the user device 100.

Computing devices typically rely on the ability to compare data sets (e.g. data samples) to one another for processing. For example, in security or authentication applications a computing device is configured to compare an input of an unknown person to a data set of known people (or biometric information associated with these people). The problems associated with comparing data sets and identifying matches based on the comparison are problems necessarily rooted in computer technologies. As described above, conventional systems are limited to a binary comparison that can only determine whether an exact match is found. As an example, an input data sample that is an image of a person may have different lighting conditions than previously stored images. In this example, different lighting conditions can make images of the same person appear different from each other. Conventional computers are unable to distinguish between two images of the same person with different lighting conditions and two images of two different people without complicated signal processing. In both of these cases, conventional computers can only determine that the images are different. This is because conventional computers rely on manipulating ordinal numbers for processing.

In contrast, the user device 100 uses an unconventional configuration that uses correlithm objects to represent data samples. Using correlithm objects to represent data samples fundamentally changes the operation of the user device 100 and how the device views data samples. By implementing a correlithm object processing system, the user device 100 can determine the distance between the data samples and other known data samples to determine whether the input data sample matches or is similar to the other known data samples, as explained in detail below. Unlike the conventional computers described in the previous example, the user device 100 is able to distinguish between two images of the same person with different lighting conditions and two images of two different people by using correlithm objects 104. Correlithm objects allow the user device 100 to determine whether there are any similarities between data samples, such as between two images that are different from each other in some respects but similar in other respects. For example, the user device 100 is able to determine that despite different lighting conditions, the same person is present in both images.

In addition, the user device 100 is able to determine a degree of similarity that quantifies how similar different data samples are to one another. Implementing a correlithm object processing system in the user device 100 improves the operation of the user device 100 when comparing data sets and identifying matches by allowing the user device 100 to perform non-binary comparisons between data sets and to quantify the similarity between different data samples. In addition, using a correlithm object processing system results in increased flexibility and faster search times when comparing data samples or data sets. Thus, implementing a correlithm object processing system in the user device 100 provides a technical solution to a problem necessarily rooted in computer technologies.

The ability to implement a correlithm object processing system provides a technical advantage by allowing the system to identify and compare data samples regardless of whether an exact match has been previous observed or stored. In other words, using the correlithm object processing system the user device 100 is able to identify similar data samples to an input data sample in the absence of an exact match. This functionality is unique and distinct from conventional computers that can only identify data samples with exact matches.

Examples of data samples include, but are not limited to, images, files, text, audio signals, biometric signals, electric signals, or any other suitable type of data. A correlithm object 104 is a point in the n-dimensional space 102, sometimes called an "n-space." The value of represents the number of dimensions of the space. For example, an n-dimensional space 102 may be a 3-dimensional space, a 50-dimensional space, a 100-dimensional space, or any other suitable dimension space. The number of dimensions depends on its ability to support certain statistical tests, such as the distances between pairs of randomly chosen points in the space approximating a normal distribution. In some embodiments, increasing the number of dimensions in the n-dimensional space 102 modifies the statistical properties of the system to provide improved results. Increasing the number of dimensions increases the probability that a correlithm object 104 is similar to other adjacent correlithm objects 104. In other words, increasing the number of dimensions increases the correlation between how close a pair of correlithm objects 104 are to each other and how similar the correlithm objects 104 are to each other.

Correlithm object processing systems use new types of data structures called correlithm objects 104 that improve the way a device operates, for example, by enabling the device to perform non-binary data set comparisons and to quantify the similarity between different data samples. Correlithm objects 104 are data structures designed to improve the way a device stores, retrieves, and compares data samples in memory. Unlike conventional data structures, correlithm objects 104 are data structures where objects can be expressed in a high-dimensional space such that distance 106 between points in the space represent the similarity between different objects or data samples. In other words, the distance 106 between a pair of correlithm objects 104 in the n-dimensional space 102 indicates how similar the correlithm objects 104 are from each other and the data samples they represent. Correlithm objects 104 that are close to each other are more similar to each other than correlithm objects 104 that are further apart from each other. For example, in a facial recognition application, correlithm objects 104 used to represent images of different types of glasses may be relatively close to each other compared to correlithm objects 104 used to represent images of other features such as facial hair. An exact match between two data samples occurs when their corresponding correlithm objects 104 are the same or have no distance between them. When two data samples are not exact matches but are similar, the distance between their correlithm objects 104 can be used to indicate their similarities. In other words, the distance 106 between correlithm objects 104 can be used to identify both data samples that exactly match each other as well as data samples that do not match but are similar. This feature is unique to a correlithm processing system and is unlike conventional computers that are unable to detect when data samples are different but similar in some aspects.

Correlithm objects 104 also provide a data structure that is independent of the data type and format of the data samples they represent. Correlithm objects 104 allow data samples to be directly compared regardless of their original data type and/or format. In some instances, comparing data samples as correlithm objects 104 is computationally more efficient and faster than comparing data samples in their original format. For example, comparing images using conventional data structures involves significant amounts of image processing which is time consuming and consumes processing resources. Thus, using correlithm objects 104 to represent data samples provides increased flexibility and improved performance compared to using other conventional data structures.

In one embodiment, correlithm objects 104 may be represented using categorical binary strings. The number of bits used to represent the correlithm object 104 corresponds with the number of dimensions of the n-dimensional space 102 where the correlithm object 102 is located. For example, each correlithm object 104 may be uniquely identified using a 64-bit string in a 64-dimensional space 102. As another example, each correlithm object 104 may be uniquely identified using a 10-bit string in a 10-dimensional space 102. In other examples, correlithm objects 104 can be identified using any other suitable number of bits in a string that corresponds with the number of dimensions in the n-dimensional space 102.

In this configuration, the distance 106 between two correlithm objects 104 can be determined based on the differences between the bits of the two correlithm objects 104. In other words, the distance 106 between two correlithm objects can be determined based on how many individual bits differ between the correlithm objects 104. The distance 106 between two correlithm objects 104 can be computed using Hamming distance, anti-Hamming distance or any other suitable technique.

As an example, using a 10-dimensional space 102, a first correlithm object 104 is represented by a first 10-bit string (1001011011) and a second correlithm object 104 is represented by a second 10-bit string (1000011011). The Hamming distance corresponds with the number of bits that differ between the first correlithm object 104 and the second correlithm object 104. Conversely, the anti-Hamming distance corresponds with the number of bits that are alike between the first correlithm object 104 and the second correlithm object 104. Thus, the Hamming distance between the first correlithm object 104 and the second correlithm object 104 can be computed as follows:

1001011011
1000011011
-----------------
0001000000

In this example, the Hamming distance is equal to one because only one bit differs between the first correlithm object 104 and the second correlithm object 104. Conversely, the anti-Hamming distance is nine because nine bits are the same between the first and second correlithm objects 104. As another example, a third correlithm object 104 is represented by a third 10-bit string (0110100100). In this example, the Hamming distance between the first correlithm object 104 and the third correlithm object 104 can be computed as follows:

1001011011
0110100100
-----------------
1111111111

The Hamming distance is equal to ten because all of the bits are different between the first correlithm object 104 and the third correlithm object 104. Conversely, the anti-Hamming distance is zero because none of the bits are the same between the first and third correlithm objects 104. In the previous example, a Hamming distance equal to one indicates that the first correlithm object 104 and the second correlithm object 104 are close to each other in the n-dimensional space 102, which means they are similar to each other. Similarly, an anti-Hamming distance equal to nine also indicates that the first and second correlithm objects are close to each other in n-dimensional space 102, which also means they are similar to each other. In the second example, a Hamming distance equal to ten indicates that the first correlithm object 104 and the third correlithm object 104 are further from each other in the n-dimensional space 102 and are less similar to each other than the first correlithm object 104 and the second correlithm object 104. Similarly, an anti-Hamming distance equal to zero also indicates that that the first and third correlithm objects 104 are further from each other in n-dimensional space 102 and are less similar to each other than the first and second correlithm objects 104. In other words, the similarity between a pair of correlithm objects can be readily determined based on the distance between the pair correlithm objects, as represented by either Hamming distances or anti-Hamming distances.

As another example, the distance between a pair of correlithm objects 104 can be determined by performing an XOR operation between the pair of correlithm objects 104 and counting the number of logical high values in the binary string. The number of logical high values indicates the number of bits that are different between the pair of correlithm objects 104 which also corresponds with the Hamming distance between the pair of correlithm objects 104.

In another embodiment, the distance 106 between two correlithm objects 104 can be determined using a Minkowski distance such as the Euclidean or "straight-line" distance between the correlithm objects 104. For example, the distance 106 between a pair of correlithm objects 104 may be determined by calculating the square root of the sum of squares of the coordinate difference in each dimension.

The user device 100 is configured to implement or emulate a correlithm object processing system that comprises one or more sensors 302, nodes 304, and/or actors 306 in order to convert data samples between real-world values or representations and to correlithm objects 104 in a correlithm object domain. Sensors 302 are generally configured to convert real-world data samples to the correlithm object domain. Nodes 304 are generally configured to process or perform various operations on correlithm objects in the correlithm object domain. Actors 306 are generally configured to convert correlithm objects 104 into real-world values or representations. Additional information about sensors 302, nodes 304, and actors 306 is described in FIG. 3.

Performing operations using correlithm objects 104 in a correlithm object domain allows the user device 100 to identify relationships between data samples that cannot be identified using conventional data processing systems. For example, in the correlithm object domain, the user device 100 is able to identify not only data samples that exactly match an input data sample, but also other data samples that have similar characteristics or features as the input data samples. Conventional computers are unable to identify these types of relationships readily. Using correlithm objects 104 improves the operation of the user device 100 by enabling the user device 100 to efficiently process data samples and identify relationships between data samples without relying on signal processing techniques that require a significant amount of processing resources. These benefits allow the user device 100 to operate more efficiently than conventional computers by reducing the amount of processing power and resources that are needed to perform various operations.

Figure 2:
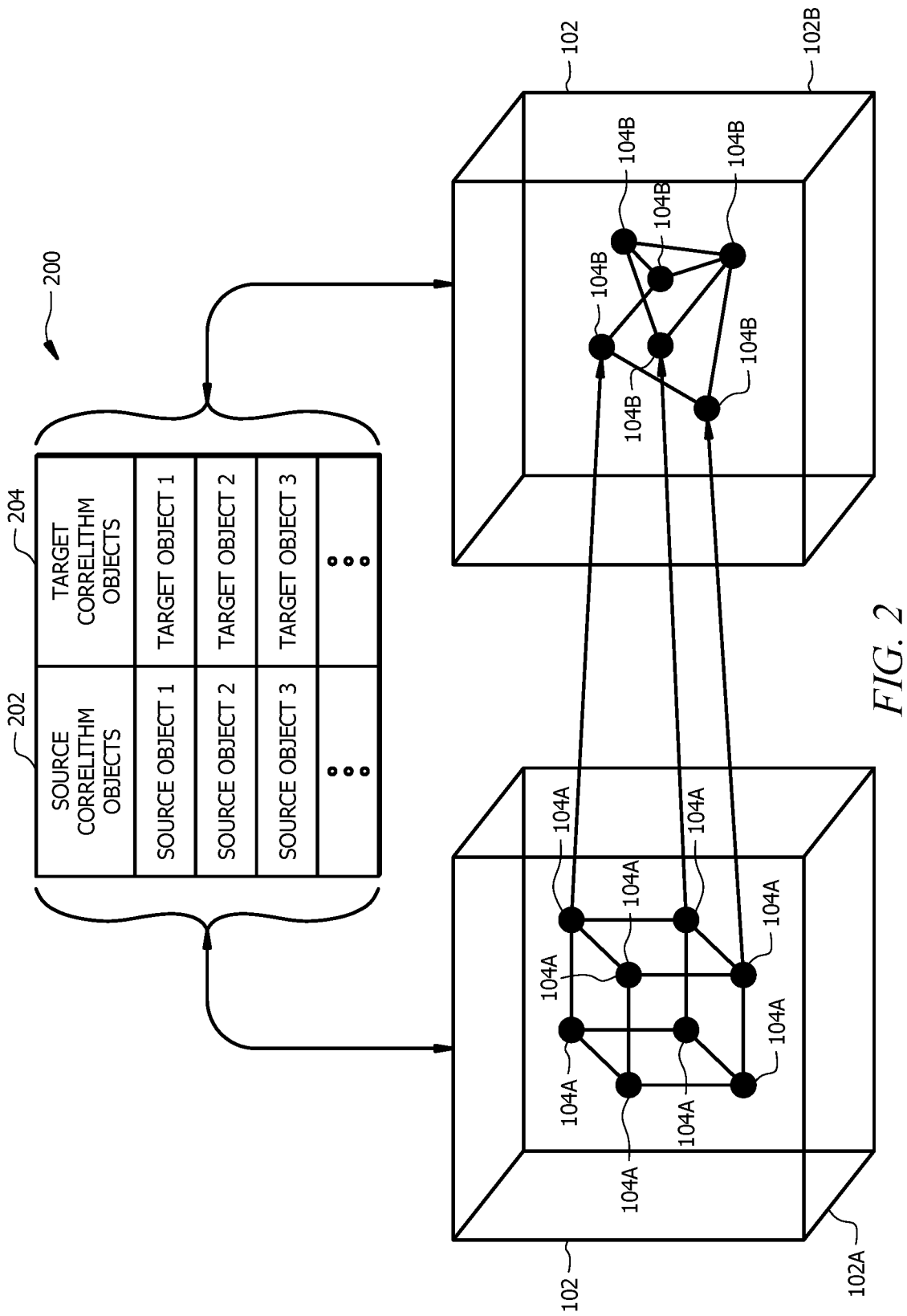
FIG. 2 is a perspective view of an embodiment of a mapping between correlithm objects in different n-dimensional spaces.

FIG. 2 is a schematic view of an embodiment of a mapping between correlithm objects 104 in different n-dimensional spaces 102. When implementing a correlithm object processing system, the user device 100 performs operations within the correlithm object domain using correlithm objects 104 in different n-dimensional spaces 102.

As an example, the user device 100 may convert different types of data samples having real-world values into correlithm objects 104 in different n-dimensional spaces 102. For instance, the user device 100 may convert data samples of text into a first set of correlithm objects 104 in a first n-dimensional space 102 and data samples of audio samples as a second set of correlithm objects 104 in a second n-dimensional space 102. Conventional systems require data samples to be of the same type and/or format to perform any kind of operation on the data samples. In some instances, some types of data samples cannot be compared because there is no common format available. For example, conventional computers are unable to compare data samples of images and data samples of audio samples because there is no common format. In contrast, the user device 100 implementing a correlithm object processing system is able to compare and perform operations using correlithm objects 104 in the correlithm object domain regardless of the type or format of the original data samples.

In FIG. 2, a first set of correlithm objects 104A are defined within a first n-dimensional space 102A and a second set of correlithm objects 104B are defined within a second n-dimensional space 102B. The n-dimensional spaces may have the same number of dimensions or a different number of dimensions. For example, the first n-dimensional space 102A and the second n-dimensional space 102B may both be three dimensional spaces. As another example, the first n-dimensional space 102A may be a three-dimensional space and the second n-dimensional space 102B may be a nine-dimensional space. Correlithm objects 104 in the first n-dimensional space 102A and second n-dimensional space 102B are mapped to each other. In other words, a correlithm object 104A in the first n-dimensional space 102A may reference or be linked with a particular correlithm object 104B in the second n-dimensional space 102B. The correlithm objects 104 may also be linked with and referenced with other correlithm objects 104 in other n-dimensional spaces 102.

In one embodiment, a data structure such as table 200 may be used to map or link correlithm objects 104 in different n-dimensional spaces 102. In some instances, table 200 is referred to as a node table. Table 200 is generally configured to identify a first plurality of correlithm objects 104 in a first n-dimensional space 102 and a second plurality of correlithm objects 104 in a second n-dimensional space 102. Each correlithm object 104 in the first n-dimensional space 102 is linked with a correlithm object 104 is the second n-dimensional space 102. For example, table 200 may be configured with a first column 202 that lists correlithm objects 104A as source correlithm objects and a second column 204 that lists corresponding correlithm objects 104B as target correlithm objects. In other examples, table 200 may be configured in any other suitable manner or may be implemented using any other suitable data structure. In some embodiments, one or more mapping functions may be used to convert between a correlithm object 104 in a first n-dimensional space and a correlithm object 104 is a second n-dimensional space.

Figure 3:
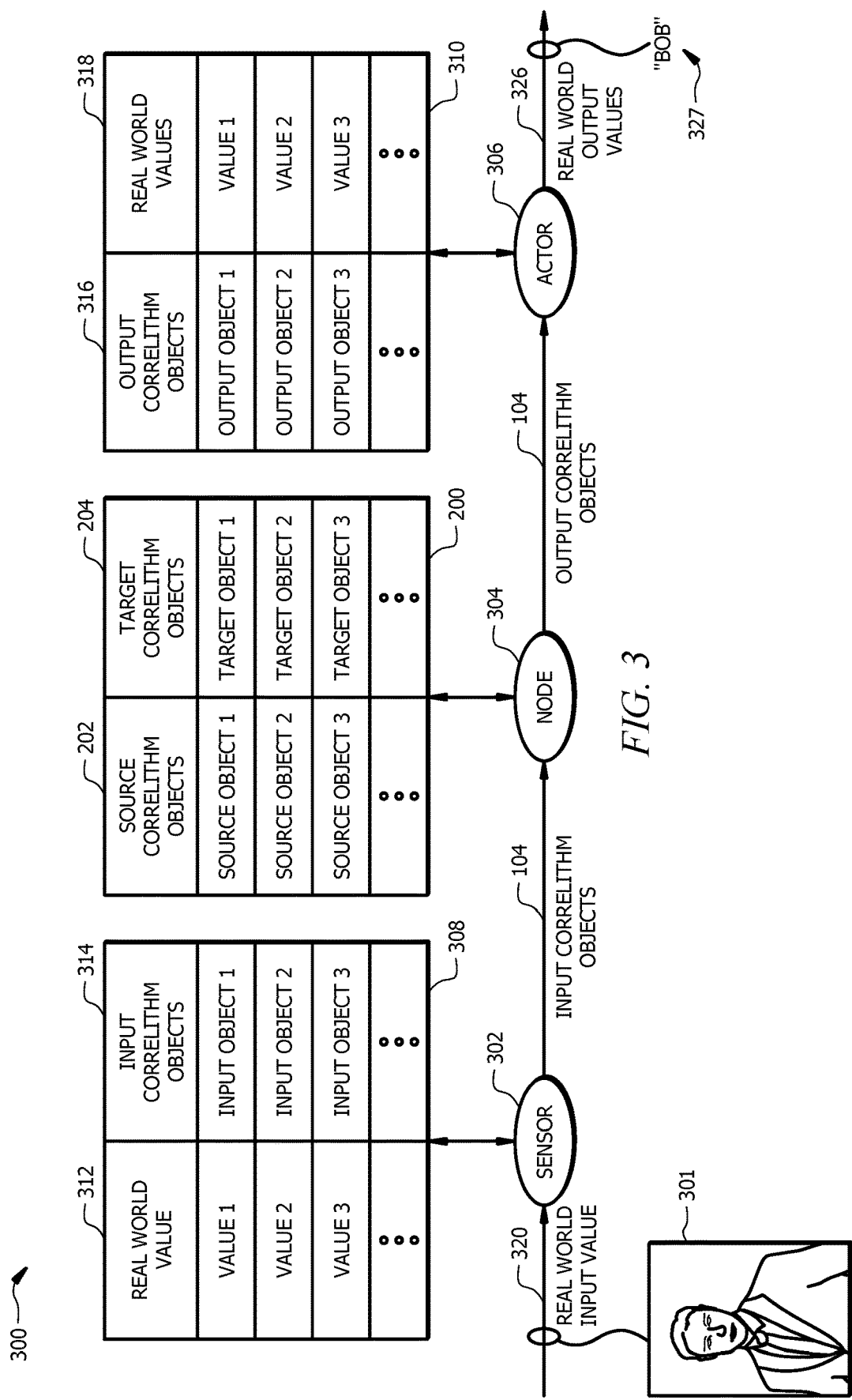
FIG. 3 is a schematic view of an embodiment of a correlithm object processing system.

FIG. 3 is a schematic view of an embodiment of a correlithm object processing system 300 that is implemented by a user device 100 to perform operations using correlithm objects 104. The system 300 generally comprises a sensor 302, a node 304, and an actor 306. The system 300 may be configured with any suitable number and/or configuration of sensors 302, nodes 304, and actors 306. An example of the system 300 in operation is described in FIG. 4. In one embodiment, a sensor 302, a node 304, and an actor 306 may all be implemented on the same device (e.g. user device 100). In other embodiments, a sensor 302, a node 304, and an actor 306 may each be implemented on different devices in signal communication with each other for example over a network. In other embodiments, different devices may be configured to implement any combination of sensors 302, nodes 304, and actors 306.

Sensors 302 serve as interfaces that allow a user device 100 to convert real-world data samples into correlithm objects 104 that can be used in the correlithm object domain. Sensors 302 enable the user device 100 to compare and perform operations using correlithm objects 104 regardless of the data type or format of the original data sample. Sensors 302 are configured to receive a real-world value 320 representing a data sample as an input, to determine a correlithm object 104 based on the real-world value 320, and to output the correlithm object 104. For example, the sensor 302 may receive an image 301 of a person and output a correlithm object 322 to the node 304 or actor 306. In one embodiment, sensors 302 are configured to use sensor tables 308 that link a plurality of real-world values with a plurality of correlithm objects 104 in an n-dimensional space 102. Real-world values are any type of signal, value, or representation of data samples. Examples of real-world values include, but are not limited to, images, pixel values, text, audio signals, electrical signals, and biometric signals. As an example, a sensor table 308 may be configured with a first column 312 that lists real-world value entries corresponding with different images and a second column 314 that lists corresponding correlithm objects 104 as input correlithm objects. In other examples, sensor tables 308 may be configured in any other suitable manner or may be implemented using any other suitable data structure. In some embodiments, one or more mapping functions may be used to translate between a real-world value 320 and a correlithm object 104 in an n-dimensional space. Additional information for implementing or emulating a sensor 302 in hardware is described in FIG. 5.

Nodes 304 are configured to receive a correlithm object 104 (e.g. an input correlithm object 104), to determine another correlithm object 104 based on the received correlithm object 104, and to output the identified correlithm object 104 (e.g. an output correlithm object 104). In one embodiment, nodes 304 are configured to use node tables 200 that link a plurality of correlithm objects 104 from a first n-dimensional space 102 with a plurality of correlithm objects 104 in a second n-dimensional space 102. A node table 200 may be configured similar to the table 200 described in FIG. 2. Additional information for implementing or emulating a node 304 in hardware is described in FIG. 5.

Actors 306 serve as interfaces that allow a user device 100 to convert correlithm objects 104 in the correlithm object domain back to real-world values or data samples. Actors 306 enable the user device 100 to convert from correlithm objects 104 into any suitable type of real-world value. Actors 306 are configured to receive a correlithm object 104 (e.g. an output correlithm object 104), to determine a real-world output value 326 based on the received correlithm object 104, and to output the real-world output value 326. The real-world output value 326 may be a different data type or representation of the original data sample. As an example, the real-world input value 320 may be an image 301 of a person and the resulting real-world output value 326 may be text 327 and/or an audio signal identifying the person. In one embodiment, actors 306 are configured to use actor tables 310 that link a plurality of correlithm objects 104 in an n-dimensional space 102 with a plurality of real-world values. As an example, an actor table 310 may be configured with a first column 316 that lists correlithm objects 104 as output correlithm objects and a second column 318 that lists real-world values. In other examples, actor tables 310 may be configured in any other suitable manner or may be implemented using any other suitable data structure. In some embodiments, one or more mapping functions may be employed to translate between a correlithm object 104 in an n-dimensional space and a real-world output value 326. Additional information for implementing or emulating an actor 306 in hardware is described in FIG. 5.

A correlithm object processing system 300 uses a combination of a sensor table 308, a node table 200, and/or an actor table 310 to provide a specific set of rules that improve computer-related technologies by enabling devices to compare and to determine the degree of similarity between different data samples regardless of the data type and/or format of the data sample they represent. The ability to directly compare data samples having different data types and/or formatting is a new functionality that cannot be performed using conventional computing systems and data structures. Conventional systems require data samples to be of the same type and/or format in order to perform any kind of operation on the data samples. In some instances, some types of data samples are incompatible with each other and cannot be compared because there is no common format available. For example, conventional computers are unable to compare data samples of images with data samples of audio samples because there is no common format available. In contrast, a device implementing a correlithm object processing system uses a combination of a sensor table 308, a node table 200, and/or an actor table 310 to compare and perform operations using correlithm objects 104 in the correlithm object domain regardless of the type or format of the original data samples. The correlithm object processing system 300 uses a combination of a sensor table 308, a node table 200, and/or an actor table 310 as a specific set of rules that provides a particular solution to dealing with different types of data samples and allows devices to perform operations on different types of data samples using correlithm objects 104 in the correlithm object domain. In some instances, comparing data samples as correlithm objects 104 is computationally more efficient and faster than comparing data samples in their original format. Thus, using correlithm objects 104 to represent data samples provides increased flexibility and improved performance compared to using other conventional data structures. The specific set of rules used by the correlithm object processing system 300 go beyond simply using routine and conventional activities in order to achieve this new functionality and performance improvements.

In addition, correlithm object processing system 300 uses a combination of a sensor table 308, a node table 200, and/or an actor table 310 to provide a particular manner for transforming data samples between ordinal number representations and correlithm objects 104 in a correlithm object domain. For example, the correlithm object processing system 300 may be configured to transform a representation of a data sample into a correlithm object 104, to perform various operations using the correlithm object 104 in the correlithm object domain, and to transform a resulting correlithm object 104 into another representation of a data sample. Transforming data samples between ordinal number representations and correlithm objects 104 involves fundamentally changing the data type of data samples between an ordinal number system and a categorical number system to achieve the previously described benefits of the correlithm object processing system 300.

Figure 4:
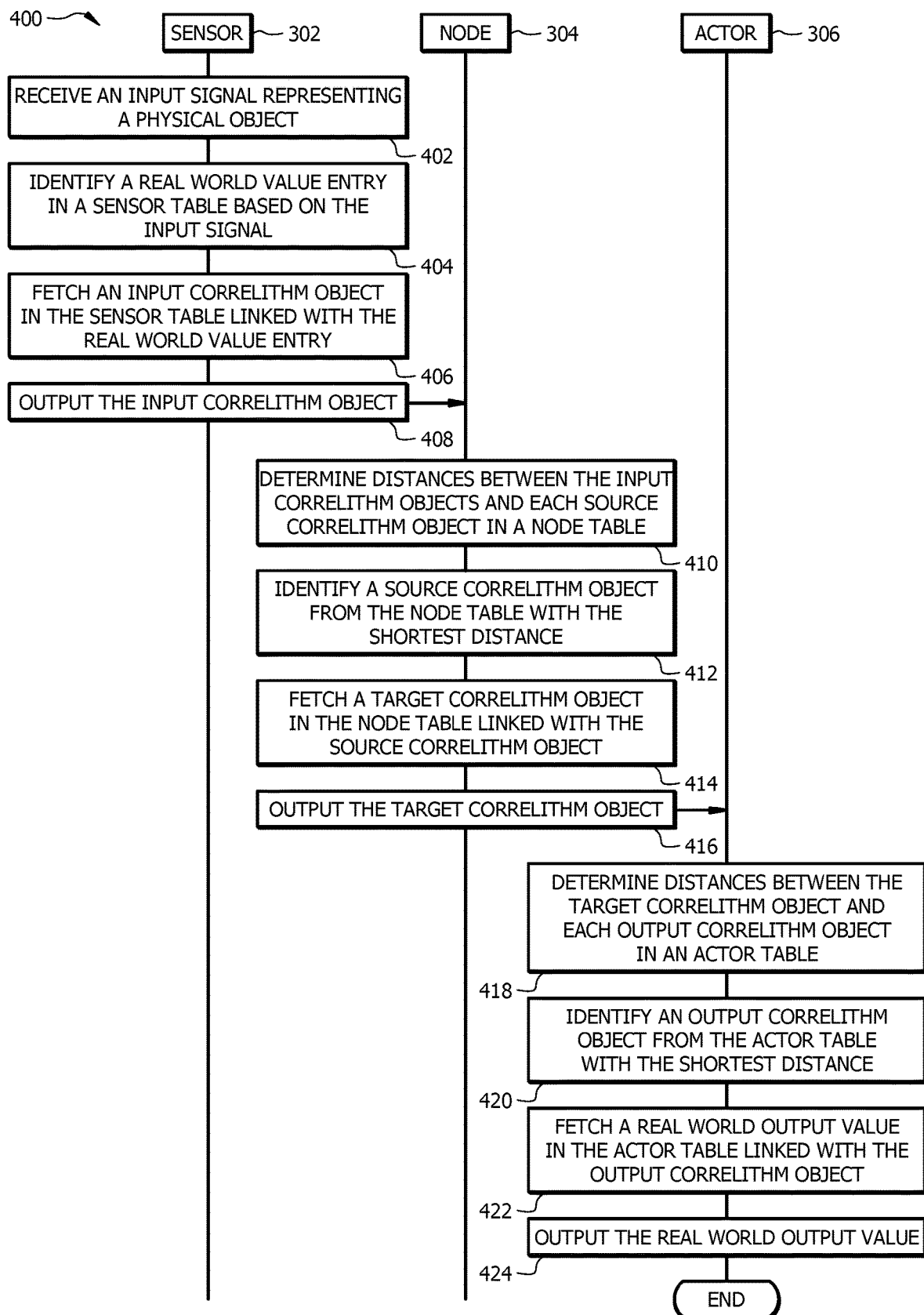
FIG. 4 is a protocol diagram of an embodiment of a correlithm object process flow.

FIG. 4 is a protocol diagram of an embodiment of a correlithm object process flow 400. A user device 100 implements process flow 400 to emulate a correlithm object processing system 300 to perform operations using correlithm object 104 such as facial recognition. The user device 100 implements process flow 400 to compare different data samples (e.g. images, voice signals, or text) to each other and to identify other objects based on the comparison. Process flow 400 provides instructions that allows user devices 100 to achieve the improved technical benefits of a correlithm object processing system 300.

Conventional systems are configured to use ordinal numbers for identifying different data samples. Ordinal based number systems only provide information about the sequence order of numbers based on their numeric values, and do not provide any information about any other types of relationships for the data samples being represented by the numeric values such as similarity. In contrast, a user device 100 can implement or emulate the correlithm object processing system 300 which provides an unconventional solution that uses categorical numbers and correlithm objects 104 to represent data samples. For example, the system 300 may be configured to use binary integers as categorical numbers to generate correlithm objects 104 which enables the user device 100 to perform operations directly based on similarities between different data samples. Categorical numbers provide information about how similar different data sample are from each other. Correlithm objects 104 generated using categorical numbers can be used directly by the system 300 for determining how similar different data samples are from each other without relying on exact matches, having a common data type or format, or conventional signal processing techniques.

A non-limiting example is provided to illustrate how the user device 100 implements process flow 400 to emulate a correlithm object processing system 300 to perform facial recognition on an image to determine the identity of the person in the image. In other examples, the user device 100 may implement process flow 400 to emulate a correlithm object processing system 300 to perform voice recognition, text recognition, or any other operation that compares different objects.

At step 402, a sensor 302 receives an input signal representing a data sample. For example, the sensor 302 receives an image of person's face as a real-world input value 320. The input signal may be in any suitable data type or format. In one embodiment, the sensor 302 may obtain the input signal in real-time from a peripheral device (e.g. a camera). In another embodiment, the sensor 302 may obtain the input signal from a memory or database.

At step 404, the sensor 302 identifies a real-world value entry in a sensor table 308 based on the input signal. In one embodiment, the system 300 identifies a real-world value entry in the sensor table 308 that matches the input signal. For example, the real-world value entries may comprise previously stored images. The sensor 302 may compare the received image to the previously stored images to identify a real-world value entry that matches the received image. In one embodiment, when the sensor 302 does not find an exact match, the sensor 302 finds a real-world value entry that most closely matches the received image.

At step 406, the sensor 302 identifies and fetches an input correlithm object 104 in the sensor table 308 linked with the real-world value entry. At step 408, the sensor 302 sends the identified input correlithm object 104 to the node 304. In one embodiment, the identified input correlithm object 104 is represented in the sensor table 308 using a categorical binary integer string. The sensor 302 sends the binary string representing to the identified input correlithm object 104 to the node 304.

At step 410, the node 304 receives the input correlithm object 104 and determines distances 106 between the input correlithm object 104 and each source correlithm object 104 in a node table 200. In one embodiment, the distance 106 between two correlithm objects 104 can be determined based on the differences between the bits of the two correlithm objects 104. In other words, the distance 106 between two correlithm objects can be determined based on how many individual bits differ between a pair of correlithm objects 104. The distance 106 between two correlithm objects 104 can be computed using Hamming distance or any other suitable technique. In another embodiment, the distance 106 between two correlithm objects 104 can be determined using a Minkowski distance such as the Euclidean or "straight-line" distance between the correlithm objects 104. For example, the distance 106 between a pair of correlithm objects 104 may be determined by calculating the square root of the sum of squares of the coordinate difference in each dimension.

At step 412, the node 304 identifies a source correlithm object 104 from the node table 200 with the shortest distance 106. A source correlithm object 104 with the shortest distance from the input correlithm object 104 is a correlithm object 104 either matches or most closely matches the received input correlithm object 104.

At step 414, the node 304 identifies and fetches a target correlithm object 104 in the node table 200 linked with the source correlithm object 104. At step 416, the node 304 outputs the identified target correlithm object 104 to the actor 306. In this example, the identified target correlithm object 104 is represented in the node table 200 using a categorical binary integer string. The node 304 sends the binary string representing to the identified target correlithm object 104 to the actor 306.

At step 418, the actor 306 receives the target correlithm object 104 and determines distances between the target correlithm object 104 and each output correlithm object 104 in an actor table 310. The actor 306 may compute the distances between the target correlithm object 104 and each output correlithm object 104 in an actor table 310 using a process similar to the process described in step 410.

At step 420, the actor 306 identifies an output correlithm object 104 from the actor table 310 with the shortest distance 106. An output correlithm object 104 with the shortest distance from the target correlithm object 104 is a correlithm object 104 either matches or most closely matches the received target correlithm object 104.

At step 422, the actor 306 identifies and fetches a real-world output value in the actor table 310 linked with the output correlithm object 104. The real-world output value may be any suitable type of data sample that corresponds with the original input signal. For example, the real-world output value may be text that indicates the name of the person in the image or some other identifier associated with the person in the image. As another example, the real-world output value may be an audio signal or sample of the name of the person in the image. In other examples, the real-world output value may be any other suitable real-world signal or value that corresponds with the original input signal. The real-world output value may be in any suitable data type or format.

At step 424, the actor 306 outputs the identified real-world output value. In one embodiment, the actor 306 may output the real-world output value in real-time to a peripheral device (e.g. a display or a speaker). In one embodiment, the actor 306 may output the real-world output value to a memory or database. In one embodiment, the real-world output value is sent to another sensor 302. For example, the real-world output value may be sent to another sensor 302 as an input for another process.

Figure 5:
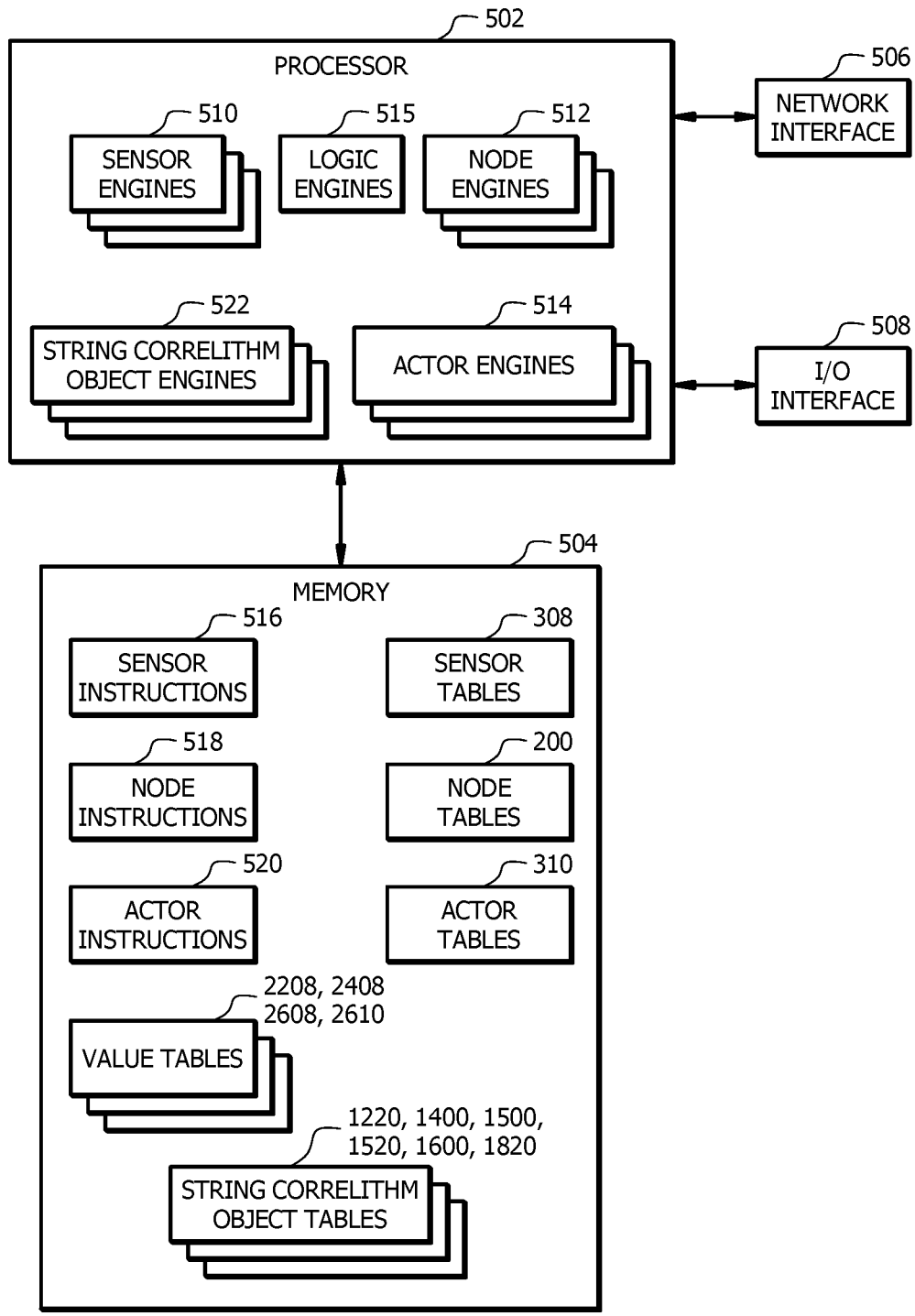
FIG. 5 is a schematic diagram of an embodiment a computer architecture for emulating a correlithm object processing system.

FIG. 5 is a schematic diagram of an embodiment of a computer architecture 500 for emulating a correlithm object processing system 300, 2200, 2400, and/or 2600 in a user device 100. The computer architecture 500 comprises a processor 502, a memory 504, a network interface 506, and an input-output (I/O) interface 508. The computer architecture 500 may be configured as shown, or in any other suitable configuration.

The processor 502 comprises one or more processors operably coupled to the memory 504. The processor 502 is any electronic circuitry including, but not limited to, state machines, one or more central processing unit (CPU) chips, logic units, cores (e.g. a multi-core processor), field-programmable gate array (FPGAs), application specific integrated circuits (ASICs), graphics processing units (GPUs), or digital signal processors (DSPs). The processor 502 may be a programmable logic device, a microcontroller, a microprocessor, or any suitable combination of the preceding. The processor 502 is communicatively coupled to and in signal communication with the memory 204. The one or more processors are configured to process data and may be implemented in hardware or software. For example, the processor 502 may be 8-bit, 16-bit, 32-bit, 64-bit or of any other suitable architecture. The processor 502 may include an arithmetic logic unit (ALU) for performing arithmetic and logic operations, processor registers that supply operands to the ALU and store the results of ALU operations, and a control unit that fetches instructions from memory and executes them by directing the coordinated operations of the ALU, registers and other components.

The one or more processors 502 are configured to implement various instructions. For example, the one or more processors 502 are configured to execute instructions to implement sensor engines 510, node engines 512, actor engines 514, logic engines 515, and string correlithm object engine 522. In an embodiment, sensor engines 510, node engines 512, actor engines 514, logic engines 515, and string correlithm object engine 522 are implemented using logic units, FPGAs, ASICs, DSPs, or any other suitable hardware. The sensor engines 510, node engines 512, actor engines 514, logic engines 515, and string correlithm object engine 522 are each configured to implement a specific set of rules or processes that provides an improved technological result.

In one embodiment, sensor engine 510 is configured to implement sensors 302 that receive a real-world value 320 as an input, determine a correlithm object 104 based on the real-world value 320, and output correlithm object 104. An example operation of a sensor 302 implemented by a sensor engine 510 is described in FIG. 4 and FIG. 22.

In one embodiment, node engine 512 is configured to implement nodes 304 that receive a correlithm object 104 (e.g. an input correlithm object 104), determine another correlithm object 104 based on the received correlithm object 104, and output the identified correlithm object 104 (e.g. an output correlithm object 104). A node 304 implemented by a node engine 512 is also configured to compute n-dimensional distances between pairs of correlithm objects 104. An example operation of a node 304 implemented by a node engine 512 is described in FIG. 4.

In one embodiment, actor engine 514 is configured to implement actors 306 that receive a correlithm object 104 (e.g. an output correlithm object 104), determine a real-world output value 326 based on the received correlithm object 104, and output the real-world output value 326. An example operation of an actor 306 implemented by an actor engine 514 is described in FIG. 4 and FIG. 23.

Figure 22:
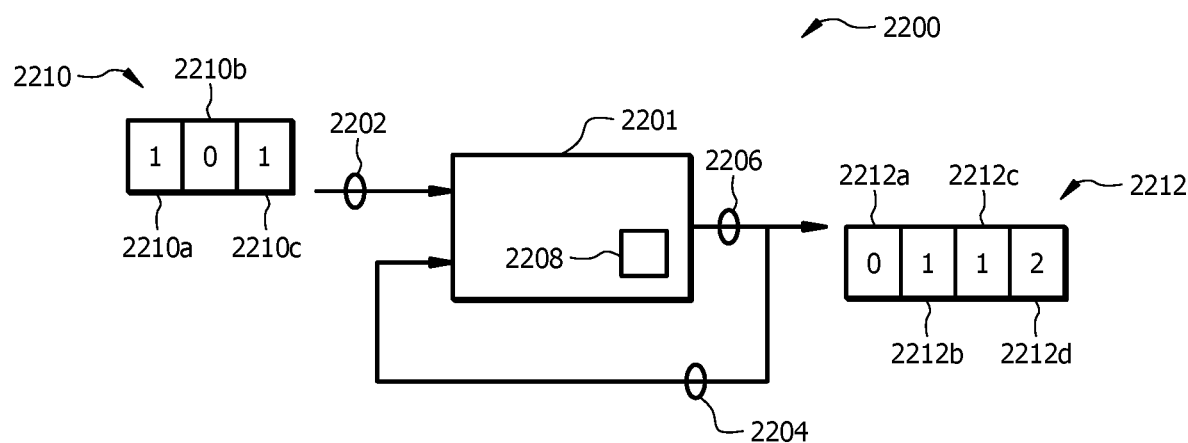
FIG. 22 is an embodiment of an integrator node engine in a correlithm object processing system.
Figure 24:
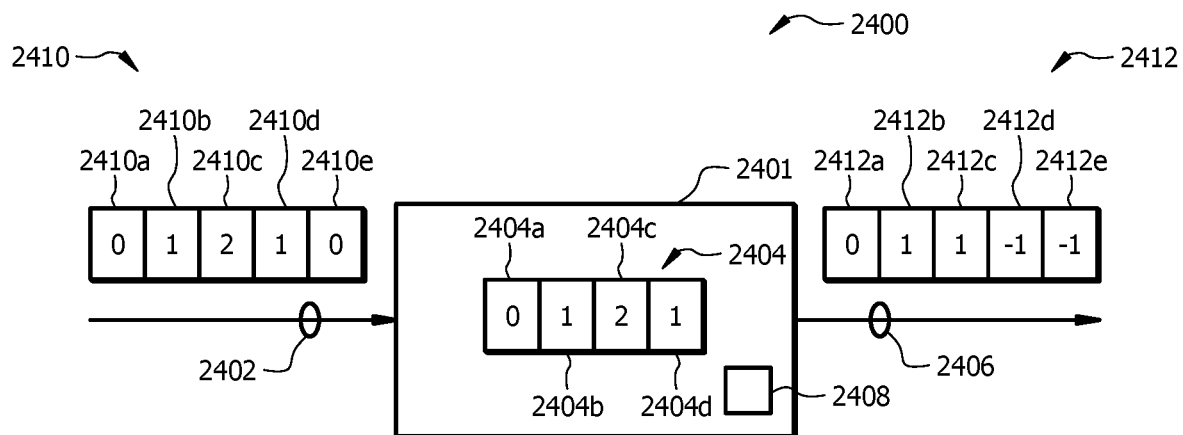
FIG. 24 is an embodiment of a differentiator node engine in a correlithm object processing system.
Figure 26:
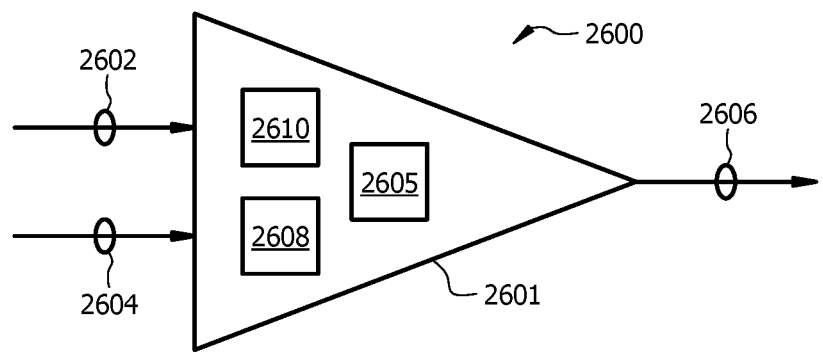
FIG. 26 is an embodiment of a differential amplifier node engine in a correlithm object processing system.

In one embodiment, logic engines 515 are configured to implement an integrator node engine 2201, a differentiator node engine 2401, and a differential amplifier engine 2601, as illustrated in FIGS. 22, 24, and 26.

In one embodiment, string correlithm object engine 522 is configured to implement a string correlithm object generator 1200 and otherwise process string correlithm objects 602 as described, for example, in conjunction with FIGS. 12-23.

The memory 504 comprises one or more non-transitory disks, tape drives, or solid-state drives, and may be used as an over-flow data storage device, to store programs when such programs are selected for execution, and to store instructions and data that are read during program execution. The memory 504 may be volatile or non-volatile and may comprise read-only memory (ROM), random-access memory (RAM), ternary content-addressable memory (TCAM), dynamic random-access memory (DRAM), and static random-access memory (SRAM). The memory 504 is operable to store sensor instructions 516, node instructions 518, actor instructions 520, sensor tables 308, node tables 200, actor tables 310, string correlithm object tables 1220, 1400, 1500, 1520, 1600, and 1820, and/or any other data or instructions, such as value tables 2208, 2408, 2608, and 2610. The sensor instructions 516, node instructions 518, and actor instructions 520 comprise any suitable set of instructions, logic, rules, or code operable to execute sensor engine 510, node engine 512, and actor engine 514 respectively.

The sensor tables 308, node tables 200, and actor tables 310 may be configured similar to sensor tables 308, node tables 200, and actor tables 310 described in FIG. 3, respectively.

The network interface 506 is configured to enable wired and/or wireless communications. The network interface 506 is configured to communicate data with any other device or system. For example, the network interface 506 may be configured for communication with a modem, a switch, a router, a bridge, a server, or a client. The processor 502 is configured to send and receive data using the network interface 506.

The I/O interface 508 may comprise ports, transmitters, receivers, transceivers, or any other devices for transmitting and/or receiving data with peripheral devices as would be appreciated by one of ordinary skill in the art upon viewing this disclosure. For example, the I/O interface 508 may be configured to communicate data between the processor 502 and peripheral hardware such as a graphical user interface, a display, a mouse, a keyboard, a key pad, and a touch sensor (e.g. a touch screen).

Figure 6:
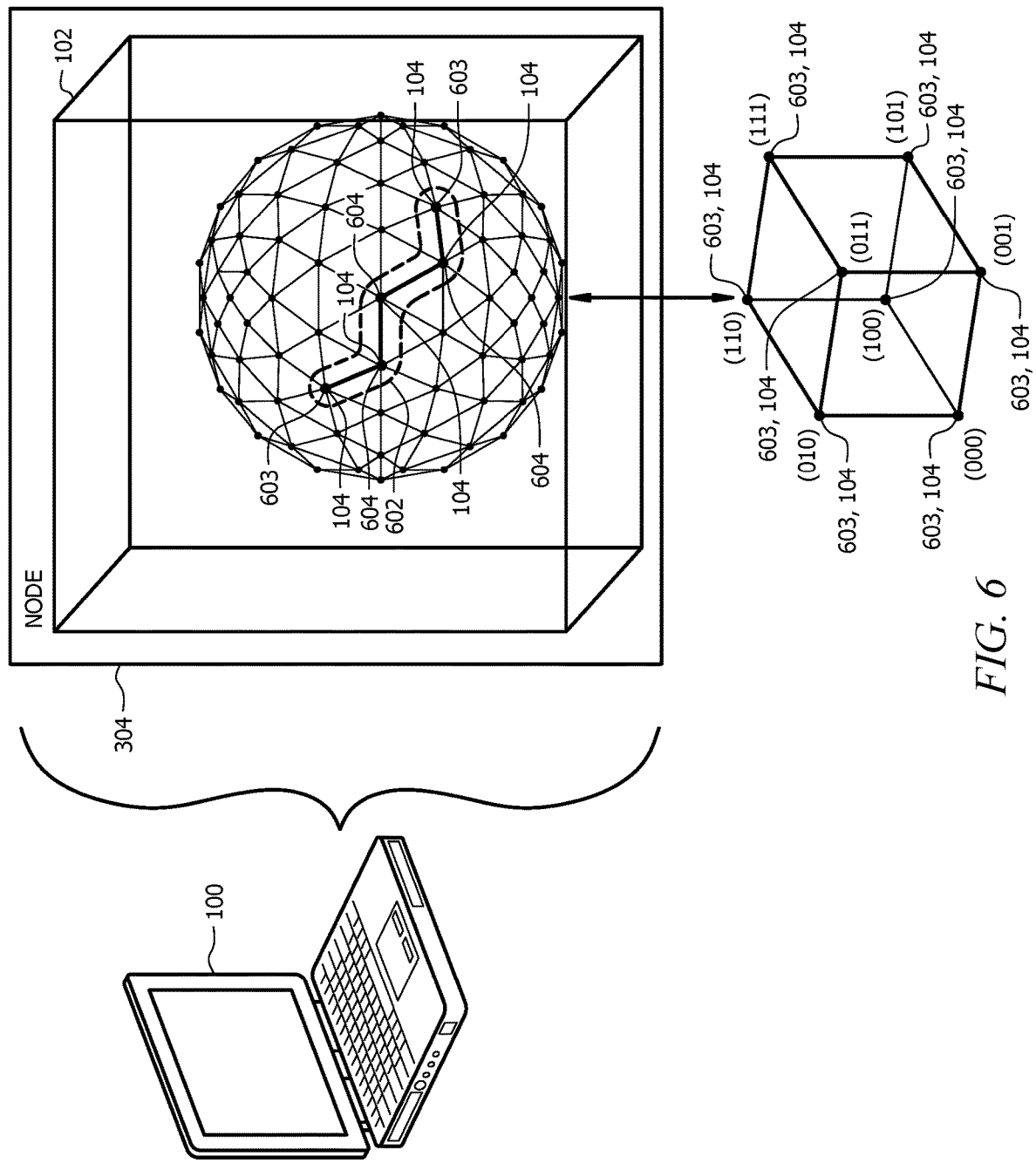
FIG. 6 illustrates an embodiment of how a string correlithm object may be implemented within a node by a device.
Figure 7:
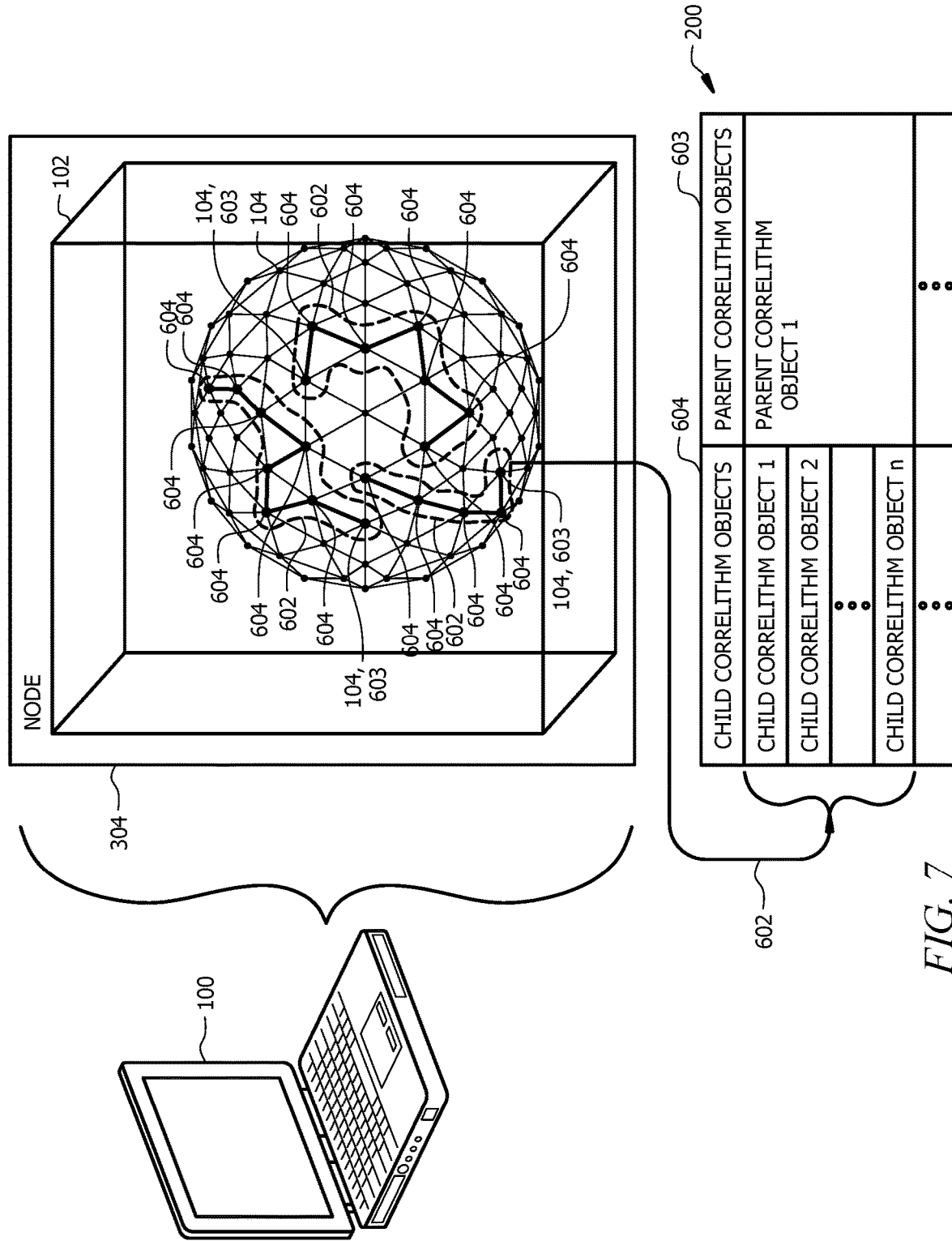
FIG. 7 illustrates another embodiment of how a string correlithm object may be implemented within a node by a device.

FIGS. 6 and 7 are schematic diagrams of an embodiment of a device 100 implementing string correlithm objects 602 for a correlithm object processing system 300. String correlithm objects 602 can be used by a correlithm object processing system 300 to embed higher orders of correlithm objects 104 within lower orders of correlithm objects 104. The order of a correlithm object 104 depends on the number of bits used to represent the correlithm object 104. The order of a correlithm object 104 also corresponds with the number of dimensions in the n-dimensional space 102 where the correlithm object 104 is located. For example, a correlithm object 104 represented by a 64-bit string is a higher order correlithm object 104 than a correlithm object 104 represented by 16-bit string.

Conventional computing systems rely on accurate data input and are unable to detect or correct for data input errors in real time. For example, a conventional computing device assumes a data stream is correct even when the data stream has bit errors. When a bit error occurs that leads to an unknown data value, the conventional computing device is unable to resolve the error without manual intervention. In contrast, string correlithm objects 602 enable a device 100 to perform operations such as error correction and interpolation within the correlithm object processing system 300. For example, higher order correlithm objects 104 can be used to associate an input correlithm object 104 with a lower order correlithm 104 when an input correlithm object does not correspond with a particular correlithm object 104 in an n-dimensional space 102. The correlithm object processing system 300 uses the embedded higher order correlithm objects 104 to define correlithm objects 104 between the lower order correlithm objects 104 which allows the device 100 to identify a correlithm object 104 in the lower order correlithm objects n-dimensional space 102 that corresponds with the input correlithm object 104. Using string correlithm objects 602, the correlithm object processing system 300 is able to interpolate and/or to compensate for errors (e.g. bit errors) which improve the functionality of the correlithm object processing system 300 and the operation of the device 100.

In some instances, string correlithm objects 602 may be used to represent a series of data samples or temporal data samples. For example, a string correlithm object 602 may be used to represent audio or video segments. In this example, media segments are represented by sequential correlithm objects that are linked together using a string correlithm object 602.

FIG. 6 illustrates an embodiment of how a string correlithm object 602 may be implemented within a node 304 by a device 100. In other embodiments, string correlithm objects 602 may be integrated within a sensor 302 or an actor 306. In 32-dimensional space 102 where correlithm objects 104 can be represented by a 32-bit string, the 32-bit string can be embedded and used to represent correlithm objects 104 in a lower order 3-dimensional space 102 which uses three bits. The 32-bit strings can be partitioned into three 12-bit portions, where each portion corresponds with one of the three bits in the 3-dimensional space 102. For example, the correlithm object 104 represented by the 3-bit binary value of 000 may be represented by a 32-bit binary string of zeros and the correlithm object represented by the binary value of 111 may be represented by a 32-bit string of all ones. As another example, the correlithm object 104 represented by the 3-bit binary value of 100 may be represented by a 32-bit binary string with 12 bits set to one followed by 24 bits set to zero. In other examples, string correlithm objects 602 can be used to embed any other combination and/or number of n-dimensional spaces 102.

In one embodiment, when a higher order n-dimensional space 102 is embedded in a lower order n-dimensional space 102, one or more correlithm objects 104 are present in both the lower order n-dimensional space 102 and the higher order n-dimensional space 102. Correlithm objects 104 that are present in both the lower order n-dimensional space 102 and the higher order n-dimensional space 102 may be referred to as parent correlithm objects 603. Correlithm objects 104 in the higher order n-dimensional space 102 may be referred to as child correlithm objects 604. In this example, the correlithm objects 104 in the 3-dimensional space 102 may be referred to as parent correlithm objects 603 while the correlithm objects 104 in the 32-dimensional space 102 may be referred to as child correlithm objects 604. In general, child correlithm objects 604 are represented by a higher order binary string than parent correlithm objects 603. In other words, the bit strings used to represent a child correlithm object 604 may have more bits than the bit strings used to represent a parent correlithm object 603. The distance between parent correlithm objects 603 may be referred to as a standard distance. The distance between child correlithm objects 604 and other child correlithm objects 604 or parent correlithm objects 603 may be referred to as a fractional distance which is less than the standard distance.

FIG. 7 illustrates another embodiment of how a string correlithm object 602 may be implemented within a node 304 by a device 100. In other embodiments, string correlithm objects 602 may be integrated within a sensor 302 or an actor 306. In FIG. 7, a set of correlithm objects 104 are shown within an n-dimensional space 102. In one embodiment, the correlithm objects 104 are equally spaced from adjacent correlithm objects 104. A string correlithm object 602 comprises a parent correlithm object 603 linked with one or more child correlithm objects 604. FIG. 7 illustrates three string correlithm objects 602 where each string correlithm object 602 comprises a parent correlithm object 603 linked with six child correlithm objects 603. In other examples, the n-dimensional space 102 may comprise any suitable number of correlithm objects 104 and/or string correlithm objects 602.

A parent correlithm object 603 may be a member of one or more string correlithm objects 602. For example, a parent correlithm object 603 may be linked with one or more sets of child correlithm objects 604 in a node table 200. In one embodiment, a child correlithm object 604 may only be linked with one parent correlithm object 603. String correlithm objects 602 may be configured to form a daisy chain or a linear chain of child correlithm objects 604. In one embodiment, string correlithm objects 602 are configured such that child correlithm objects 604 do not form loops where the chain of child correlithm objects 604 intersect with themselves. Each child correlithm objects 604 is less than the standard distance away from its parent correlithm object 603. The child correlithm objects 604 are equally spaced from other adjacent child correlithm objects 604.

In one embodiment, a data structure such as node table 200 may be used to map or link parent correlithm objects 603 with child correlithm objects 604. The node table 200 is generally configured to identify a plurality of parent correlithm objects 603 and one or more child correlithm objects 604 linked with each of the parent correlithm objects 603. For example, node table 200 may be configured with a first column that lists child correlithm objects 604 and a second column that lists parent correlithm objects 603. In other examples, the node table 200 may be configured in any other suitable manner or may be implemented using any other suitable data structure. In some embodiments, one or more mapping functions may be used to convert between a child correlithm object 604 and a parent correlithm object 603.

Figure 8:
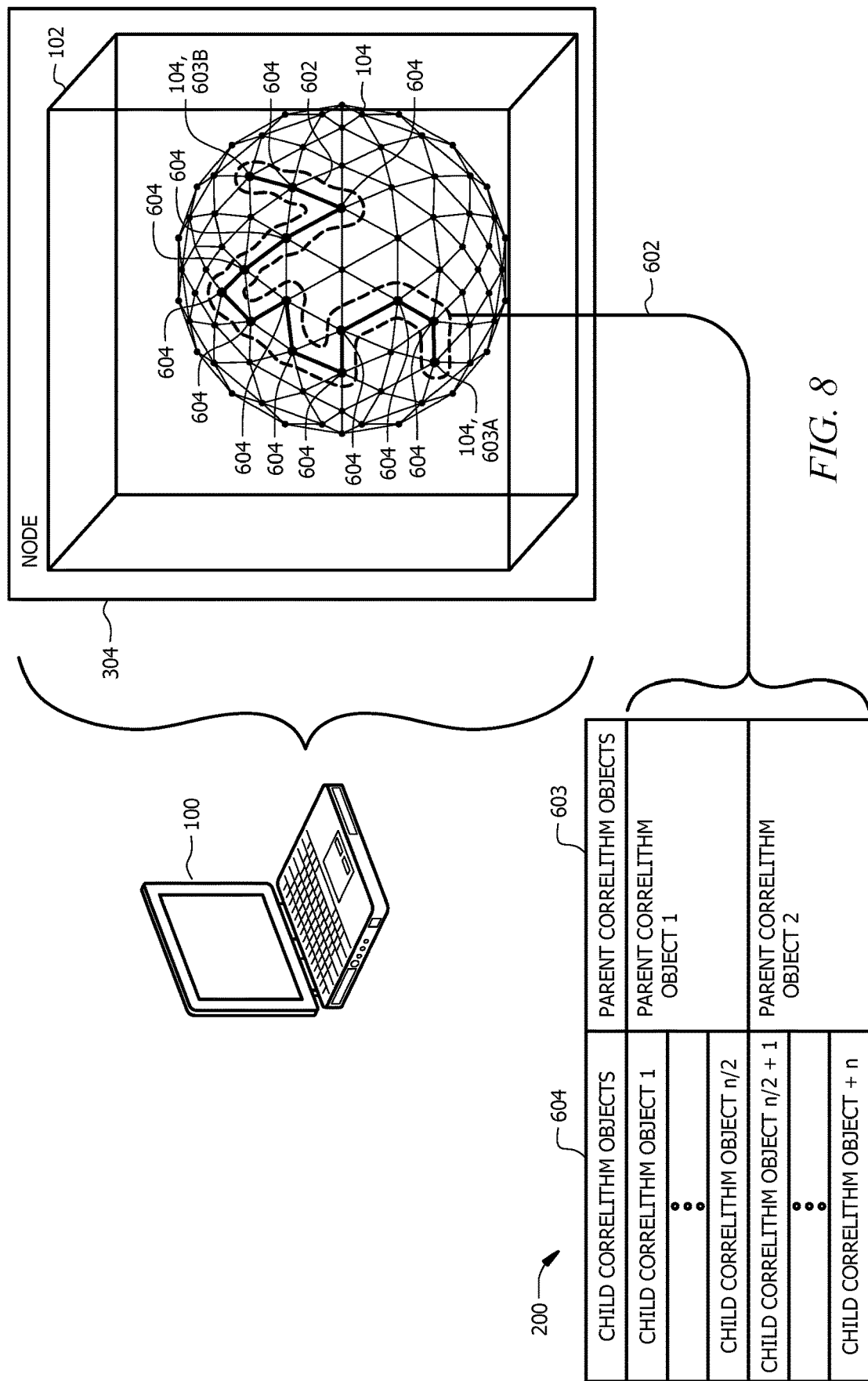
FIG. 8 is a schematic diagram of another embodiment of a device implementing string correlithm objects in a node for a correlithm object processing system.

FIG. 8 is a schematic diagram of another embodiment of a device 100 implementing string correlithm objects 602 in a node 304 for a correlithm object processing system 300. Previously in FIG. 7, a string correlithm object 602 comprised of child correlithm objects 604 that are adjacent to a parent correlithm object 603. In FIG. 8, string correlithm objects 602 comprise one or more child correlithm objects 604 in between a pair of parent correlithm objects 603. In this configuration, the string correlithm object 602 initially diverges from a first parent correlithm object 603A and then later converges toward a second parent correlithm object 603B. This configuration allows the correlithm object processing system 300 to generate a string correlithm object 602 between a particular pair of parent correlithm objects 603.

The string correlithm objects described in FIG. 8 allow the device 100 to interpolate value between a specific pair of correlithm objects 104 (i.e. parent correlithm objects 603). In other words, these types of string correlithm objects 602 allow the device 100 to perform interpolation between a set of parent correlithm objects 603. Interpolation between a set of parent correlithm objects 603 enables the device 100 to perform operations such as quantization which convert between different orders of correlithm objects 104.

In one embodiment, a data structure such as node table 200 may be used to map or link the parent correlithm objects 603 with their respective child correlithm objects 604. For example, node table 200 may be configured with a first column that lists child correlithm objects 604 and a second column that lists parent correlithm objects 603. In this example, a first portion of the child correlithm objects 604 is linked with the first parent correlithm object 603A and a second portion of the child correlithm objects 604 is linked with the second parent correlithm object 603B. In other examples, the node table 200 may be configured in any other suitable manner or may be implemented using any other suitable data structure. In some embodiments, one or more mapping functions may be used to convert between a child correlithm object 604 and a parent correlithm object 603.

Figure 9:
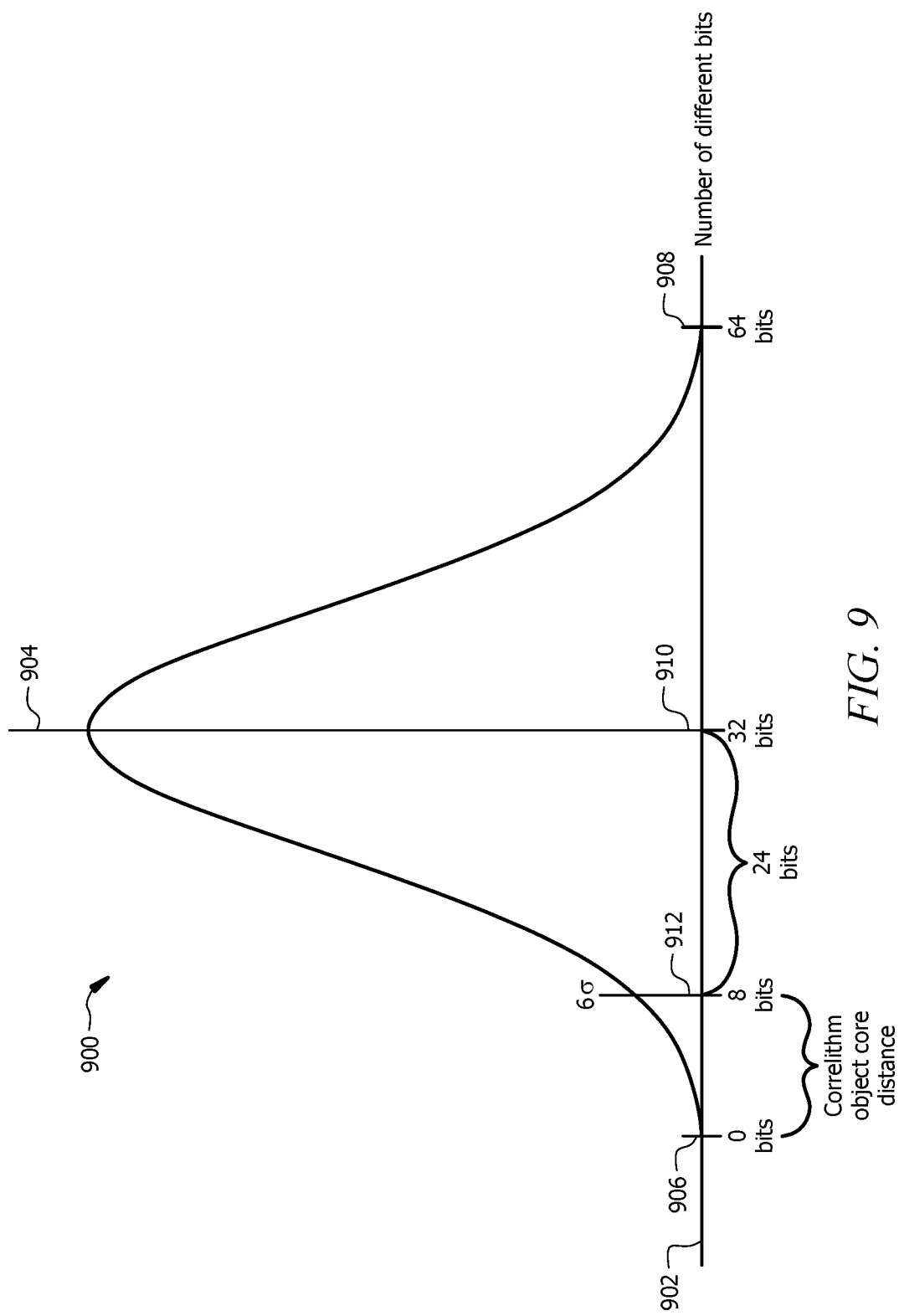
FIG. 9 is an embodiment of a graph of a probability distribution for matching a random correlithm object with a particular correlithm object.

FIG. 9 is an embodiment of a graph of a probability distribution 900 for matching a random correlithm object 104 with a particular correlithm object 104. Axis 902 indicates the number of bits that are different between a random correlithm object 104 with a particular correlithm object 104. Axis 904 indicates the probability associated with a particular number of bits being different between a random correlithm object 104 and a particular correlithm object 104.

As an example, FIG. 9 illustrates the probability distribution 900 for matching correlithm objects 104 in a 64-dimensional space 102. In one embodiment, the probability distribution 900 is approximately a Gaussian distribution. As the number of dimensions in the n-dimensional space 102 increases, the probability distribution 900 starts to shape more like an impulse response function. In other examples, the probability distribution 900 may follow any other suitable type of distribution.

Location 906 illustrates an exact match between a random correlithm object 104 with a particular correlithm object 104. As shown by the probability distribution 900, the probability of an exact match between a random correlithm object 104 with a particular correlithm object 104 is extremely low. In other words, when an exact match occurs the event is most likely deliberate and not a random occurrence.

Location 908 illustrates when all of the bits between the random correlithm object 104 with the particular correlithm object 104 are different. In this example, the random correlithm object 104 and the particular correlithm object 104 have 64 bits that are different from each other. As shown by the probability distribution 900, the probability of all the bits being different between the random correlithm object 104 and the particular correlithm object 104 is also extremely low.

Location 910 illustrates an average number of bits that are different between a random correlithm object 104 and the particular correlithm object 104. In general, the average number of different bits between the random correlithm object 104 and the particular correlithm object 104 is equal to n/2 (also referred to as standard distance), where 'n' is the number of dimensions in the n-dimensional space 102. In this example, the average number of bits that are different between a random correlithm object 104 and the particular correlithm object 104 is 32 bits.

Location 912 illustrates a cutoff region that defines a core distance for a correlithm object core. The correlithm object 104 at location 906 may also be referred to as a root correlithm object for a correlithm object core. The core distance defines the maximum number of bits that can be different between a correlithm object 104 and the root correlithm object to be considered within a correlithm object core for the root correlithm object. In other words, the core distance defines the maximum number of hops away a correlithm object 104 can be from a root correlithm object to be considered a part of the correlithm object core for the root correlithm object. Additional information about a correlithm object core is described in FIG. 10. In this example, the cutoff region defines a core distance equal to six standard deviations away from the average number of bits that are different between a random correlithm object 104 and the particular correlithm object 104. In general, the standard deviation is equal to $$\sqrt{\frac{n}{4}},$$

where 'n' is the number of dimensions in the n-dimensional space 102. In this example, the standard deviation of the 64-dimensional space 102 is equal to 4 bits. This means the cutoff region (location 912) is located 24 bits away from location 910 which is 8 bits away from the root correlithm object at location 906. In other words, the core distance is equal to 8 bits. This means that the cutoff region at location 912 indicates that the core distance for a correlithm object core includes correlithm objects 104 that have up to 8 bits different then the root correlithm object or are up to 8 hops away from the root correlithm object. In other examples, the cutoff region that defines the core distance may be equal any other suitable value. For instance, the cutoff region may be set to 2, 4, 8, 10, 12, or any other suitable number of standard deviations away from location 910.

Figure 10:
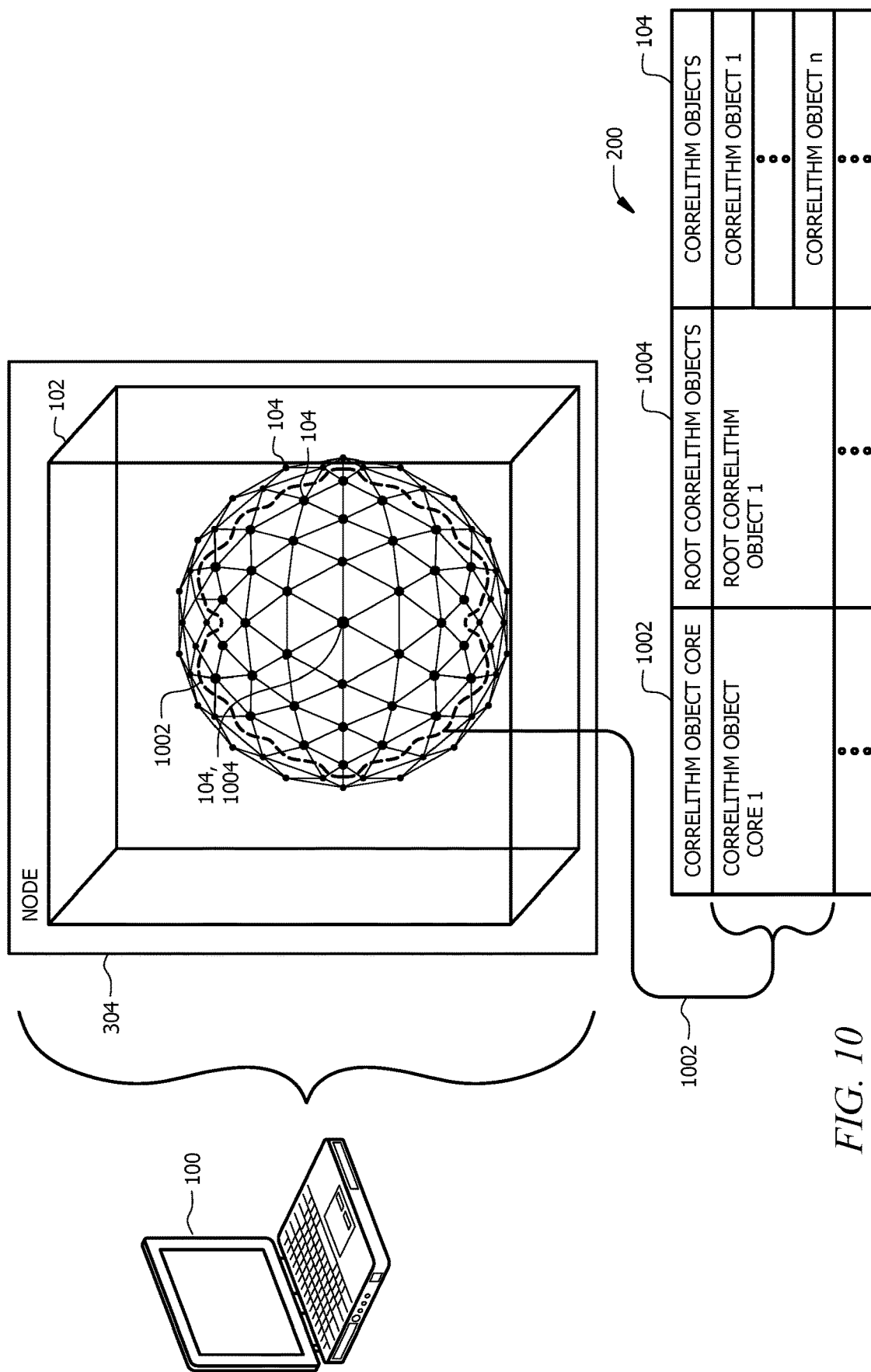
FIG. 10 is a schematic diagram of an embodiment of a device implementing a correlithm object core in a node for a correlithm object processing system.

FIG. 10 is a schematic diagram of an embodiment of a device 100 implementing a correlithm object core 1002 in a node 304 for a correlithm object processing system 300. In other embodiments, correlithm object cores 1002 may be integrated with a sensor 302 or an actor 306. Correlithm object cores 1002 can be used by a correlithm object processing system 300 to classify or group correlithm objects 104 and/or the data samples they represent. For example, a set of correlithm objects 104 can be grouped together by linking them with a correlithm object core 1402. The correlithm object core 1002 identifies the class or type associated with the set of correlithm objects 104.

In one embodiment, a correlithm object core 1002 comprises a root correlithm object 1004 that is linked with a set of correlithm objects 104. The set of correlithm objects 104 that are linked with the root correlithm object 1004 are the correlithm objects 104 which are located within the core distance of the root correlithm object 1004. The set of correlithm objects 104 are linked with only one root correlithm object 1004. The core distance can be computed using a process similar to the process described in FIG. 9. For example, in a 64-dimensional space 102 with a core distance defined at six sigma (i.e. six standard deviations), the core distance is equal to 8-bits. This means that correlithm objects 104 within up to eight hops away from the root correlithm object 1004 are members of the correlithm object core 1002 for the root correlithm object 1004.

In one embodiment, a data structure such as node table 200 may be used to map or link root correlithm objects 1004 with sets of correlithm objects 104. The node table 200 is generally configured to identify a plurality of root correlithm objects 1004 and correlithm objects 104 linked with the root correlithm objects 1004. For example, node table 200 may be configured with a first column that lists correlithm object cores 1002, a second column that lists root correlithm objects 1004, and a third column that lists correlithm objects 104. In other examples, the node table 200 may be configured in any other suitable manner or may be implemented using any other suitable data structure. In some embodiments, one or more mapping functions may be used to convert between correlithm objects 104 and a root correlithm object 1004.

Figure 11:
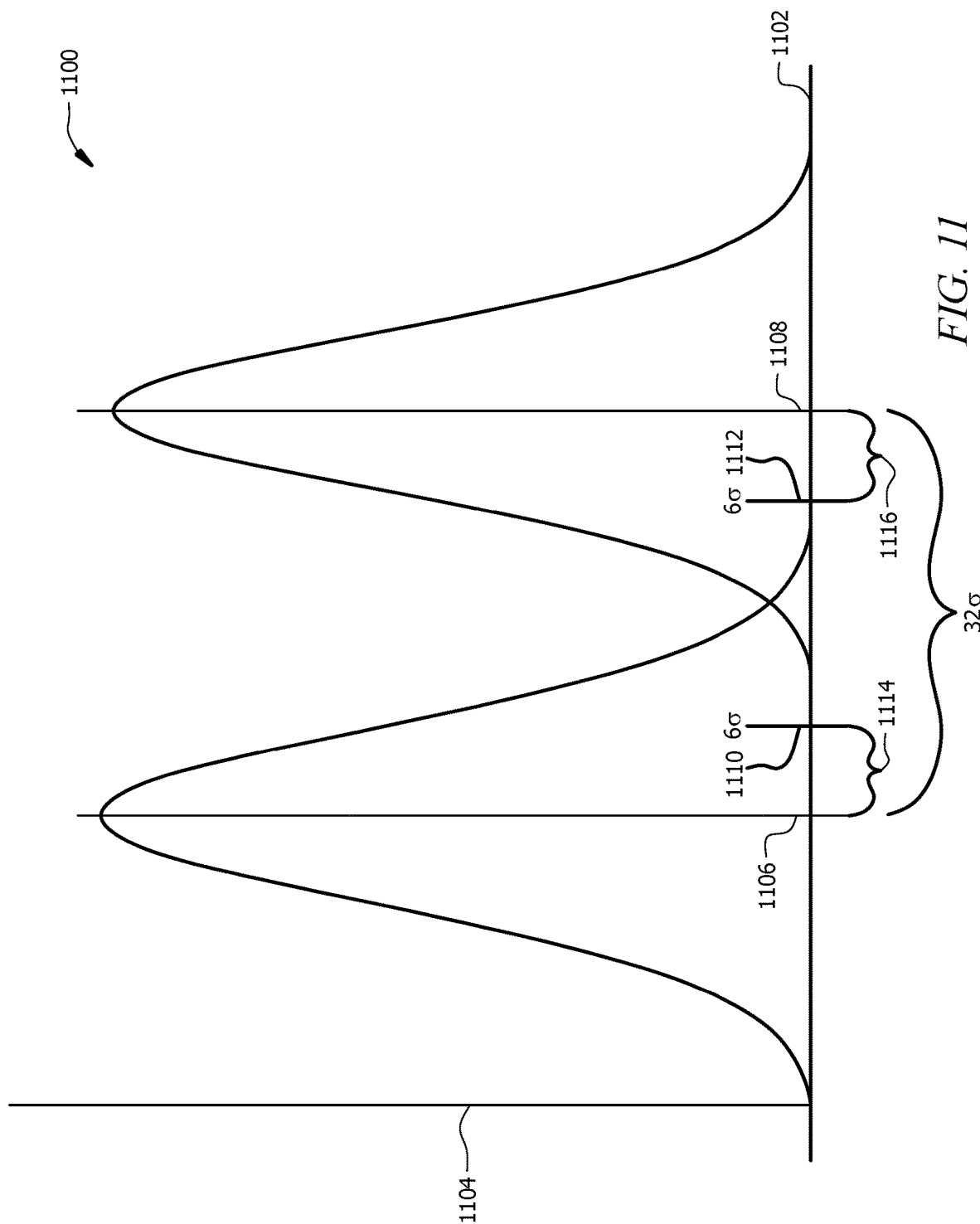
FIG. 11 is an embodiment of a graph of probability distributions for adjacent root correlithm objects.

FIG. 11 is an embodiment of a graph of probability distributions 1100 for adjacent root correlithm objects 1004. Axis 1102 indicates the distance between the root correlithm objects 1004, for example, in units of bits. Axis 1104 indicates the probability associated with the number of bits being different between a random correlithm object 104 and a root correlithm object 1004.

As an example, FIG. 11 illustrates the probability distributions for adjacent root correlithm objects 1004 in a 1024-dimensional space 102. Location 1106 illustrates the location of a first root correlithm object 1004 with respect to a second root correlithm object 1004. Location 1108 illustrates the location of the second root correlithm object 1004. Each root correlithm object 1004 is located an average distance away from each other which is equal to $$\frac{n}{2},$$

where 'n' is the number of dimensions in the n-dimensional space 102. In this example, the first root correlithm object 1004 and the second root correlithm object 1004 are 512 bits or 32 standard deviations away from each other.

In this example, the cutoff region for each root correlithm object 1004 is located at six standard deviations from locations 1106 and 1108. In other examples, the cutoff region may be located at any other suitable location. For example, the cutoff region defining the core distance may one, two, four, ten, or any other suitable number of standard deviations away from the average distance between correlithm objects 104 in the n-dimensional space 102. Location 1110 illustrates a first cutoff region that defines a first core distance 1114 for the first root correlithm object 1004. Location 1112 illustrates a second cutoff region that defines a second core distance 1116 for the second root correlithm object 1004.

In this example, the core distances for the first root correlithm object 1004 and the second root correlithm object 1004 do not overlap with each other. This means that correlithm objects 104 within the correlithm object core 1002 of one of the root correlithm objects 1004 are uniquely associated with the root correlithm object 1004 and there is no ambiguity.

Figure 12A:
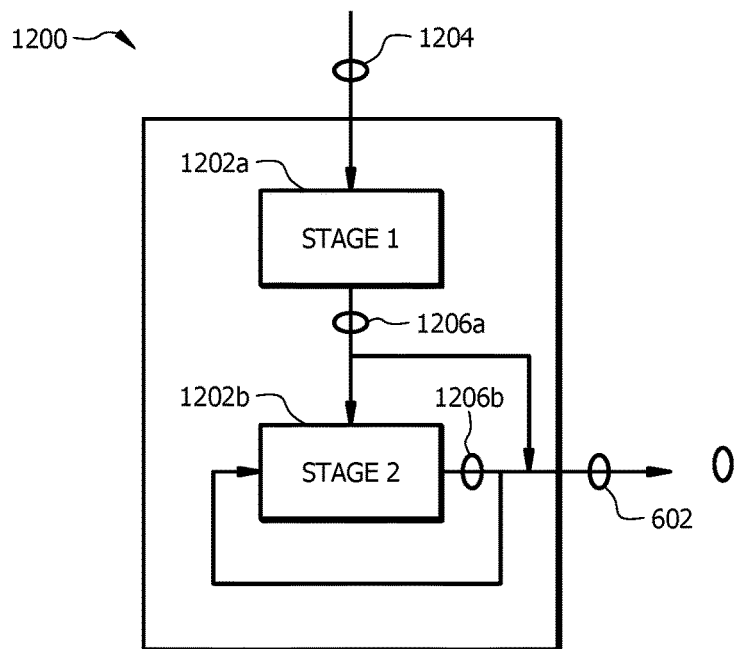
FIG. 12A is an embodiment of a string correlithm object generator.

FIG. 12A illustrates one embodiment of a string correlithm object generator 1200 configured to generate a string correlithm object 602 as output. String correlithm object generator 1200 is implemented by string correlithm object engine 522 and comprises a first processing stage 1202a communicatively and logically coupled to a second processing stage 1202b. First processing stage 1202 receives an input 1204 and outputs a first sub-string correlithm object 1206a that comprises an n-bit digital word wherein each bit has either a value of zero or one. In one embodiment, first processing stage 1202 generates the values of each bit randomly. Input 1204 comprises one or more parameters used to determine the characteristics of the string correlithm object 602. For example, input 1204 may include a parameter for the number of dimensions, n, in the n-dimensional space 102 (e.g., 64, 128, 256, etc.) in which to generate the string correlithm object 602. Input 1204 may also include a distance parameter, δ, that indicates a particular number of bits of the n-bit digital word (e.g., 4, 8, 16, etc.) that will be changed from one sub-string correlithm object 1206 to the next in the string correlithm object 602. Second processing stage 1202b receives the first sub-string correlithm object 1206a and, for each bit of the first sub-string correlithm object 1206a up to the particular number of bits identified in the distance parameter, δ, changes the value from a zero to a one or from a one to a zero to generate a second sub-string correlithm object 1206b. The bits of the first sub-string correlithm object 1206a that are changed in value for the second sub-string correlithm object 1206b are selected randomly from the n-bit digital word. The other bits of the n-bit digital word in second sub-string correlithm object 1206b remain the same values as the corresponding bits of the first sub-string correlithm object 1206a.

Figure 12B:
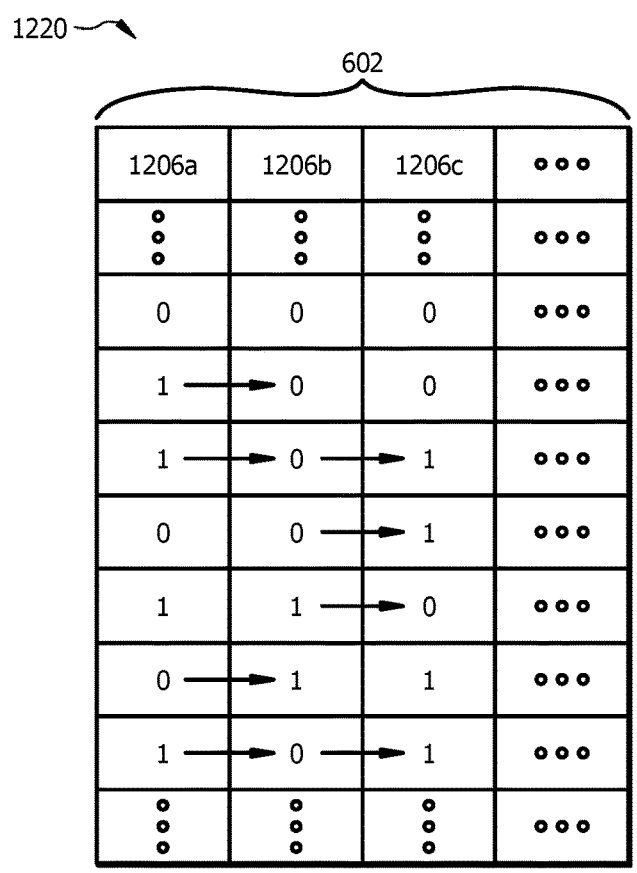
FIG. 12B is an embodiment of a table demonstrating a change in bit values associated with sub-string correlithm objects.

FIG. 12B illustrates a table 1220 that demonstrates the changes in bit values from a first sub-string correlithm object 1206a to a second sub-string correlithm object 1206b. In this example, assume that n=64 such that each sub-string correlithm object 1206 of the string correlithm object 602 is a 64-bit digital word. As discussed previously with regard to FIG. 9, the standard deviation is equal to $$\sqrt{\frac{n}{4}},$$

or four bits, for a 64-dimensional space 102. In one embodiment, the distance parameter, δ, is selected to equal the standard deviation. In this embodiment, the distance parameter is also four bits which means that four bits will be changed from each sub-string correlithm object 1206 to the next in the string correlithm object 602. In other embodiments where it is desired to create a tighter correlation among sub-string correlithm objects 1206, a distance parameter may be selected to be less than the standard deviation (e.g., distance parameter of three bits or less where standard deviation is four bits). In still other embodiments where it is desired to create a looser correlation among sub-string correlithm objects 1206, a distance parameter may be selected to be more than the standard deviation (e.g., distance parameter of five bits or more where standard deviation is four bits). Table 1220 illustrates the first sub-string correlithm object 1206*a* in the first column having four bit values that are changed, by second processing stage 1202*b*, from a zero to a one or from a one to a zero to generate second sub-string correlithm object 1206*b* in the second column. By changing four bit values, the core of the first sub-string correlithm object 1206*a* overlaps in 64-dimensional space with the core of the second sub-string correlithm object 1206*b*.

Referring back to FIG. 12A, the second processing stage 1202*b* receives from itself the second sub-string correlithm object 1206*b* as feedback. For each bit of the second sub-string correlithm object 1206*b* up to the particular number of bits identified by the distance parameter, the second processing stage 1202*b* changes the value from a zero to a one or from a one to a zero to generate a third sub-string correlithm object 1206*c*. The bits of the second sub-string correlithm object 1206*b* that are changed in value for the third sub-string correlithm object 1206*c* are selected randomly from the n-bit digital word. The other bits of the n-bit digital word in third sub-string correlithm object 1206*c* remain the same values as the corresponding bits of the second sub-string correlithm object 1206*b*. Referring back to table 1220 illustrated in FIG. 12B, the second sub-string correlithm object 1206*b* in the second column has four bit values that are changed, by second processing stage 1202*b*, from a zero to a one or from a one to a zero to generate third sub-string correlithm object 1206*c* in the third column.

Referring back to FIG. 12A, the second processing stage 1202*b* successively outputs a subsequent sub-string correlithm object 1206 by changing bit values of the immediately prior sub-string correlithm object 1206 received as feedback, as described above. This process continues for a predetermined number of sub-string correlithm objects 1206 in the string correlithm object 602. Together, the sub-string correlithm objects 1206 form a string correlithm object 602 in which the first sub-string correlithm object 1206*a* precedes and is adjacent to the second sub-string correlithm object 1206*b*, the second sub-string correlithm object 1206*b* precedes and is adjacent to the third sub-string correlithm object 1206*c*, and so on. Each sub-string correlithm object 1206 is separated from an adjacent sub-string correlithm object 1206 in n-dimensional space 102 by a number of bits represented by the distance parameter, $\delta$.

Figure 13:
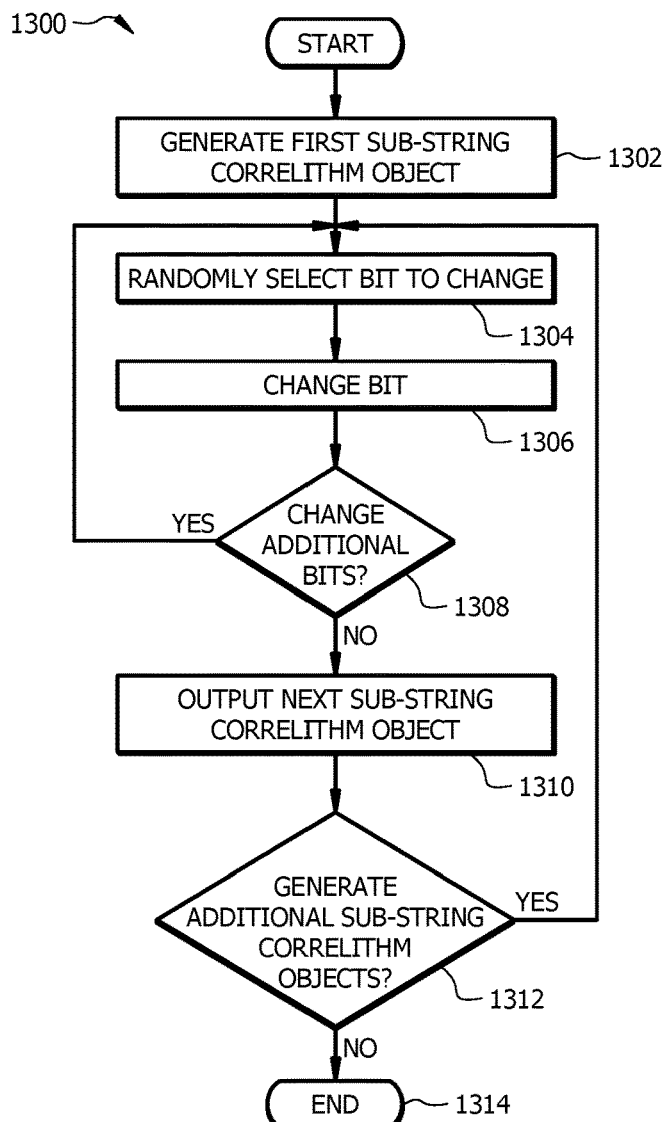
FIG. 13 is an embodiment of a process for generating a string correlithm object.

FIG. 13 is a flowchart of an embodiment of a process 1300 for generating a string correlithm object 602. At step 1302, a first sub-string correlithm object 1206*a* is generated, such as by a first processing stage 1202*a* of a string correlithm object generator 1200. The first sub-string correlithm object 1206*a* comprises an n-bit digital word. At step 1304, a bit of the n-bit digital word of the sub-string correlithm object 1206 is randomly selected and is changed at step 1306 from a zero to a one or from a one to a zero. Execution proceeds to step 1308 where it is determined whether to change additional bits in the n-bit digital word. In general, process 1300 will change a particular number of bits up to the distance parameter, S. In one embodiment, as described above with regard to FIGS. 12A-B, the distance parameter is four bits. If additional bits remain to be changed in the sub-string correlithm object 1206, then execution returns to step 1304. If all of the bits up to the particular number of bits in the distance parameter have already been changed, as determined at step 1308, then execution proceeds to step 1310 where the second sub-string correlithm object 1206*b* is output. The other bits of the n-bit digital word in second sub-string correlithm object 1206*b* remain the same values as the corresponding bits of the first sub-string correlithm object 1206*a*.

Execution proceeds to step 1312 where it is determined whether to generate additional sub-string correlithm objects 1206 in the string correlithm object 602. If so, execution returns back to step 1304 and the remainder of the process occurs again to change particular bits up to the number of bits in the distance parameter, S. Each subsequent sub-string correlithm object 1206 is separated from the immediately preceding sub-string correlithm object 1206 in n-dimensional space 102 by a number of bits represented by the distance parameter, S. If no more sub-string correlithm objects 1206 are to be generated in the string correlithm object 602, as determined at step 1312, execution of process 1300 terminates at steps 1314.

A string correlithm object 602 comprising a series of adjacent sub-string correlithm objects 1206 whose cores overlap with each other permits data values to be correlated with each other in n-dimensional space 102. Thus, where discrete data values have a pre-existing relationship with each other in the real-world, those relationships can be maintained in n-dimensional space 102 if they are represented by sub-string correlithm objects of a string correlithm object 602. For example, the letters of an alphabet have a relationship with each other in the real-world. In particular, the letter "A" precedes the letters "B" and "C" but is closer to the letter "B" than the letter "C". Thus, if the letters of an alphabet are to be represented by a string correlithm object 602, the relationship between letter "A" and the letters "B" and "C" should be maintained such that "A" precedes but is closer to letter "B" than letter "C." Similarly, the letter "B" is equidistant to both letters "A" and "C," but the letter "B" is subsequent to the letter "A" and preceding the letter "C". Thus, if the letters of an alphabet are to be represented by a string correlithm object 602, the relationship between letter "B" and the letters "A" and "C" should be maintained such that the letter "B" is equidistant but subsequent to letter "A" and preceding letter "C." The ability to migrate these relationships between data values in the real-world to relationships among correlithm objects provides a significant advance in the ability to record, store, and faithfully reproduce data within different computing environments.

Figure 14:
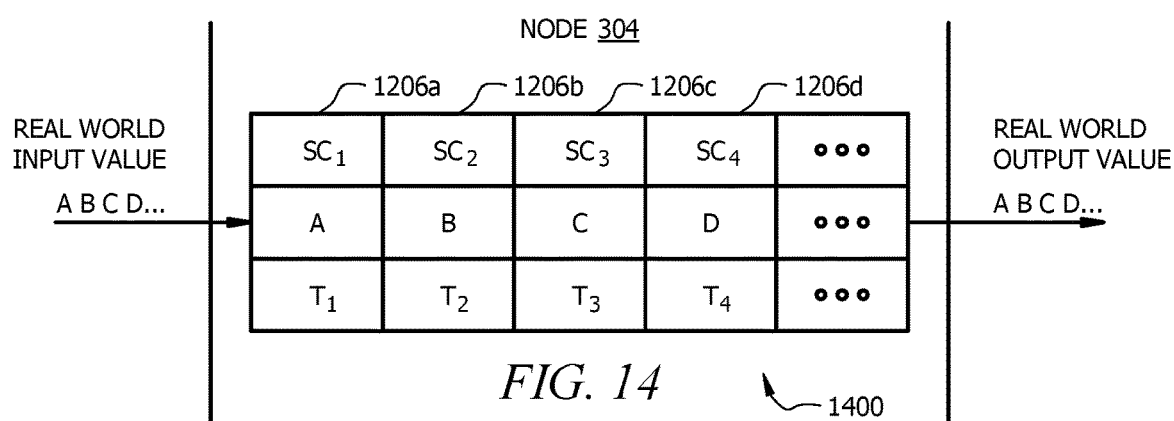
FIG. 14 is an embodiment of discrete data values mapped to sub-string correlithm objects of a string correlithm object.

FIG. 14 illustrates how data values that have pre-existing relationships with each other can be mapped to sub-string correlithm objects 1206 of a string correlithm object 602 in n-dimensional space 102 by string correlithm object engine 522 to maintain their relationships to each other. Although the following description of FIG. 14 is illustrated with respect to letters of an alphabet as representing data values that have pre-existing relationships to each other, other data values can also be mapped to string correlithm objects 602 using the techniques discussed herein. In particular, FIG. 14 illustrates a node table 1400 stored in memory 504 that includes a column for a subset of sub-string correlithm objects 1206 of a string correlithm object 602. The first sub-string correlithm object 1206*a* is mapped to a discrete data value, such as the letter "A" of the alphabet. The second sub-string correlithm object 1206*b* is mapped to a discrete data value, such as the letter "B" of the alphabet, and so on with sub-string correlithm objects 1206*c* and 1206*d* mapped to the letters "C" and "D". As discussed above, the letters of the alphabet have a correlation with each other, including a sequence, an ordering, and a distance from each other. These correlations among letters of the alphabet could not be maintained as represented in n-dimensional space if each letter was simply mapped to a random correlithm object 104. Accordingly, to maintain these correlations, the letters of the alphabet are mapped to sub-string correlation objects 1206 of a string correlation object 602. This is because, as described above, the adjacent sub-string correlation objects 1206 of a string correlation object 602 also have a sequence, an ordering, and a distance from each other that can be maintained in n-dimensional space.

In particular, just like the letters "A," "B," "C," and "D" have an ordered sequence in the real-world, the sub-string correlithm objects 1206a, 1206b, 1206c, and 1206d have an ordered sequence and distance relationships to each other in n-dimensional space. Similarly, just like the letter "A" precedes but is closer to the letter "B" than the letter "C" in the real-world, so too does the sub-string correlithm object 1206a precede but is closer to the sub-string correlithm object 1206b than the sub-string correlithm object 1206c in n-dimensional space. Similarly, just like the letter "B" is equidistant to but in between the letters "A" and "C" in the real world, so too is the sub-string correlithm object 1206b equidistant to but in between the sub-string correlithm objects 1206a and 1206c in n-dimensional space. Although the letters of the alphabet are used to provide an example of data in the real world that has a sequence, an ordering, and a distance relationship to each other, one of skill in the art will appreciate that any data with those characteristics in the real world can be represented by sub-string correlithm objects 1206 to maintain those relationships in n-dimensional space.

Because the sub-string correlithm objects 1206 of a string correlithm object 602 maintains the sequence, ordering, and/or distance relationships between real-world data in n-dimensional space, node 304 can output the real-world data values (e.g., letters of the alphabet) in the sequence in which they occurred. In one embodiment, the sub-string correlithm objects 1206 can also be associated with timestamps, $t_{1-4}$, to aid with maintaining the relationship of the real-world data with a sequence using the time at which they occurred. For example, sub-string correlithm object 1206a can be associated with a first timestamp, $t_1$; sub-string correlithm object 1206b can be associated with a second timestamp, $t_2$; and so on. In one embodiment where the real-world data represents frames of a video signal that occur at different times of an ordered sequence, maintaining a timestamp in the node table 1400 aids with the faithful reproduction of the real-world data at the correct time in the ordered sequence. In this way, the node table 1400 can act as a recorder by recording discrete data values for a time period extending from at least the first timestamp, $t_1$ to a later timestamp, $t_n$. Also, in this way, the node 304 is also configured to reproduce or playback the real-world data represented by the sub-string correlithm objects 1206 in the node table 1400 for a period of time extending from at least the first timestamp, $t_1$ to a later timestamp, $t_n$. The ability to record real-world data, associate it to sub-string correlithm objects 1206 in n-dimensional space while maintaining its order, sequence, and distance relationships, and subsequently faithfully reproduce the real-world data as originally recorded provides a significant technical advantage to computing systems.

Figure 15A:
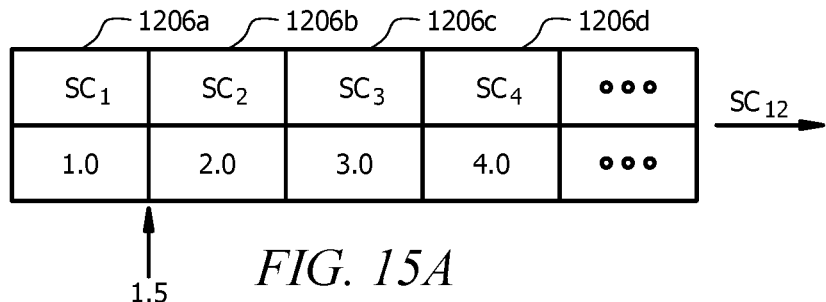
FIG. 15A is an embodiment of analog data values mapped to sub-string correlithm objects of a string correlithm object.

The examples described above relate to representing discrete data values, such as letters of an alphabet, using sub-string correlithm objects 1206 of a string correlithm object 602. However, sub-string correlithm objects 1206 also provide the flexibility to represent non-discrete data values, or analog data values, using interpolation from the real world to n-dimensional space 102. FIG. 15A illustrates how analog data values that have pre-existing relationships with each other can be mapped to sub-string correlithm objects 1206 of a string correlithm object 602 in n-dimensional space 102 by string correlithm object engine 522 to maintain their relationships to each other. FIG. 15A illustrates a node table 1500 stored in memory 504 that includes a column for each sub-string correlithm object 1206 of a string correlithm object 602. The first sub-string correlithm object 1206a is mapped to an analog data value, such as the number "1.0". The second sub-string correlithm object 1206b is mapped to an analog data value, such as the number "2.0", and so on with sub-string correlithm objects 1206c and 1206d mapped to the numbers "3.0" and "4.0." Just like the letters of the alphabet described above, these numbers have a correlation with each other, including a sequence, an ordering, and a distance from each other. One difference between representing discrete data values (e.g., letters of an alphabet) and analog data values (e.g., numbers) using sub-string correlithm objects 1206 is that new analog data values that fall between pre-existing analog data values can be represented using new sub-string correlithm objects 1206 using interpolation, as described in detail below.

If node 304 receives an input representing an analog data value of 1.5, for example, then string correlithm object engine 522 can determine a new sub-string correlithm object 1206 that maintains the relationship between this input of 1.5 and the other numbers that are already represented by sub-string correlithm objects 1206. In particular, node table 1500 illustrates that the analog data value 1.0 is represented by sub-string correlithm object 1206a and analog data value 2.0 is represented by sub-string correlithm object 1206b. Because the analog data value 1.5 is between the data values of 1.0 and 2.0, then a new sub-string correlithm object 1206 would be created in n-dimensional space 102 between sub-string correlithm objects 1206a and 1206b. This is done by interpolating the distance in n-dimensional space 102 between sub-string correlithm objects 1206a and 1206b that corresponds to the distance between 1.0 and 2.0 where 1.5 resides and representing that interpolation using an appropriate n-bit digital word. In this example, the analog data value of 1.5 is halfway between the data values of 1.0 and 2.0. Therefore, the sub-string correlithm object 1206 that is determined to represent the analog data value of 1.5 would be halfway between the sub-string correlithm objects 1206a and 1206b in n-dimensional space 102. Generating a sub-string correlithm object 1206 that is halfway between sub-string correlithm objects 1206a and 1206b in n-dimensional space 102 involves modifying bits of the n-bit digital words representing the sub-string correlithm objects 1206a and 1206b. This process is illustrated with respect to FIG. 15B.

Figure 15B:
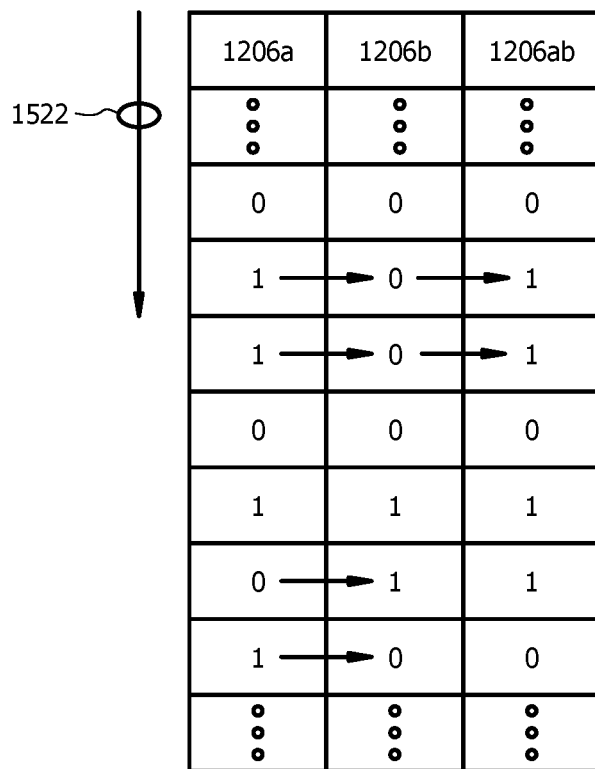
FIG. 15B is an embodiment of a table demonstrating how to map analog data values to sub-string correlithm objects using interpolation.

FIG. 15B illustrates a table 1520 with a first column representing the n-bit digital word of sub-string correlithm object 1206a that is mapped in the node table 1500 to the data value 1.0; a second column representing the n-bit digital word of sub-string correlithm object 1206b that is mapped in the node table 1500 to the data value 2.0; and a third column representing the n-bit digital word of sub-string correlithm object 1206ab that is generated and associated with the data value 1.5. Table 1520 is stored in memory 504. As described above with regard to table 1220, the distance parameter, δ, between adjacent sub-string correlithm objects 1206a and 1206b was chosen, in one embodiment, to be four bits. This means that for a 64-bit digital word, four bits have been changed from a zero to a one or from a one to a zero in order to generate sub-string correlithm object 1206b from sub-string correlithm object 1206a.

In order to generate sub-string correlithm object 1206ab to represent the data value of 1.5, a particular subset of those four changed bits between sub-string correlithm objects 1206a and 1206b should be modified. Moreover, the actual bits that are changed should be selected successively from one end of the n-bit digital word or the other end of the n-bit digital word. Because the data value of 1.5 is exactly halfway between the data values of 1.0 and 2.0, then it can be determined that exactly half of the four bits that are different between sub-string correlithm object 1206a and sub-string correlithm object 1206b should be changed to generate sub-string correlithm object 1206ab. In this particular example, therefore, starting from one end of the n-bit digital word as indicated by arrow 1522, the first bit that was changed from a value of one in sub-string correlithm object 1206a to a value of zero in sub-string correlithm object 1206b is changed back to a value of one in sub-string correlithm object 1206ab. Continuing from the same end of the n-bit digital word as indicated by arrow 1522, the next bit that was changed from a value of one in sub-string correlithm object 1206a to a value of zero in sub-string correlithm object 1206b is changed back to a value of one in sub-string correlithm object 1206ab. The other two of the four bits that were changed from sub-string correlithm object 1206a to sub-string correlithm object 1206b are not changed back. Accordingly, two of the four bits that were different between sub-string correlithm objects 1206a and 1206b are changed back to the bit values that were in sub-string correlithm object 1206a in order to generate sub-string correlithm object 1206ab that is halfway between sub-string correlithm objects 1206a and 1206b in n-dimensional space 102 just like data value 1.5 is halfway between data values 1.0 and 2.0 in the real world.

Other input data values can also be interpolated and represented in n-dimensional space 102, as described above. For example, if the input data value received was 1.25, then it is determined to be one-quarter of the distance from the data value 1.0 and three-quarters of the distance from the data value 2.0. Accordingly, a sub-string correlithm object 1206ab can be generated by changing back three of the four bits that differ between sub-string correlithm objects 1206a and 1206b. In this regard, the sub-string correlithm object 1206ab (which represents the data value 1.25) will only differ by one bit from the sub-string correlithm object 1206a (which represents the data value 1.0) in n-dimensional space 102. Similarly, if the input data value received was 1.75, then it is determined to be three-quarters of the distance from the data value 1.0 and one-quarter of the distance from the data value 2.0. Accordingly, a sub-string correlithm object 1206ab can be generated by changing back one of the four bits that differ between sub-string correlithm objects 1206a and 1206b. In this regard, the sub-string correlithm object 1206ab (which represents the data value 1.75) will differ by one bit from the sub-string correlithm object 1206b (which represents the data value 2.0) in n-dimensional space 102. In this way, the distance between data values in the real world can be interpolated to the distance between sub-string correlithm objects 1206 in n-dimensional space 102 in order to preserve the relationships among analog data values.

Although the example above was detailed with respect to changing bit values from the top end of the n-bit digital word represented by arrow 1522, the bit values can also be successively changed from the bottom end of the n-bit digital word. The key is that of the bit values that differ from sub-string correlithm object 1206a to sub-string correlithm object 1206b, the bit values that are changed to generate sub-string correlithm object 1206ab should be taken consecutively as they are encountered whether from the top end of the n-bit digital word (as represented by arrow 1522) or from the bottom end of the n-bit digital word. This ensures that sub-string correlithm object 1206ab will actually be between sub-string correlithm objects 1206a and 1206b rather than randomly drifting away from both of sub-string correlithm objects 1206a and 1206b in n-dimensional space 102.

Figure 16:
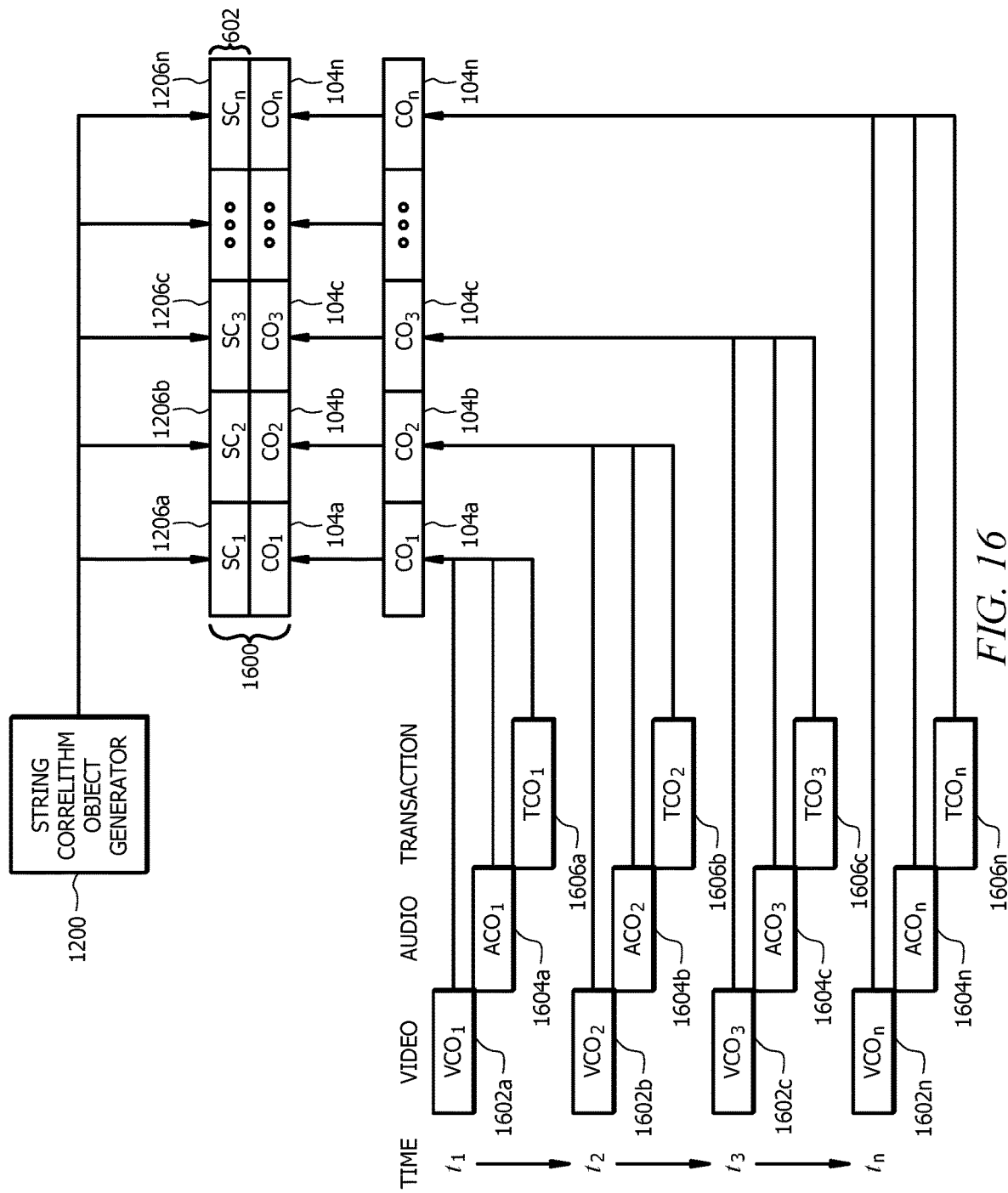
FIG. 16 is an embodiment of non-string correlithm objects mapped to sub-string correlithm objects of a string correlithm object.

FIG. 16 illustrates how real-world data values can be aggregated and represented by correlithm objects 104 (also referred to as non-string correlithm objects 104), which are then linked to corresponding sub-string correlithm objects 1206 of a string correlithm object 602 by string correlithm object engine 522. As described above with regard to FIG. 12A, a string correlithm object generator 1200 generates sub-string correlithm objects 1206 that are adjacent to each other in n-dimensional space 102 to form a string correlithm object 602. The sub-string correlithm objects 1206a-n embody an ordering, sequence, and distance relationships to each other in n-dimensional space 102. As described in detail below, non-string correlithm objects 104 can be mapped to corresponding sub-string correlithm objects 1206 and stored in a node table 1600 to provide an ordering or sequence among them in n-dimensional space 102. This allows node table 1600 to record, store, and faithfully reproduce or playback a sequence of events that are represented by non-string correlithm objects 104a-n. In one embodiment, the sub-string correlithm objects 1206 and the non-string correlithm objects 104 can both be represented by the same length of digital word, n, (e.g., 64 bit, 128 bit, 256 bit). In another embodiment, the sub-string correlithm objects 1206 can be represented by a digital word of one length, n, and the non-string correlithm objects 104 can be represented by a digital word of a different length, m.

In a particular embodiment, the non-string correlithm objects 104a-n can represent aggregated real-world data. For example, real-world data may be generated related to the operation of an automated teller machine (ATM). In this example, the ATM machine may have a video camera and a microphone to tape both the video and audio portions of the operation of the ATM by one or more customers in a vestibule of a bank facility or drive-through. The ATM machine may also have a processor that conducts and stores information regarding any transactions between the ATM and the customer associated with a particular account. The bank facility may simultaneously record video, audio, and transactional aspects of the operation of the ATM by the customer for security, audit, or other purposes. By aggregating the real-world data values into non-string correlithm objects 104 and associating those non-string correlithm objects 104 with sub-string correlithm objects 1206, as described in greater detail below, the correlithm object processing system may maintain the ordering, sequence, and other relationships between the real-world data values in n-dimensional space 102 for subsequent reproduction or playback. Although the example above is detailed with respect to three particular types of real-world data (i.e., video, audio, transactional data associated with a bank ATM) that are aggregated and represented by correlithm objects 104, it should be understood that any suitable number and combination of different types of real-world data can be aggregated and represented in this example.

For a period of time from $t_1$ to $t_n$, the ATM records video, audio, and transactional real-world data. For example, the period of time may represent an hour, a day, a week, a month, or other suitable time period of recording. The real-world video data is represented by video correlithm objects 1602. The real-world audio data is represented by audio correlithm objects 1604. The real-world transaction data is represented by transaction correlithm objects 1606. The correlithm objects 1602, 1604, and 1606 can be aggregated to form non-string correlithm objects 104. For example, at a first time, $t_1$, the ATM generates: (a) real-world video data that is represented as a first video correlithm object 1602a; (b) real-world audio data that is represented by a first audio correlithm object 1604a; and (c) real-world transaction data that is represented by a first transaction correlithm object 1606a. Correlithm objects 1602a, 1604a, and 1606a can be represented as a single non-string correlithm object 104a which is then associated with first sub-string correlithm object 1206a in the node table 1600. In one embodiment, the timestamp, $t_1$, can also be captured in the non-string correlithm object 104a. In this way, three different types of real-world data are captured, represented by a non-string correlithm object 104 and then associated with a portion of the string correlithm object 602.

Continuing with the example, at a second time, $t_2$, the ATM generates: (a) real-world video data that is represented as a second video correlithm object 1602b; (b) real-world audio data that is represented by a second audio correlithm object 1604b; and (c) real-world transaction data that is represented by a second transaction correlithm object 1606b. The second time, $t_2$, can be a predetermined time or suitable time interval after the first time, $t_1$, or it can be at a time subsequent to the first time, $t_1$, where it is determined that one or more of the video, audio, or transaction data has changed in an meaningful way (e.g., video data indicates that a new customer entered the vestibule of the bank facility; another audible voice is detected or the customer has made an audible request to the ATM; or the customer is attempting a different transaction or a different part of the same transaction). Correlithm objects 1602b, 1604b, and 1606b can be represented as a single non-string correlithm object 104b which is then associated with second sub-string correlithm object 1206b in the node table 1600. In one embodiment, the timestamp, $t_2$, can also be captured in the non-string correlithm object 104b.

Continuing with the example, at a third time, $t_3$, the ATM generates: (a) real-world video data that is represented as a third video correlithm object 1602c; (b) real-world audio data that is represented by a third audio correlithm object 1604c; and (c) real-world transaction data that is represented by a third transaction correlithm object 1606c. The third time, $t_3$, can be a predetermined time or suitable time interval after the second time, $t_2$, or it can be at a time subsequent to the second time, $t_2$, where it is determined that one or more of the video, audio, or transaction data has changed again in a meaningful way, as described above. Correlithm objects 1602c, 1604c, and 1606c can be represented as a single non-string correlithm object 104c which is then associated with third sub-string correlithm object 1206c in the node table 1600. In one embodiment, the timestamp, $t_3$, can also be captured in the non-string correlithm object 104c.

Concluding with the example, at an n-th time, $t_n$, the ATM generates: (a) real-world video data that is represented as an n-th video correlithm object 1602n; (b) real-world audio data that is represented by an n-th audio correlithm object 1604n; and (c) real-world transaction data that is represented by an n-th transaction correlithm object 1606n. The third time, $t_n$, can be a predetermined time or suitable time interval after a previous time, $t_{n-1}$, or it can be at a time subsequent to the previous time, $t_{n-1}$, where it is determined that one or more of the video, audio, or transaction data has changed again in a meaningful way, as described above. Correlithm objects 1602n, 1604n, and 1606n can be represented as a single non-string correlithm object 104n which is then associated with n-th sub-string correlithm object 1206n in the node table 1600. In one embodiment, the timestamp, $t_n$, can also be captured in the non-string correlithm object 104n.

As illustrated in FIG. 16, different types of real-world data (e.g., video, audio, transactional) can be captured and represented by correlithm objects 1602, 1604, and 1606 at particular timestamps. Those correlithm objects 1602, 1604, and 1606 can be aggregated into correlithm objects 104. In this way, the real-world data can be "fanned in" and represented by a common correlithm object 104. By capturing real-world video, audio, and transaction data at different relevant timestamps from $t_1$-$t_n$, representing that data in correlithm objects 104, and then associating those correlithm objects 104 with sub-string correlithm objects 1206 of a string correlithm object 602, the node table 1600 described herein can store vast amounts of real-world data in n-dimensional space 102 for a period of time while preserving the ordering, sequence, and relationships among real-world data events and corresponding correlithm objects 104 so that they can be faithfully reproduced or played back in the real-world, as desired. This provides a significant savings in memory capacity.

Figure 17:
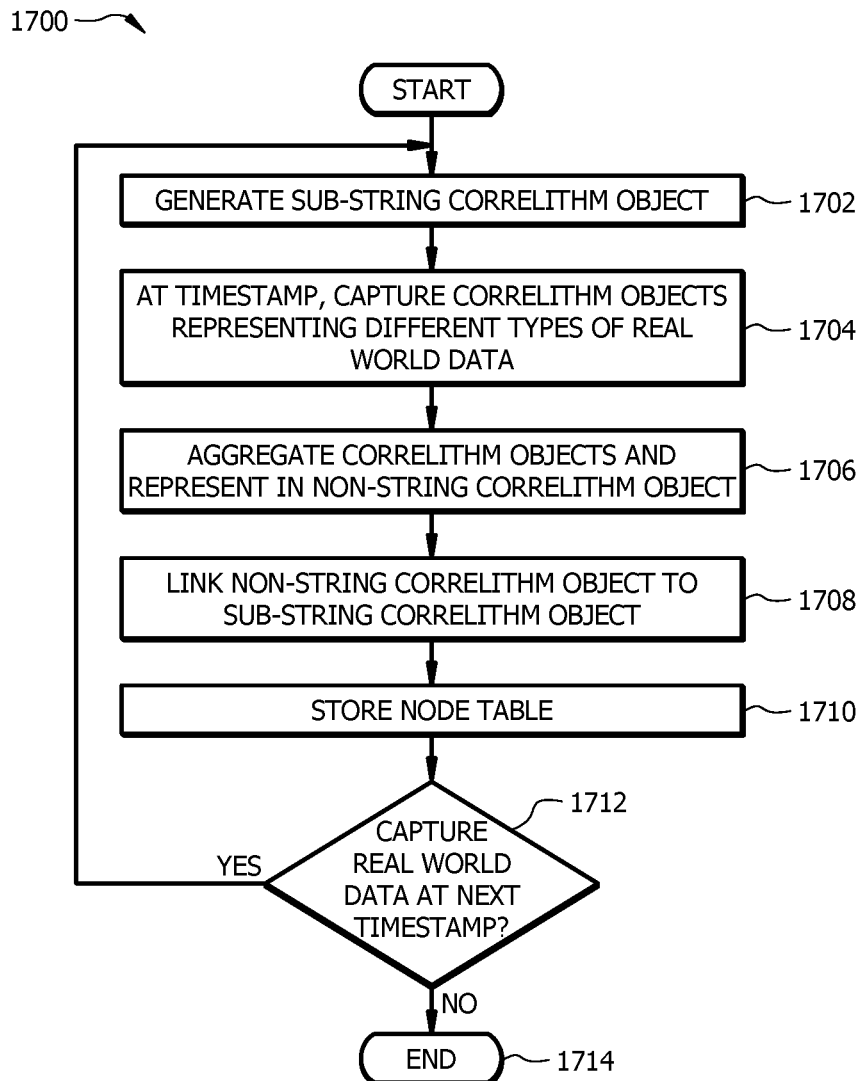
FIG. 17 is an embodiment of a process for mapping non-string correlithm objects to sub-string correlithm objects of a string correlithm object.

FIG. 17 is a flowchart of an embodiment of a process 1700 for linking non-string correlithm objects 104 with sub-string correlithm objects 1206. At step 1702, string correlithm object generator 1200 generates a first sub-string correlithm object 1206a. Execution proceeds to step 1704 where correlithm objects 104 are used to represent different types of real-world data at a first timestamp, $t_1$. For example, correlithm object 1602a represents real-world video data; correlithm object 1604a represents real-world audio data; and correlithm object 1606a represents real-world transaction data. At step 1706, each of correlithm objects 1602a, 1604a, and 1606a captured at the first timestamp, $t_1$, are aggregated and represented by a non-string correlithm object 104a. Execution proceeds to step 1708, where non-string correlithm object 104a is linked to sub-string correlithm object 1206a, and this association is stored in node table 1600 at step 1710. At step 1712, it is determined whether real-world data at the next timestamp should be captured. For example, if a predetermined time interval since the last timestamp has passed or if a meaningful change to the real-world data has occurred since the last timestamp, then execution returns to steps 1702-1710 where another sub-string correlithm object 1206 is generated (step 1702); correlithm objects representing real-world data is captured at the next timestamp (step 1704); those correlithm objects are aggregated and represented in a non-string correlithm object 104 (step 1706); that non-string correlithm object 104 is linked with a sub-string correlithm object 1206 (step 1708); and this association is stored in the node table 1600 (step 1710). If no further real-world data is to be captured at the next timestamp, as determined at step 1712, then execution ends at step 1714.

Figure 18:
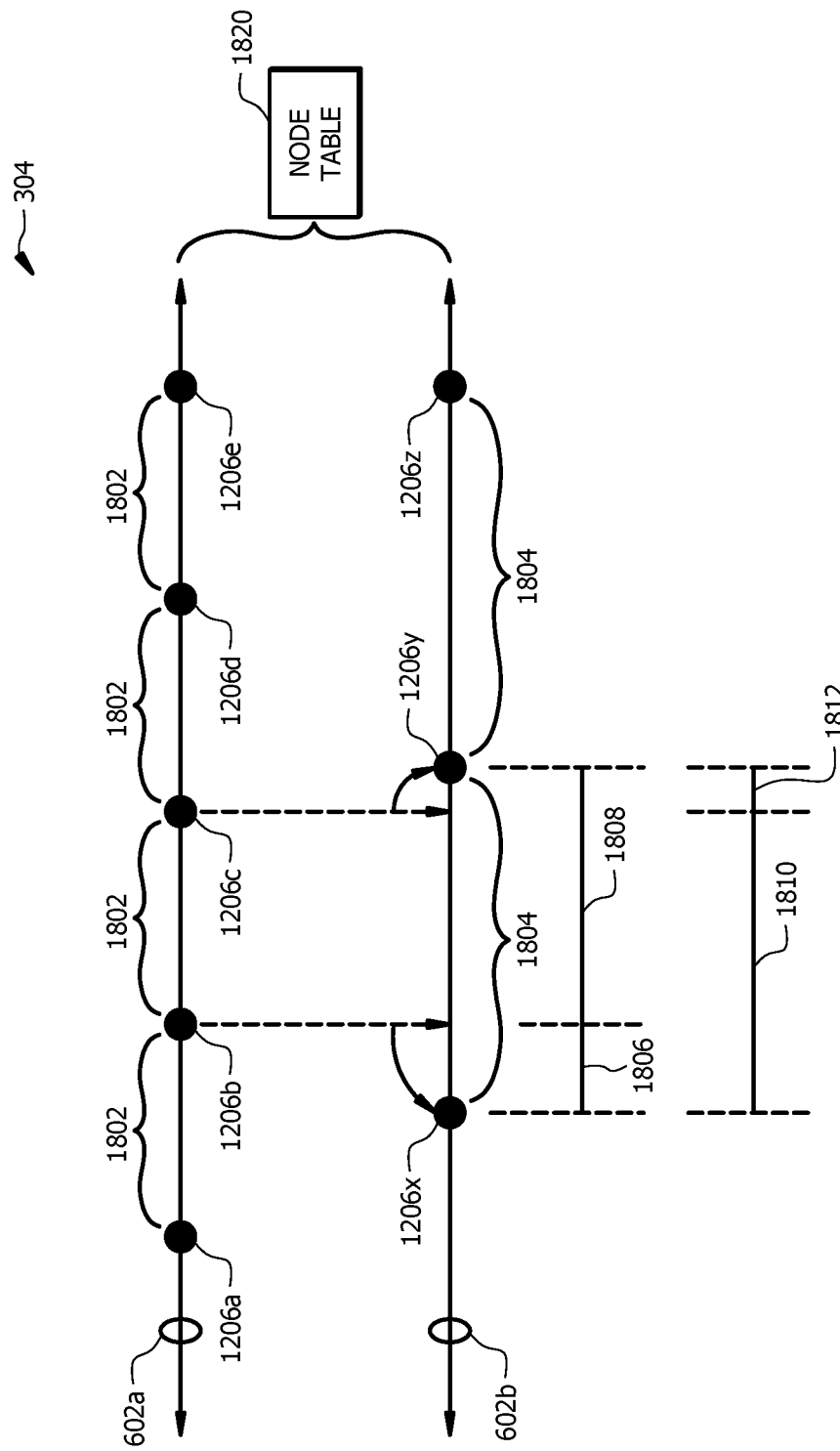
FIG. 18 is an embodiment of sub-string correlithm objects of a first string correlithm object mapped to sub-string correlithm objects of a second string correlithm objects.

FIG. 18 illustrates how sub-string correlithm objects 1206a-e of a first string correlithm object 602a are linked to sub-string correlithm objects 1206x-z of a second string correlithm object 602b by string correlithm object engine 522. The first string correlithm object 602a includes sub-string correlithm objects 1206a-e that are separated from each other by a first distance 1802 in n-dimensional space 102. The second string correlithm object 602b includes sub-string correlithm objects 1206x-z that are separated from each other by a second distance 1804 in n-dimensional space 102. In one embodiment, the sub-string correlithm objects 1206a-e of the first string correlithm object 602a and the sub-string correlithm objects 1206x-z can both be represented by the same length of digital word, n, (e.g., 64-bit, 128-bit, 256-bit). In another embodiment, the sub-string correlithm objects 1206a-e of the first string correlithm object 602a can be represented by a digital word of one length, n, and the sub-string correlithm objects 1206x-z of the second string correlithm object 602b can be represented by a digital word of a different length, m. Each sub-string correlithm object 1206a-e represents a particular data value, such as a particular type of real-world data value. When a particular sub-string correlithm object 1206a-e of the first string correlithm object 602 is mapped to a particular sub-string correlithm object 1206x-z of the second string correlithm object 602, as described below, then the data value associated with the sub-string correlithm object 1206a-e of the first string correlithm object 602a becomes associated with the mapped sub-string correlithm object 1206x-z of the second string correlithm object 602b.

Mapping data represented by sub-string correlithm objects 1206a-e of a first string correlithm object 602a in a smaller n-dimensional space 102 (e.g., 64-bit digital word) where the sub-string correlithm objects 1206a-e are more tightly correlated to sub-string correlithm objects 1206x-z of a second string correlithm object 602b in a larger n-dimensional space 102 (e.g., 256-bit digital word) where the sub-string correlithm objects 1206x-y are more loosely correlated (or vice versa) can provide several technical advantages in a correlithm object processing system. For example, such a mapping can be used to compress data and thereby save memory resources. In another example, such a mapping can be used to spread out data and thereby create additional space in n-dimensions for the interpolation of data. In yet another example, such a mapping can be used to apply a transformation function to the data (e.g., linear transformation function or non-linear transformation function) from the first string correlithm object 602a to the second string correlithm object 602b.

The mapping of a first string correlithm object 602a to a second correlithm object 602b operates, as described below. First, a node 304 receives a particular sub-string correlithm object 1206, such as 1206b illustrated in FIG. 18. To map this particular sub-string correlithm object 1206b to the second correlithm object 602b, the node 304 determines the proximity of it to corresponding sub-string correlithm objects 1206x and 1206y in second string correlithm object 602b (e.g., by determining the Hamming distance between 1206b and 1206x, and between 1206b and 1206y). In particular, node 304 determines a first proximity 1806 in n-dimensional space between the sub-string correlithm object 1206b and sub-string correlithm object 1206x; and determines a second proximity 1808 in n-dimensional space between the sub-string correlithm object 1206b and sub-string correlithm object 1206y. As illustrated in FIG. 18, the first proximity 1806 is smaller than the second proximity 1808. Therefore, sub-string correlithm object 1206b is closer in n-dimensional space 102 to sub-string correlithm object 1206x than to sub-string correlithm object 1206y. Accordingly, node 304 maps sub-string correlithm object 1206b of first string correlithm object 602a to sub-string correlithm object 1206x of second string correlithm object 602b and maps this association in node table 1820 stored in memory 504.

The mapping of the first string correlithm object 602a to a second correlithm object 602b continues in operation, as described below. The node 304 receives another particular sub-string correlithm object 1206, such as 1206c illustrated in FIG. 18. To map this particular sub-string correlithm object 1206c to the second correlithm object 602b, the node 304 determines the proximity of it to corresponding sub-string correlithm objects 1206x and 1206y in second string correlithm object 602b. In particular, node 304 determines a first proximity 1810 in n-dimensional space between the sub-string correlithm object 1206c and sub-string correlithm object 1206x; and determines a second proximity 1812 in n-dimensional space between the sub-string correlithm object 1206c and sub-string correlithm object 1206y. As illustrated in FIG. 18, the second proximity 1812 is smaller than the second proximity 1810. Therefore, sub-string correlithm object 1206c is closer in n-dimensional space 102 to sub-string correlithm object 1206y than to sub-string correlithm object 1206x. Accordingly, node 304 maps sub-string correlithm object 1206c of first string correlithm object 602a to sub-string correlithm object 1206y of second string correlithm object 602b and maps this association in node table 1820.

The sub-string correlithm objects 1206a-e may be associated with timestamps in order to capture a temporal relationship among them and with the mapping to sub-string correlithm objects 1206x-z. For example, sub-string correlithm object 1206a may be associated with a first timestamp, second sub-string correlithm object 1206b may be associated with a second timestamp later than the first timestamp, and so on.

Figure 19:
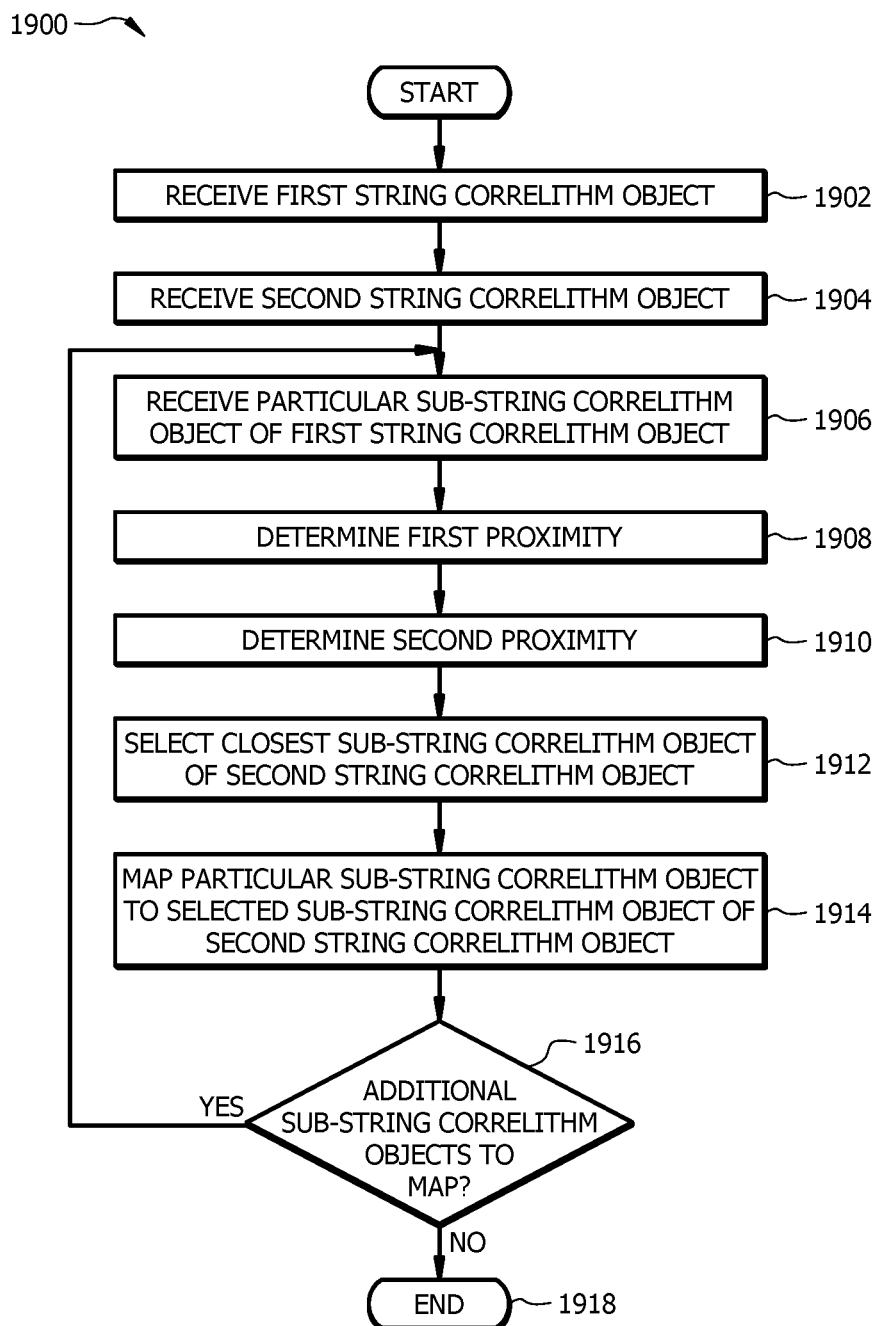
FIG. 19 is an embodiment of a process for mapping sub-string correlithm objects of a first string correlithm object to sub-string correlithm objects of a second string correlithm objects.

FIG. 19 is a flowchart of an embodiment of a process 1900 for linking a first string correlithm object 602a with a second string correlithm object 602b. At step 1902, a first string correlithm object 602a is received at node 304. The first correlithm object 602a includes a first plurality of sub-string correlithm objects 1206, such as 1206a-e illustrated in FIG. 18. Each of these sub-string correlithm objects 1206a-e are separated from each other by a first distance 1802 in n-dimensional space 102. At step 1904, a second string correlithm object 602b is received at node 304. The second correlithm object 602b includes a second plurality of sub-string correlithm objects 1206, such as 1206x-z illustrated in FIG. 18. Each of these sub-string correlithm objects 1206x-z are separated from each other by a second distance 1804 in n-dimensional space 102. At step 1906, node 304 receives a particular sub-string correlithm object 1206 of the first string correlithm object 602a. At step 1908, node 304 determines a first proximity in n-dimensional space 102, such as proximity 1806 illustrated in FIG. 18, to a corresponding sub-string correlithm object 1206 of second correlithm object 602b, such as sub-string correlithm object 1206x illustrated in FIG. 18. At step 1910, node 304 determines a second proximity in n-dimensional space 102, such as proximity 1808 illustrated in FIG. 18, to a corresponding sub-string correlithm object 1206 of second correlithm object 602b, such as sub-string correlithm object 1206y illustrated in FIG. 18.

At step 1912, node 304 selects the sub-string correlithm object 1206 of second string correlithm object 602b to which the particular sub-string correlithm object 1206 received at step 1906 is closest in n-dimensional space based upon the first proximity determined at step 1908 and the second proximity determined at step 1910. For example, as illustrated in FIG. 18, sub-string correlithm object 1206b is closer in n-dimensional space to sub-string correlithm object 1206x than sub-string correlithm object 1206y based on first proximity 1806 being smaller than second proximity 1808. Execution proceeds to step 1914 where node 304 maps the particular sub-string correlithm object 1206 received at step 1906 to the sub-string correlithm object 1206 of second string correlithm object 602b selected at step 1912. At step 1916, node 304 determines whether there are any additional sub-string correlithm objects 1206 of first string correlithm object 602a to map to the second string correlithm object 602b. If so, execution returns to perform steps 1906 through 1914 with respect to a different particular sub-string correlithm object 1206 of first string correlithm object 602a. If not, execution terminates at step 1918.

Figure 20:
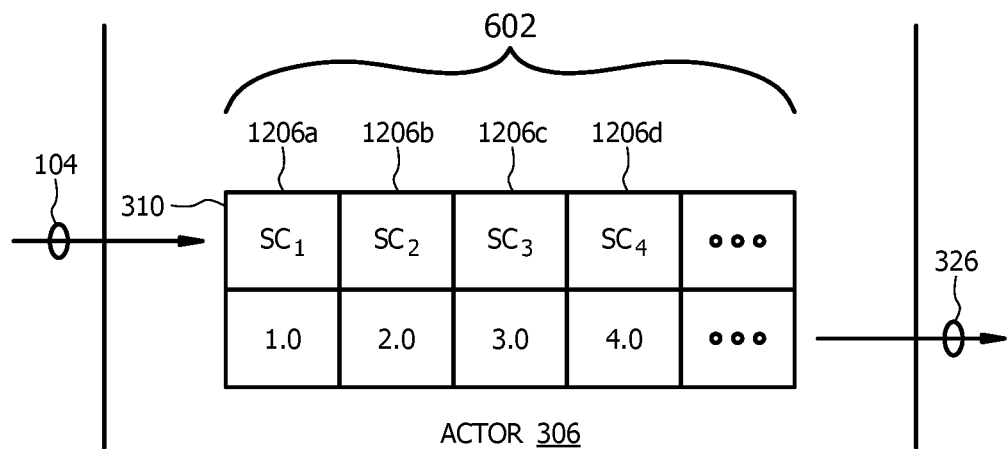
FIG. 20 illustrates one embodiment of an actor that maps sub-string correlithm objects of a string correlithm object to analog or discrete data values.

FIG. 20 illustrates one embodiment of an actor 306 that operates using an actor table 310 that maps sub-string correlithm objects 1206a-d of a string correlithm object 602 in n-dimensional space 102 to analog or discrete data values. Actor 306 may be implemented by actor engine 514, as described above with respect to FIG. 5. Although the following description of FIG. 20 is illustrated with respect to analog data values (e.g. numbers 1.0, 2.0, 3.0, 4.0, etc.) that have a pre-existing relationship to each other, other analog or discrete data values can also be mapped to sub-string correlithm objects 1206a-d in actor table 310, as described below. In particular, FIG. 20 illustrates an actor table 310 stored in memory 504 that includes a row for a subset of sub-string correlithm objects 1206 of string correlithm object 602. The first sub-string correlithm object 1206a is mapped to an analog data value, such as the number 1.0. The second sub-string correlithm object 1206b is mapped to an analog data value, such as the number 2.0, and so on with sub-string correlithm objects 1206c and 1206d mapped to the numbers 3.0 and 4.0, respectively. The analog data values 1.0, 2.0, 3.0, 4.0, etc. have a correlation with each other, including a sequence, an ordering, and a distance from each other. To maintain these correlations, these analog data values are mapped to sub-string correlithm objects 1206 of a string correlithm object 602 in actor table 310. This is because, as described above, the adjacent sub-string correlation objects 1206 of a string correlation object 602 also have a sequence, an ordering, and a distance from each other that can be maintained in n-dimensional space 102. The sub-string correlithm objects 1206 of string correlithm object 602 described herein are particular embodiments of correlithm objects 104 described above.

In particular, just like the analog data values 1.0, 2.0, 3.0, and 4.0 have an ordered sequence as real-world data values 326, the sub-string correlithm objects 1206a, 1206b, 1206c, and 1206d have an ordered sequence and distance relationship to each other in n-dimensional space 102. For example, just like the analog data value 1.0 precedes but is closer to 2.0 than 3.0, so too does the sub-string correlithm object 1206a precede but is closer to the sub-string correlithm object 1206b than the sub-string correlithm object 1206c in n-dimensional space 102. Similarly, just like the analog data value 2.0 is equidistant to but in between 1.0 and 3.0, so too is the sub-string correlithm object 1206b equidistant to but in between the sub-string correlithm objects 1206a and 1206c in n-dimensional space 102. Although a sequential ordering of numbers is used to provide an example of analog data values in the real world that has a sequence, an ordering, and a distance relationship to each other, one of skill in the art will appreciate that any data with those characteristics in the real world can be represented by sub-string correlithm objects 1206 to maintain those relationships in n-dimensional space 102. For example, actor table 310 may map the sub-string correlithm objects 1206a-d to an ordered sequence of letters in the alphabet, such as letters "A," "B," "C," and "D". In another example, actor table 310 may map the sub-string correlithm objects 1206a-d to an ordered sequence of digital data values, such as the binary digits "1," "0," "0," "1".

Actor 306 serves as an interface that allows a user device 100 to convert correlithm objects 104 in the correlithm object domain back to real world values 326 or data samples. Actor 306 enables the user device 100 to convert from correlithm objects 104 into any suitable type of real world value. Actor 306 is configured to receive a correlithm object 104 (e.g. an output correlithm object 104 from a node 304), to determine a real-world output value 326 based on the received correlithm object 104, and to output the real-world output value 326. In particular, actor 306 receives an input correlithm object 104 and compares it with the sub-string correlithm objects 1206 to identify the particular sub-string correlithm object 1206 that is closest in n-dimensional space 102 to input correlithm object 104. For example, node 304 determines the distances in n-dimensional space 102 between input correlithm object 104 and each of the sub-string correlithm objects 1206. In one embodiment, these distances may be determined by calculating Hamming distances between input correlithm object 104 and each of the sub-string correlithm objects 1206. In another embodiment, these distances may be determined by calculating the anti-Hamming distances between input correlithm object 104 and each of the sub-string correlithm objects 1206.

The Hamming distance may be determined based on the number of bits that differ between the binary string representing input correlithm object 104 and each of the binary strings representing each of the sub-string correlithm objects 1206a-d. The anti-Hamming distance may be determined based on the number of bits that are the same between the binary string representing input correlithm object 104 and each of the binary strings representing each of the sub-string correlithm objects 1206a-d. In still other embodiments, the distances in n-dimensional space between input correlithm object 104 and each of the correlithm objects 1206a-d may be determined using a Minkowski distance or a Euclidean distance.

Upon calculating the n-dimensional distances between input correlithm object 104 and the sub-string correlithm objects 1206a-d using one of the techniques described above, actor 306 determines which calculated n-dimensional distance is the shortest. This is because the sub-string correlithm object 1206 having the shortest n-dimensional distance between it and input correlithm object 104 received by actor 306 can be thought of as being the most statistically similar match. Actor 306 identifies the data value that corresponds to the sub-string correlithm object 1206 that was determined to have the shortest n-dimensional distance between it and input correlithm object 104, and outputs this data value as real-world data value 326. For example, if actor 306 determined that sub-string correlithm object 1206c had the shortest n-dimensional distance between it and input correlithm object 104, actor 306 would output the value 3.0 as the real-world data value 326.

In a particular embodiment, actor 306 does not necessarily calculate the n-dimensional distance between the input correlithm object 104 and each sub-string correlithm object 1206 stored in actor table 310. Instead, actor 306 can take advantage of the fact that the sub-string correlithm objects 1206a-d follow an ordered sequence to determine when further comparisons of input correlithm object 104 with sub-string correlithm objects 1206 are no longer needed in order to find the sub-string correlithm object 1206 with the shortest n-dimensional distance. An example operation will be described to illustrate this concept. Assume that actor 306 receives an input correlithm object 104. Actor 306 compares the input correlithm object 104 with the first sub-string correlithm object 1206 stored in actor table 310, which in this example is sub-string correlithm object 1206a. Assume that actor 306 determines a first Hamming distance for this comparison. Next, actor 306 compares the input correlithm object 104 with the second sub-string correlithm object 1206 stored in actor table 310, which in this example is sub-string correlithm object 1206b. Assume that actor 306 determines a second Hamming distance which is smaller than the first Hamming distance, indicating that second sub-string correlithm object 1206b has a shorter n-dimensional distance between it and input correlithm object 104 than first sub-string correlithm object 1206a. Next, actor 306 compares the input correlithm object 104 with the third sub-string correlithm object 1206c. Assume that actor 306 determines a third Hamming distance which is larger than the second Hamming distance, indicating that third sub-string correlithm object 1206c has a larger n-dimensional distance between it and input correlithm object 104 than second sub-string correlithm object 1206b. At this point, actor 306 can conclude that because sub-string correlithm objects 1206 follow an ordered sequence, any further comparisons of input correlithm object 104 with sub-string correlithm objects 1206 will only produce n-dimensional distances that are larger than the second Hamming distance. In other words, actor 306 determined an inflection point in the determination of n-dimensional distances when it proceeded from second sub-string correlithm object 1206b to third sub-string correlithm object 1206c (i.e., the second n-dimensional distance was shorter than the first n-dimensional distance, but the third n-dimensional distance was larger than the second n-dimensional distance, thereby indicating an inflection point). Accordingly, actor 306 determines that the second sub-string correlithm object 1206b has the shortest n-dimensional distance between it and input correlithm object 104. In other words, second sub-string correlithm object 1206b is the most statistically similar match to input correlithm object 104. In this embodiment, there was no need to determine the n-dimensional distance between input correlithm object 104 and fourth sub-string correlithm object 1206d. Thus, actor 306 did not perform any further calculations of n-dimensional distances beyond the third n-dimensional distance calculation in this example, and thereby saved time, memory, and processing resources.

Although this particular example was detailed with respect to starting by comparing the input correlithm object 104 and the first sub-string correlithm object 1206a, and then calculating n-dimensional distances with input correlithm object 104 sequentially through the remainder of the sub-string correlithm objects 1206, it should be understood that actor 306 could start by comparing input correlithm object 104 and the last sub-string correlithm object 1206d and then calculating n-dimensional distances with input correlithm object 104 sequentially in the opposite direction through the remainder of the sub-string correlithm objects 1206c-a. In still other examples, actor 306 could start by comparing input correlithm object 104 with the sub-string correlithm objects 1206 at either end of the actor table 310 and then calculating n-dimensional distances with input correlithm object 104 sequentially toward the middle of the sub-string correlithm objects 1206 until the n-dimensional distance determination between input correlithm object 104 and any particular sub-string correlithm object 1206 reverses the trend of n-dimensional distances getting smaller (e.g., determined Hamming distances between input correlithm object 104 and each successive sub-string correlithm object 1206 that were getting smaller suddenly get larger, that is, hit an inflection point) or getting larger (e.g., determined Hamming distances between input correlithm object 104 and each successive sub-string correlithm object 1206 that were getting larger suddenly get smaller, that is, hit an inflection point). In still another example, actor 306 could start by comparing input correlithm object 104 with the sub-string correlithm object 1206 at or near the middle of the list of sub-string correlithm objects 1206 in actor table 310 and then calculating n-dimensional distances with input correlithm object 104 sequentially outward in both directions until the n-dimensional distance determination between input correlithm object 104 and any particular sub-string correlithm object 1206 reverses the trend of n-dimensional distances getting smaller (e.g., determined Hamming distances between input correlithm object 104 and each successive sub-string correlithm object 1206 that were getting smaller suddenly get larger, that is, hit an inflection point) or getting larger (e.g., determined Hamming distances between input correlithm object 104 and each successive sub-string correlithm object 1206 that were getting larger suddenly get smaller, that is, hit an inflection point).

In a particular embodiment, actor 306 may use only a subset of the bits of a binary string that forms the input correlithm object 104 and the binary strings that form the sub-string correlithm objects 1206 to perform the n-dimensional distance calculation. For example, if the input correlithm object 104 and the sub-string correlithm objects 1206 each comprise 256-bit binary strings, then actor 306 may compare only a particular subset of bits of input correlithm object 104 (e.g., the first 64 bits) with a corresponding subset of bits of the sub-string correlithm objects 1206 (e.g., the first 64 bits) to determine n-dimensional distances and identify the shortest n-dimensional distance, as described above. This embodiment allows a 64-bit processor to more readily perform the operations involved with determining n-dimensional distances, and thereby saves time, memory, and processing resources while still identifying a statistically significant result.

Figure 21:
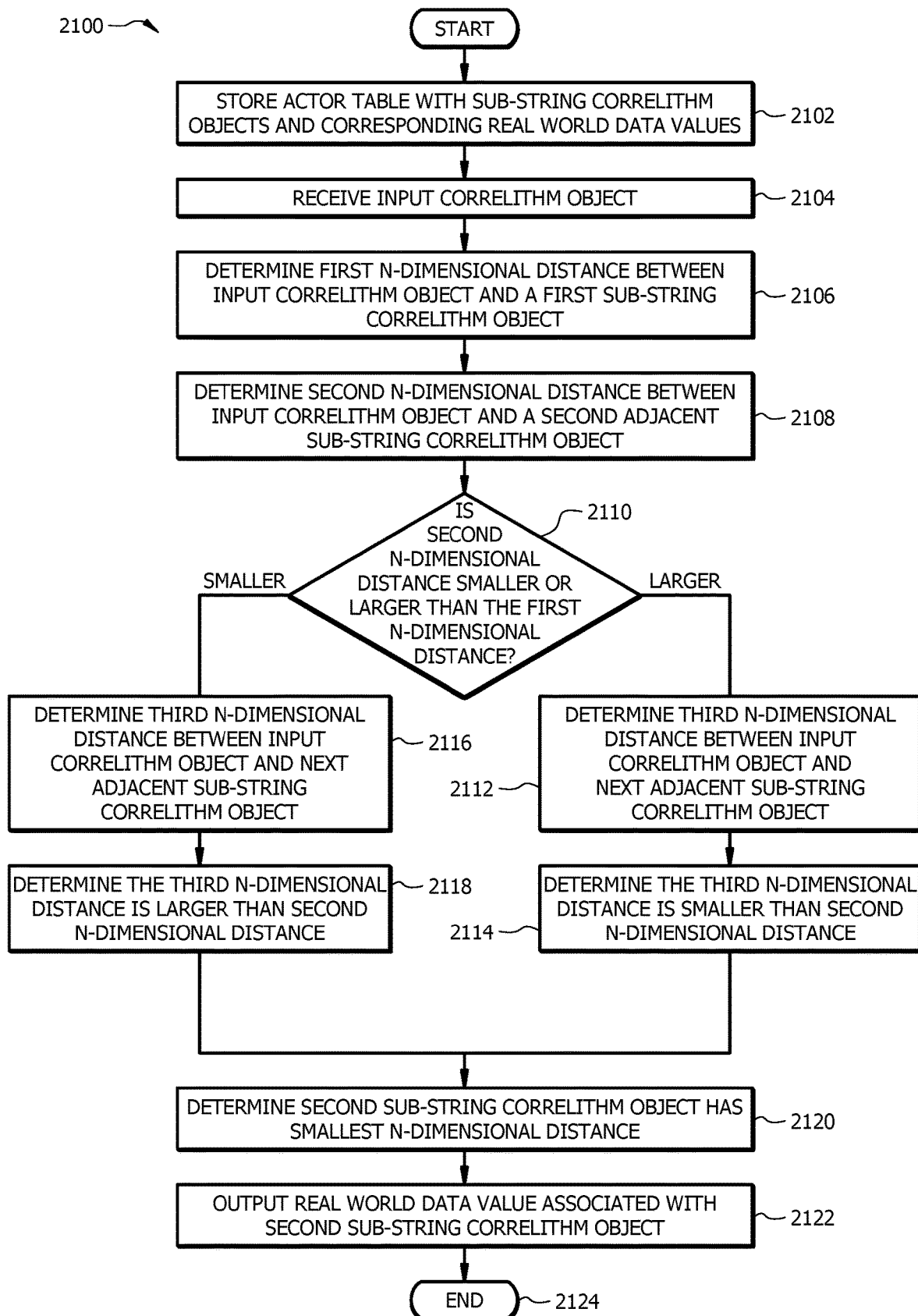
FIG. 21 is an embodiment of a process for mapping sub-string correlithm objects of a string correlithm object to analog or discrete data values.

FIG. 21 is a flowchart of an embodiment of a process 2100 for comparing an input correlithm object 104 with sub-string correlithm objects 1206 in an actor table 310, identifying the sub-string correlithm object 1206 with the smallest n-dimensional distance to the input correlithm object 104 and outputting a real-world data value 326 corresponding to the identified sub-string correlithm object 1206. At step 2102, actor 306 stores an actor table 310 that includes a plurality of sub-string correlithm objects 1206 and corresponding real-world data values 326. Actor 306 receives input correlithm object 104 at step 2104. At step 2106, actor 306 determines a first n-dimensional distance between input correlithm object 104 and a first sub-string correlithm object 1206 in actor table 310. Execution proceeds to step 2108 where actor 306 determines a second n-dimensional distance between input correlithm object 104 and a second sub-string correlithm object 1206 that is adjacent to the first sub-string correlithm object 1206 used in step 2106. Execution proceeds to step 2110, where actor 306 determines whether the second n-dimensional distance determined at step 2108 is smaller or larger than the first n-dimensional distance determined at step 2106.

If the second n-dimensional distance is larger than the first n-dimensional distance, execution proceeds to step 2112 where actor 306 determines a third n-dimensional distance between input correlithm object 104 and a third sub-string correlithm object 1206 adjacent to the second sub-string correlithm object 1206. At step 2114, actor 306 determines that the third n-dimensional distance determined at step 2112 is smaller than the second n-dimensional distance determined at step 2108. Accordingly, at step 2120, actor 306 determines that second sub-string correlithm object 1206 has the smallest n-dimensional distance to input correlithm object 104. Actor 306 outputs the real-world data value 326 associated with second sub-string correlithm object 1206 at step 2122.

If the second n-dimensional distance is smaller than the first n-dimensional distance, as determined at step 2110, execution proceeds to step 2116 where actor 306 determines a third n-dimensional distance between input correlithm object 104 and a third sub-string correlithm object 1206 adjacent to the second sub-string correlithm object 1206. At step 2118, actor 306 determines that the third n-dimensional distance determined at step 2112 is larger than the second n-dimensional distance determined at step 2108. Accordingly, at step 2120, actor 306 determines that second sub-string correlithm object 1206 has the smallest n-dimensional distance to input correlithm object 104. Actor 306 outputs the real-world data value 326 associated with second sub-string correlithm object 1206 at step 2122. Execution terminates at step 2124. FIG. 22 illustrates one embodiment of a correlithm object processing system 2200, including an integrator node engine 2201 that receives an input correlithm object 2202 and a feedback correlithm object 2204, and outputs an output correlithm object 2206 using an integrator value table 2208 (illustrated in FIG. 23) stored in memory 504. The integrator node engine 2201 emulates an integration circuit in correlithm object processing system 2200. The output of integrator node engine 2201 is the integration of the values represented by the input correlithm objects 2202 with respect to time. For example, where the input correlithm objects 2202 represent voltage values, the output of the integrator node engine 2201 is the integration of the voltage values over time. Each of input correlithm objects 2202, feedback correlithm objects 2204, and output correlithm objects 2206 comprise correlithm objects 104 as illustrated and described, for example, with respect to FIGS. 1 to 5. In particular, each of input correlithm objects 2202, feedback correlithm objects 2204, and output correlithm objects 2206 comprises n-bit digital words of binary values, as described, for example, with respect to at least FIGS. 1-5.

In a particular embodiment, integrator node engine 2201 receives a string of input correlithm objects 2202 that are arranged in a string correlithm object 2210 and outputs a string of output correlithm objects 2206 that are arranged in a string correlithm object 2212. For example, the string correlithm object 2210 comprises a first sub-string correlithm object 2210a that corresponds to a first input correlithm object 2202 received at a first time, a second sub-string correlithm object 2210b that corresponds to a second input correlithm object 2202 received at a second time, and a third sub-string correlithm object 2210c that corresponds to a third input correlithm object 2202 received at a third time. In this embodiment, the string correlithm object 2212 comprises a first sub-string correlithm object 2212a that corresponds to a first output correlithm object 2206, a second sub-string correlithm object 2212b that corresponds to a second output correlithm object 2206, a third sub-string correlithm object 2212c that corresponds to a third output correlithm object 2206, and a fourth sub-string correlithm object 2212d that corresponds to a fourth output correlithm object 2206. The first sub-string correlithm object 2212a represents an initial output value of the integrator node engine 2200 at the outset of operation. In this embodiment, the initial output value comprises zero. The second sub-string correlithm object 2212b represents the integration of the string correlithm object 2210 over a first time period. The third sub-string correlithm object 2212c represents the integration of the string correlithm object 2210 over a second time period. The fourth sub-string correlithm object 2212d represents the integration of the string correlithm object 2210 over a third time period.

Figure 23:
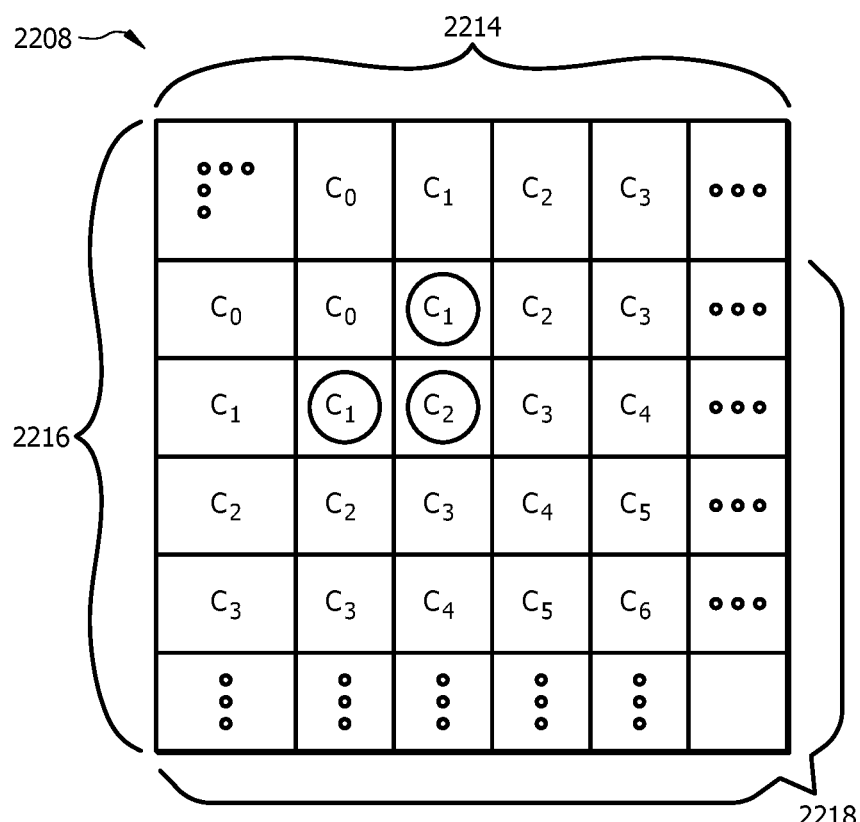
FIG. 23 is an embodiment of an integrator value table used by the integrator node engine of FIG. 22.

Referring to FIG. 23, one embodiment of an integrator value table 2208 is illustrated with columns and rows. The columns of table 2208 comprise input values represented by first correlithm objects 2214. The rows of table 2208 comprise feedback values represented by second correlithm objects 2216. The intersections of input values and feedback values comprise output values represented by third correlithm objects 2218. For ease of understanding, the notation used to identify a correlithm object indicates the value that it represents (e.g., $C_1$ used to represent value 1; $C_2$ used to represent value 2; and so forth). The first correlithm objects 2214, second correlithm objects 2216, and third correlithm objects 2218 comprise correlithm objects 104 as illustrated and described, for example, with respect to FIGS. 1-5. Each output value represented by a third correlithm object 2218 in integrator value table 2208 is the sum of a corresponding input value and a corresponding feedback value. For example, the intersection of first correlithm object 2214 ($C_1$) and second correlithm object 2216 ($C_0$) is a third correlithm object 2218 ($C_1$)(e.g., 1+0=1). In another example, the intersection of first correlithm object 2214 ($C_0$) and second correlithm object 2216 ($C_1$) is a third correlithm object 2218 ($C_1$)(e.g., 0+1=1). In still another example, the intersection of first correlithm object 2214 ($C_1$) and second correlithm object 2216 ($C_1$) is a third correlithm object 2218 ($C_2$) (e.g., 1+1=2). Referring back to FIG. 22, the integrator node engine 2201 uses integrator value table 2208 to determine output correlithm object 2206 based on input correlithm object 2202 and feedback correlithm object 2204, as described below.

An example operation of integrator node engine 2201 is described with respect to input correlithm objects 2202 arranged in string correlithm object 2210 and output correlithm objects 2206 arranged in string correlithm object 2212. Note that correlithm object processing system 2200 may operate with input correlithm objects 2202 and output correlithm objects 2206 that are not organized as string correlithm objects. In this example, integrator node engine 2201 initially outputs an output correlithm object 2206 that represents a zero value. This output correlithm object 2206 is the first sub-string correlithm object 2212a of string correlithm object 2212. Node 2201 then receives a first input correlithm object 2202 (e.g., $C_1$ representing the value "1") as sub-string correlithm object 2210a at a first time. At the outset of operation, node engine 2201 receives a feedback correlithm object 2204 (e.g., $C_0$ representing the value "0") that corresponds to the initial output correlithm object 2206 (e.g., zero value). The first input correlithm object 2202 (e.g., $C_1$) is identified in the second column of table 2208 illustrated in FIG. 23, and first feedback correlithm object 2204 (e.g., $C_0$) is identified in first row of table 2208 illustrated in FIG. 23. Node 2201 determines an output correlithm object 2218 (e.g., $C_1$) based on the intersection of first input correlithm object 2204 (e.g., $C_1$) and first feedback correlithm object 2204 (e.g., $C_0$) in table 2208. The output correlithm object 2218 (e.g., $C_1$) is the second sub-string correlithm object 2212b of string correlithm object 2212, which represents the integration of the input correlithm objects 2202 over a first time period.

Node 2201 then receives a second input correlithm object 2202 (e.g., $C_0$ representing the value "0") as sub-string correlithm object 2210b at a second time. At this point of operation, node engine 2201 receives a feedback correlithm object 2204 (e.g., $C_1$ representing the value "1") that corresponds to the output correlithm object 2206 (e.g., "1") at that time. The second input correlithm object 2202 (e.g., $C_0$) is identified in the first column of table 2208 illustrated in FIG. 23, and the feedback correlithm object 2204 (e.g., $C_1$) is identified in the second row of table 2208 illustrated in FIG. 23. Node 2201 determines an output correlithm object 2218 (e.g., $C_1$) based on the intersection of second input correlithm object 2204 (e.g., $C_0$) and feedback correlithm object 2204 (e.g., $C_1$) in table 2208. The output correlithm object 2218 (e.g., $C_1$) is the third sub-string correlithm object 2212c of string correlithm object 2212, which represents the integration of the input correlithm objects 2202 over a second time period.

Node 2201 then receives a third input correlithm object 2202 (e.g., $C_1$ representing the value "1") as sub-string correlithm object 2210c at a third time. At this point of operation, node engine 2201 receives a feedback correlithm object 2204 (e.g., $C_1$ representing the value "1") that corresponds to the output correlithm object 2206 (e.g., "1") at that time. The third input correlithm object 2202 (e.g., $C_1$) is identified in the second column of table 2208 illustrated in FIG. 23, and the feedback correlithm object 2204 (e.g., $C_1$) is identified in the second row of table 2208 illustrated in FIG. 23. Node 2201 determines an output correlithm object 2218 (e.g., $C_2$) based on the intersection of third input correlithm object 2204 (e.g., $C_1$) and feedback correlithm object 2204 (e.g., $C_1$) in table 2208. The output correlithm object 2218 (e.g., $C_2$) is the fourth sub-string correlithm object 2212d of string correlithm object 2212, which represents the integration of the input correlithm objects 2202 over a third time period.

In a particular embodiment, node engine 2201 determines the Hamming distance (or otherwise determines the distance in n-dimensional space) between input correlithm object 2202 and the first correlithm objects 2214 of integrator value table 2208, and between the feedback correlithm object 2204 and the second correlithm objects 2216 of integrator value table 2208. Even if noise modifies some of the bits of the n-bit input correlithm object 2202 and/or some of the bits of the n-bit correlithm objects 2214 representing the input values in table 2208, the smallest determined Hamming distance between the input correlithm object 2202 and the first correlithm objects 2214 will identify the appropriate entry for table 2208. Similarly, node engine 2201 determines the Hamming distance (or otherwise determines the distance in n-dimensional space) between feedback correlithm object 2204 and the second correlithm objects 2216 of integrator value table 2208. Even if noise modifies some of the bits of the n-bit feedback correlithm object 2204 and/or some of the bits of the n-bit correlithm objects 2216 representing the feedback values in table 2208, the smallest determined Hamming distance between the feedback correlithm object 2204 and the second correlithm objects 2216 will identify the appropriate entry for table 2208.

FIG. 24 illustrates one embodiment of a correlithm object processing system 2400, including a differentiator node engine 2401 that receives an input correlithm object 2402, stores a previous value correlithm object 2404, and outputs an output correlithm object 2406 using a differentiator value table 2408 (illustrated in FIG. 25) stored in memory 504. The differentiator node engine 2401 emulates a differentiator circuit in correlithm object processing system 2400. The output of differentiator node engine 2401 is the differentiation of the values represented by the input correlithm objects 2402 with respect to time. For example, where the input correlithm objects 2402 represent voltage values, the output of the differentiator node engine 2401 is the differentiation of the voltage values over time. Each of input correlithm objects 2402, previous value correlithm objects 2404, and output correlithm objects 2406 comprise correlithm objects 104 as illustrated and described, for example, with respect to FIGS. 1 to 5. In particular, each of input correlithm objects 2402, previous value correlithm objects 2404, and output correlithm objects 2406 comprise n-bit digital words of binary values, as described, for example, with respect to at least FIGS. 1-5.

In a particular embodiment, differentiator node engine 2401 receives a series of input correlithm objects 2402 that are arranged in a string correlithm object 2410 and outputs a series of output correlithm objects 2406 that are arranged in a string correlithm object 2412. For example, in one embodiment, the string correlithm object 2410 comprises a first sub-string correlithm object 2410a that corresponds to a first input correlithm object 2402 received at a first time, a second sub-string correlithm object 2410b that corresponds to a second input correlithm object 2402 received at a second time, a third sub-string correlithm object 2410b that corresponds to a third input correlithm object 2402 received at a third time, a fourth sub-string correlithm object 2410d that corresponds to a fourth input correlithm object 2402 received at a fourth time, and a fifth sub-string correlithm object 2410e that corresponds to a fifth input correlithm object 2402 received at a fifth time.

The previous value correlithm objects 2404 are associated with the input correlithm objects 2402. In particular, when differentiator node engine 2401 receives second sub-string correlithm object 2410b (e.g., "1") after previously receiving first sub-string correlithm object 2410a (e.g., "0"), then previous value correlithm object 2404a has a value that is equal to the first sub-string correlithm object 2410a (e.g., "0") because it was the "previous" value of the input correlithm object 2402. Similarly, when differentiator node engine 2401 receives third sub-string correlithm object 2410c (e.g., "2") after previously receiving second sub-string correlithm object 2410b (e.g., "1"), then previous value correlithm object 2404b has a value that is equal to the second sub-string correlithm object 2410b (e.g., "1") because it was the "previous" value of the input correlithm object 2402. Furthermore, when differentiator node engine 2401 receives fourth sub-string correlithm object 2410d (e.g., "1") after previously receiving third sub-string correlithm object 2410c (e.g., "2"), then previous value correlithm object 2404c has a value that is equal to the third sub-string correlithm object 2410c (e.g., "2") because it was the "previous" value of the input correlithm object 2402. Finally, when differentiator node engine 2401 receives fifth sub-string correlithm object 2410e (e.g., "0") after previously receiving fourth sub-string correlithm object 2410d (e.g., "1"), then previous value correlithm object 2404d has a value that is equal to the fourth sub-string correlithm object 2410d (e.g., "1") because it was the "previous" value of the input correlithm object 2402.

In this embodiment, the string correlithm object 2412 comprises a first sub-string correlithm object 2412a that corresponds to a first output correlithm object 2406, a second sub-string correlithm object 2412b that corresponds to a second output correlithm object 2406, a third sub-string correlithm object 2412c that corresponds to a third output correlithm object 2406, a fourth sub-string correlithm object 2412d that corresponds to a fourth output correlithm object 2406, and a fifth sub-string correlithm object 2412e that corresponds to a fifth output correlithm object 2406. The second sub-string correlithm object 2412b represents the differentiation of the string correlithm object 2410 over a first time period. The third sub-string correlithm object 2412c represents the differentiation of the string correlithm object 2410 over a second time period. The fourth sub-string correlithm object 2412d represents the differentiation of the string correlithm object 2410 over a third time period. The fifth sub-string correlithm object 2412e represents the differentiation of the string correlithm object 2410 over a fourth time period.

Figure 25:
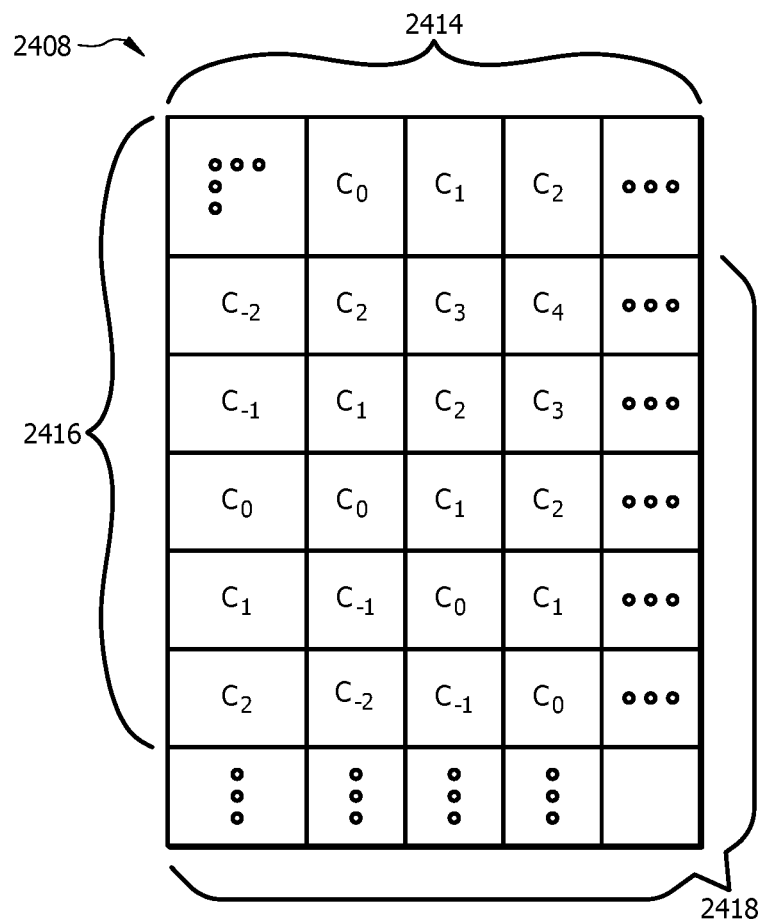
FIG. 25 is an embodiment of a differentiator value table used by the differentiator node of FIG. 24.

Referring to FIG. 25, one embodiment of a differentiator value table 2408 is illustrated with columns and rows. The columns of table 2408 comprise input values represented by first correlithm objects 2414. The rows of table 2408 comprise previous values represented by second correlithm objects 2416. The intersections of input values and previous values comprise output values represented by third correlithm objects 2418. For ease of understanding, the notation used to identify a correlithm object indicates the value that it represents (e.g., $C_1$ used to represent value 1; $C_2$ used to represent value 2; and so forth). The first correlithm objects 2414, second correlithm objects 2416, and third correlithm objects 2418 comprise correlithm objects 104 as illustrated and described, for example, with respect to FIGS. 1-5. Each output value represented by a third correlithm object 2418 in differentiator value table 2408 is the difference of a corresponding input value and a corresponding previous value. For example, the intersection of first correlithm object 2414 ($C_1$) and second correlithm object 2416 ($C_0$) is a third correlithm object 2418 ($C_1$) (e.g., 1–0=1). In another example, the intersection of first correlithm object 2414 ($C_2$) and second correlithm object 2416 ($C_1$) is a third correlithm object 2418 ($C_1$)(e.g., 2–1=1). In still another example, the intersection of first correlithm object 2414 ($C_1$) and second correlithm object 2416 ($C_2$) is a third correlithm object 2418 ($C_{-1}$)(e.g., 1–2=–1). Referring back to FIG. 24, the differentiator node engine 2401 uses differentiator value table 2408 to determine output correlithm object 2406 based on input correlithm object 2402 and previous value correlithm object 2404, as described below.

An example operation of differentiator node engine 2401 is described with respect to input correlithm object 2402 arranged in string correlithm object 2410, previous value correlithm objects 2404a-d, and output correlithm objects 2406 arranged in string correlithm object 2412. Note that correlithm object processing system 2400 may operate with input correlithm objects 2202 and output correlithm objects 2206 that are not organized as string correlithm objects. In this example, integrator node engine 2401 initially outputs an output correlithm object 2406 that represents a zero value. This output correlithm object 2406 is the first sub-string correlithm object 2412a of string correlithm object 2412 and simply represents the value of the first sub-string correlithm object 2410a.

Node 2401 then receives a second input correlithm object 2402 as second sub-string correlithm object 2410b (e.g., $C_1$ representing the value "1"). Node 2401 stores a first previous value correlithm object 2404a that represents the value of the first sub-string correlithm object 2410a (e.g., $C_0$ representing the value "0"). The second input correlithm object 2402 (e.g., $C_1$) is identified in the second column of table 2408 illustrated in FIG. 25, and first previous value correlithm object 2404a (e.g., $C_0$) is identified in third row of table 2408 illustrated in FIG. 25. Node 2401 determines an output correlithm object 2418 (e.g., $C_1$) based on the intersection of first input correlithm object 2404 (e.g., $C_1$) and first previous value correlithm object 2404a (e.g., $C_0$) in table 2408. The output correlithm object 2418 (e.g., $C_1$) is the second sub-string correlithm object 2412b of string correlithm object 2412, which represents the differentiation of the input correlithm objects 2402 over a first time period. In this example, the second sub-string correlithm object 2412b represents a value of "1" which is the difference between the value of the second sub-string correlithm object 2410b (e.g., "1") and the first previous value correlithm object 2404a (e.g., "0").

Node 2401 then receives a third input correlithm object 2402 as third sub-string correlithm object 2410c (e.g., $C_2$ representing the value "2"). Node 2401 stores a second previous value correlithm object 2404b that represents the value of the second sub-string correlithm object 2410b (e.g., $C_1$ representing the value "1"). The third input correlithm object 2402 (e.g., $C_2$) is identified in the third column of table 2408 illustrated in FIG. 25, and the second previous correlithm object 2404b (e.g., $C_1$) is identified in the fourth row of table 2408 illustrated in FIG. 25. Node 2401 determines an output correlithm object 2418 (e.g., $C_1$) based on the intersection of third input correlithm object 2404 (e.g., $C_2$) and second previous value correlithm object 2404b (e.g., $C_1$) in table 2408. The output correlithm object 2418 (e.g., $C_1$) is the third sub-string correlithm object 2412c of string correlithm object 2412, which represents the differentiation of the input correlithm objects 2402 over a second time period. In this example, the third sub-string correlithm object 2412c represents a value of "1" which is the difference between the value of the third sub-string correlithm object 2410c (e.g., "2") and the second previous value correlithm object 2404b (e.g., "1").

Node 2401 then receives a fourth input correlithm object 2402 as fourth sub-string correlithm object 2410d (e.g., $C_1$ representing the value "1"). Node 2401 stores a third previous value correlithm object 2404c that represents the value of the third sub-string correlithm object 2410c (e.g., $C_2$ representing the value "2"). The fourth input correlithm object 2402 (e.g., $C_1$) is identified in the second column of table 2408 illustrated in FIG. 25, and the third previous correlithm object 2404c (e.g., $C_2$) is identified in the fifth row of table 2408 illustrated in FIG. 25. Node 2401 determines an output correlithm object 2418 (e.g., $C_{-1}$) based on the intersection of fourth input correlithm object 2404 (e.g., $C_1$) and third previous value correlithm object 2404c (e.g., $C_2$) in table 2408. The output correlithm object 2418 (e.g., $C_{-1}$) is the fourth sub-string correlithm object 2412d of string correlithm object 2412, which represents the differentiation of the input correlithm objects 2402 over a third time period. In this example, the fourth sub-string correlithm object 2412d represents a value of "–1" which is the difference between the value of the fourth sub-string correlithm object 2410d (e.g., "1") and the third previous value correlithm object 2404c (e.g., "2").

Node 2401 then receives a fifth input correlithm object 2402 as fifth sub-string correlithm object 2410e (e.g., $C_0$ representing the value "0"). Node 2401 stores a fourth previous value correlithm object 2404d that represents the value of the fourth sub-string correlithm object 2410d (e.g., $C_1$ representing the value "1"). The fifth input correlithm object 2402 (e.g., $C_0$) is identified in the first column of table 2408 illustrated in FIG. 25, and the fourth previous correlithm object 2404d (e.g., $C_1$) is identified in the fourth row of table 2408 illustrated in FIG. 25. Node 2401 determines an output correlithm object 2418 (e.g., $C_{-1}$) based on the intersection of fifth input correlithm object 2404 (e.g., $C_0$) and fourth previous value correlithm object 2404d (e.g., $C_1$) in table 2408. The output correlithm object 2418 (e.g., $C_{-1}$) is the fifth sub-string correlithm object 2412e of string correlithm object 2412, which represents the differentiation of the input correlithm objects 2402 over a fourth time period. In this example, the fifth sub-string correlithm object 2412e represents a value of "−1" which is the difference between the value of the fifth sub-string correlithm object 2410e (e.g., "0") and the fourth previous value correlithm object 2404d (e.g., "1").

In a particular embodiment, node engine 2401 determines the Hamming distance (or otherwise determines the distance in n-dimensional space) between input correlithm object 2402 and the first correlithm objects 2414 of differentiator value table 2408, and between the previous value correlithm object 2404 and the second correlithm objects 2416 of differentiator value table 2408. Even if noise modifies some of the bits of the n-bit input correlithm object 2402 and/or some of the bits of the n-bit correlithm objects 2414 representing the input values in table 2408, the smallest determined Hamming distance between the input correlithm object 2402 and the first correlithm objects 2414 will identify the appropriate entry for table 2408. Similarly, node engine 2401 determines the Hamming distance (or otherwise determines the distance in n-dimensional space) between previous value correlithm object 2404 and the second correlithm objects 2416 of differentiator value table 2408. Even if noise modifies some of the bits of the n-bit feedback correlithm object 2404 and/or some of the bits of the n-bit correlithm objects 2416 representing the previous values in table 2408, the smallest determined Hamming distance between the previous value correlithm object 2404 and the second correlithm objects 2416 will identify the appropriate entry for table 2408.

FIG. 26 illustrates one embodiment of a correlithm object processing system 2600, including a differential amplifier node engine 2601 that receives a first input correlithm object 2602 and a second input correlithm object 2604, identifies an amplifier value correlithm object 2605, and outputs an output correlithm object 2606 using a differential value table 2608 (illustrated in FIG. 27A) and an amplifier value table 2610 (illustrated in FIG. 27B) stored in memory 504. The differential amplifier node engine 2601 emulates a differential operational amplifier circuit in correlithm object processing system 2600. The output of differential amplifier node engine 2601 is the amplified difference between the values represented by the first input correlithm object 2602 and the second input correlithm object 2604. For example, where the first input correlithm object 2602 represents a first voltage, $V_1$, the second input correlithm object 2604 represents a second voltage, $V_2$, and the amplifier value correlithm object 2605 represents an amplification value, A, then the output correlithm object 2606 represents an output voltage, $V_{out}$, according to the following relationship: $V_{out}=A*(V_1-V_2)$. Each of first input correlithm object 2602, second input correlithm object 2604, amplifier value correlithm object 2605, and output correlithm object 2606 comprise correlithm objects 104 as illustrated and described, for example, with respect to FIGS. 1 to 5. In particular, each of first input correlithm object 2602, second input correlithm object 2604, amplifier value correlithm object 2605, and output correlithm object 2606 comprise n-bit digital words of binary values, as described, for example, with respect to at least FIGS. 1-5.

Figure 27A:
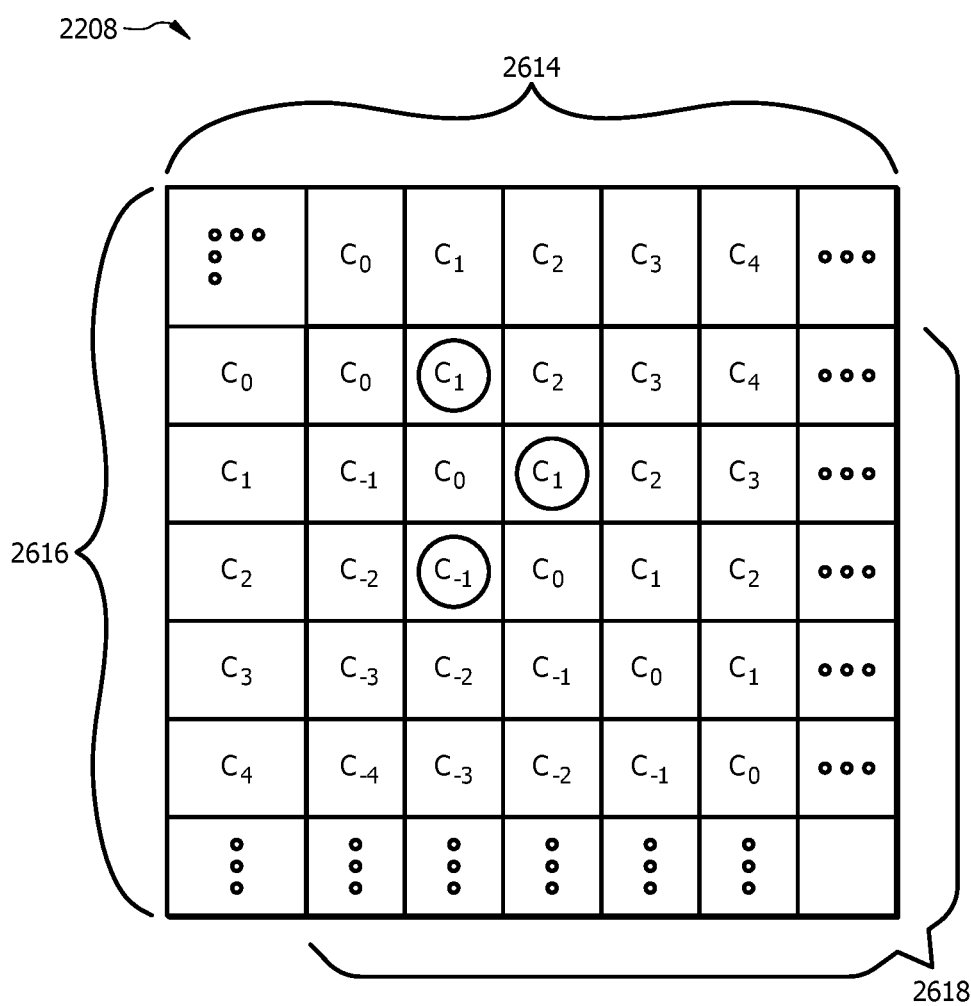
FIG. 27A is an embodiment of a differential value table used by the differential amplifier node engine of FIG. 26.

Referring to FIG. 27A, one embodiment of a differential value table 2608 is illustrated with columns and rows. The columns of table 2608 comprise first input values represented by first correlithm objects 2614. The rows of table 2608 comprise second input values represented by second correlithm objects 2616. The intersections of first input values and second input values comprise intermediate output values represented by third correlithm objects 2618. For ease of understanding, the notation used to identify a correlithm object indicates the value that it represents (e.g., $C_1$ used to represent value 1; $C_2$ used to represent value 2; and so forth). The first correlithm objects 2614, second correlithm objects 2616, and third correlithm objects 2618 comprise correlithm objects 104 as illustrated and described, for example, with respect to FIGS. 1-5. Each intermediate output value represented by a third correlithm object 2618 in differential value table 2608 is the difference of a corresponding first input value and a corresponding second input value. For example, the intersection of first correlithm object 2614 ($C_1$) and second correlithm object 2616 ($C_0$) is a third correlithm object 2418 ($C_1$) (e.g., 1−0=1). In another example, the intersection of first correlithm object 2614 ($C_2$) and second correlithm object 2616 ($C_1$) is a third correlithm object 2618 ($C_1$) (e.g., 2−1=1). In still another example, the intersection of first correlithm object 2614 ($C_1$) and second correlithm object 2616 ($C_2$) is a third correlithm object 2618 ($C_{-1}$) (e.g., 1−2=−1). Referring back to FIG. 26, the differential amplifier node engine 2601 uses differential value table 2608 in conjunction with amplifier value table 2610 described below, to determine output correlithm object 2606 based on first input correlithm object 2602, second input correlithm object 2604, and amplifier value correlithm object 2605.

Figure 27B:
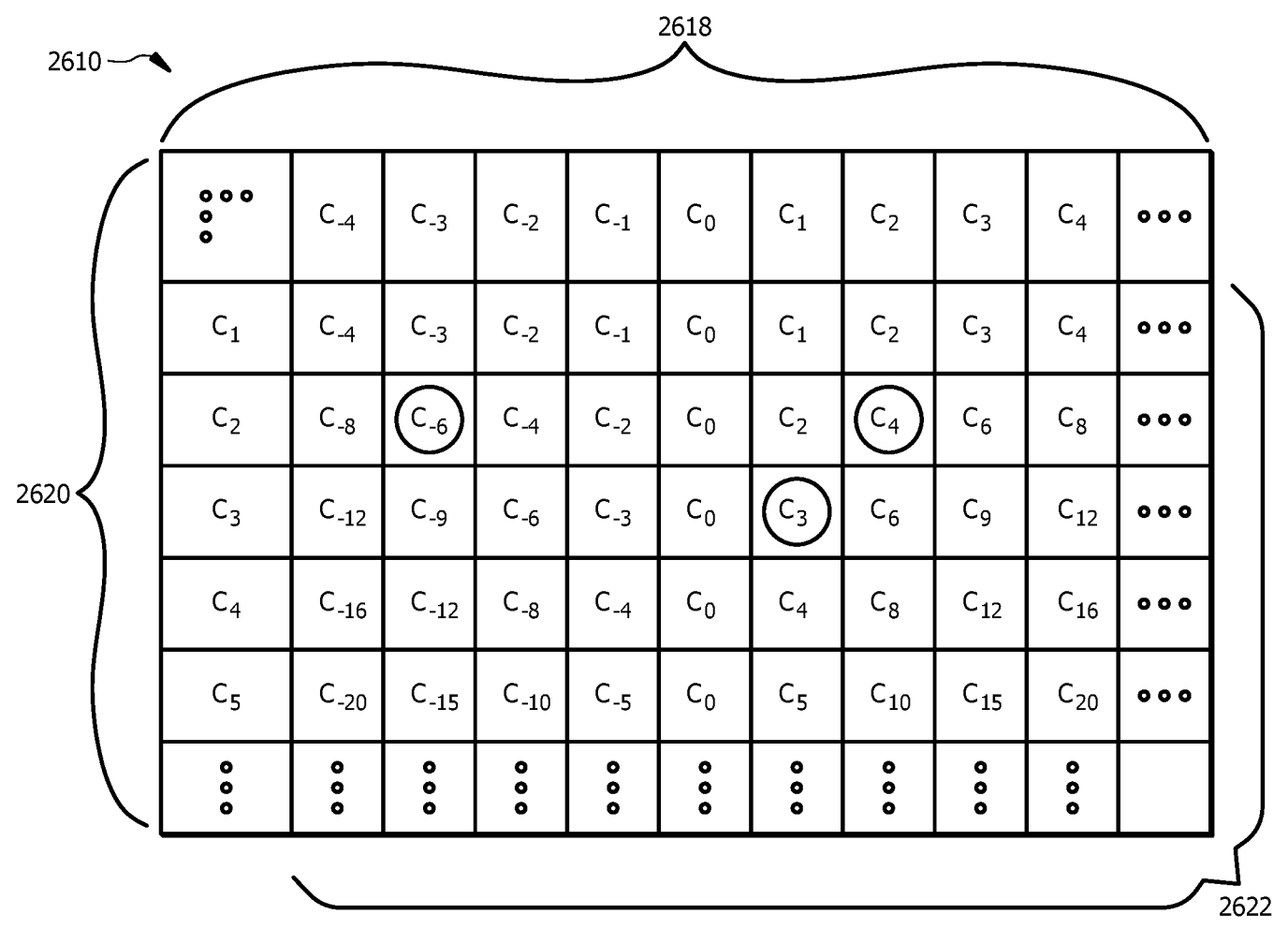

Referring to FIG. 27B, one embodiment of amplifier value table 2610 is illustrated with columns and rows. The columns of table 2610 comprise intermediate output values represented by third correlithm objects 2618. The rows of table 2610 comprise amplifier values represented by fourth correlithm objects 2620. The intersections of intermediate output values and amplifier values comprise output values represented by fifth correlithm objects 2622. For ease of understanding, the notation used to identify a correlithm object indicates the value that it represents (e.g., $C_1$ used to represent value 1; $C_2$ used to represent value 2; and so forth). The third correlithm objects 2618, fourth correlithm objects 2620, and fifth correlithm objects 2622 comprise correlithm objects 104 as illustrated and described, for example, with respect to FIGS. 1-5. Each output value represented by a fifth correlithm object 2622 in amplifier value table 2610 is the product of a corresponding intermediate output value and a corresponding amplifier value. For example, the intersection of third correlithm object 2618 ($C_2$) and fourth correlithm object 2620 ($C_2$) is a fifth correlithm object 2622 ($C_4$) (e.g., 2*2=4). In another example, the intersection of third correlithm object 2618 ($C_{-3}$) and fourth correlithm object 2620 ($C_2$) is a fifth correlithm object 2622 ($C_{-6}$) (e.g., −3*2=−6). In still another example, the intersection of third correlithm object 2618 ($C_{-3}$) and fourth correlithm object 2620 ($C_3$) is a fifth correlithm object 2622 ($C_3$) (e.g., 1*3=3). Referring back to FIG. 26, the differential amplifier node engine 2601 uses differential value table 2608 described above in conjunction with amplifier value table 2610 to determine output correlithm object 2606 based on first input correlithm object 2602, second input correlithm object 2604, and amplifier value correlithm object 2605.

An example operation of differential amplifier node engine 2601 is described with respect to example values. In this example, assume that differential amplifier node engine 2601 receives a first input correlithm object 2602 that represents a first input value (e.g., $C_2$ representing the first input value "2") and further receives a second correlithm object 2604 that represents a second input value (e.g., $C_1$ representing the second input value "1"). Further assume that this particular operation of differential amplifier node engine 2601 is associated with an amplifier value correlithm object 2605 representing a particular amplifier value (e.g., $C_3$ representing the amplifier value "3"). In one embodiment, the node engine 2601 receives an amplifier value correlithm object 2605 representing a particular amplifier value as an input. In other embodiments, the particular node engine 2601 may simply be assigned a particular amplifier value correlithm object 2605 representing a particular amplifier value.

Differential amplifier node engine 2601 identifies first input correlithm object 2602 in the third column of table 2608 illustrated in FIG. 27A (e.g., $C_2$ representing the first input value "2"). Differential amplifier node engine 2601 identifies second input correlithm object 2604 in the second row of table 2608 illustrated in FIG. 27A (e.g., $C_1$ representing the second input value "1"). Node engine 2601 determines a third correlithm object 2618 (e.g., $C_1$) based on the intersection of first correlithm object 2614 (e.g., $C_2$) and second correlithm object 2616 (e.g., $C_1$) in table 2608. Third correlithm object 2618 is associated with an intermediate output value that represents the difference between the first input value and the second input value (e.g., 2−1=1).

Differential amplifier node engine 2601 then uses the determined third correlithm object 2618 from differential value table 2608 in conjunction with the amplifier value correlithm object 2605 and the amplifier value table 2610 to determine output correlithm object 2606. In particular, differential amplifier node engine 2601 identifies third correlithm object 2618 in the sixth column of amplifier value table 2610 illustrated in FIG. 27B based on the third correlithm object 2618 determined from the differential value table 2608 (e.g., $C_1$). Node engine 2601 identifies a fourth correlithm object 2620 in the third row of amplifier value table 2610 (e.g., $C_3$) based on amplifier value correlithm object 2605. Node engine 2601 determines a fifth correlithm object 2622 (e.g., $C_3$) based on the intersection of third correlithm object 2618 (e.g., $C_1$) and fourth correlithm object 2620 (e.g., $C_3$) in table 2610. Fifth correlithm object 2622 represents the product between the intermediate output value represented by third correlithm object 2618 and the amplifier value represented by fourth correlithm object 2620 (e.g., 1*3=3). Node engine 2601 outputs the determined fifth correlithm object 2622 (e.g., $C_3$) as output correlithm object 2606, which represents the amplified difference between the first input correlithm object 2602 and the second input correlithm object 2604 (e.g., 3=3*(2−1)). In this manner, differential amplifier node engine 2601 emulates a differential amplifier circuit in a correlitm object processing system.

In a particular embodiment, node engine 2601 determines the Hamming distance (or otherwise determines the distance in n-dimensional space) between particular correlithm objects and corresponding entries of differential value table 2608. For example, node engine 2601 determines the Hamming distance (or otherwise determines the distance in n-dimensional space) between first input correlithm object 2602 and the first correlithm objects 2614 of differential value table 2608, and between the second input correlithm object 2604 and the second correlithm objects 2616 of differential value table 2608. Even if noise modifies some of the bits of the n-bit first input correlithm object 2602 and/or some of the bits of the n-bit correlithm objects 2614 representing the first input values in table 2608, the smallest determined Hamming distance between the first input correlithm object 2602 and the first correlithm objects 2614 will identify the appropriate entry for table 2608. Similarly, even if noise modifies some of the bits of the n-bit second input correlithm object 2604 and/or some of the bits of the n-bit correlithm objects 2616 representing the second input values in table 2608, the smallest determined Hamming distance between the second input correlithm object 2604 and the second correlithm objects 2616 will identify the appropriate entry for table 2608.

Relatedly, in one embodiment, node engine 2601 determines the Hamming distance (or otherwise determines the distance in n-dimensional space) between particular correlithm objects and corresponding entries of amplifier value table 2610. For example, node engine 2601 determines the Hamming distance (or otherwise determines the distance in n-dimensional space) between third correlithm object 2618 derived from differential value table 2608 and the third correlithm objects 2618 of amplifier value table 2610, and between the amplifier value correlithm object 2605 and the fourth correlithm objects 2620 of amplifier value table 2610. Even if noise modifies some of the bits of the n-bit third correlithm object 2618 derived from differential value table 2608 and/or some of the bits of the n-bit correlithm objects 2618 representing the intermediate output values in table 2610, the smallest determined Hamming distance between the third correlithm object 2618 derived from differential value table 2608 and the third correlithm objects 2618 of amplifier value table 2610 will identify the appropriate entry for table 2610. Similarly, even if noise modifies some of the bits of the n-bit amplifier value correlithm object 2605 and/or some of the bits of the n-bit correlithm objects 2620 representing the amplifier values in table 2610, the smallest determined Hamming distance between the amplifier value correlithm object 2605 and the fourth correlithm objects 2620 will identify the appropriate entry for table 2610.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

To aid the Patent Office, and any readers of any patent issued on this application in interpreting the claims appended hereto, applicants note that they do not intend any of the appended claims to invoke 35 U.S.C. § 112(f) as it exists on the date of filing hereof unless the words "means for" or "step for" are explicitly used in the particular claim.

The invention claimed is:
1. A device configured to emulate an integration circuit in a correlithm object processing system, comprising:
   a memory operable to store an integrator value table, the integrator value table comprising:
      a plurality of input values represented by first correlithm objects;

a plurality of feedback values represented by second correlithm objects; and a plurality of output values represented by third correlithm objects;

wherein each output value in the integrator value table is a sum of a corresponding input value and a corresponding feedback value; and a node engine communicatively coupled to the memory and configured to:

receive an input correlithm object;

receive a feedback correlithm object;

determine a first correlithm object in the integrator value table based on the input correlithm object;

determine a second correlithm object in the integrator value table based on the feedback correlithm object;

determine a third correlithm object from the integrator value table based on the determined first correlithm object and the determined second correlithm object; and output the third correlithm object as an output correlithm object.

2. The device of claim 1, wherein each of the correlithm objects comprises an n-bit digital word of binary values.

3. The device of claim 1, wherein:

the input correlithm object comprises a first input correlithm object;

the feedback correlithm object comprises a first feedback correlithm object;

the output correlithm object comprises a first output correlithm object;

the node engine is further configured to:

receive a second input correlithm object;

receive the first output correlithm object as a second feedback correlithm object;

determine a second first correlithm object in the integrator value table based on the second input correlithm object;

determine a second second correlithm object in the integrator value table based on the second feedback correlithm object;

determine a second third correlithm object from the integrator value table based on the determined second first correlithm object and the determined second second correlithm object; and output the second third correlithm object as a second output correlithm object.

4. The device of claim 3, wherein the first input correlithm object and the second input correlithm object comprise a string correlithm object.

5. The device of claim 3, wherein the first output correlithm object and the second output correlithm object comprise a string correlithm object.

6. The device of claim 1, wherein determining a first correlithm object in the integrator value table based on the input correlithm object comprises:

determining Hamming distances between the input correlithm object and the first correlithm objects in the integrator value table; and identifying the first correlithm object in the integrator value table associated with a smallest determined Hamming distance between the input correlithm object and the first correlithm objects in the integrator value table.

7. The device of claim 6, wherein determining a second correlithm object in the integrator value table based on the feedback correlithm object comprises:

determining Hamming distances between the feedback correlithm object and the second correlithm objects in the integrator value table; and identifying the second correlithm object in the integrator value table associated with the smallest determined Hamming distance between the feedback correlithm object and the second correlithm objects in the integrator value table.

8. The device of claim 7, wherein determining a third correlithm object in the integrator value table comprises determining a third correlithm object from the integrator value table based on the identified first correlithm object and the identified second correlithm object.

9. A method for emulating an integration circuit in a correlithm object processing system, comprising:

storing an integrator value table, the integrator value table comprising:

a plurality of input values represented by first correlithm objects;

a plurality of feedback values represented by second correlithm objects; and a plurality of output values represented by third correlithm objects;

wherein each output value in the integrator value table is a sum of a corresponding input value and a corresponding feedback value;

receiving an input correlithm object;

receiving a feedback correlithm object;

determining a first correlithm object in the integrator value table based on the input correlithm object;

determining a second correlithm object in the integrator value table based on the feedback correlithm object;

determining a third correlithm object from the integrator value table based on the determined input value and the determined feedback value; and outputting the third correlithm object as an output correlithm object.

10. The method of claim 9, wherein each of the correlithm objects comprises an n-bit digital word of binary values.

11. The method of claim 9, wherein:

the input correlithm object comprises a first input correlithm object;

the feedback correlithm object comprises a first feedback correlithm object;

the output correlithm object comprises a first output correlithm object;

the method further comprising:

receiving a second input correlithm object;

receiving the first output correlithm object as a second feedback correlithm object;

determining a second first correlithm object in the integrator value table based on the second input correlithm object;

determining a second second correlithm object in the integrator value table based on the second feedback correlithm object;

determining a second third correlithm object from the integrator value table based on the determined second first correlithm object and the determined second second correlithm object; and outputting the second third correlithm object as a second output correlithm object.

12. The method of claim 11, wherein the first input correlithm object and the second input correlithm object comprise a string correlithm object.

13. The method of claim 11, wherein the first output correlithm object and the second output correlithm object comprise a string correlithm object.

14. The method of claim 9, wherein determining a first correlithm object in the integrator value table based on the input correlithm object comprises:
  determining Hamming distances between the input correlithm object and the first correlithm objects in the integrator value table; and
  identifying the first correlithm object in the integrator value table associated with the smallest determined Hamming distance between the input correlithm object and the first correlithm objects in the integrator value table.

15. The method of claim 14, wherein determining a second correlithm object in the integrator value table based on the feedback correlithm object comprises:
  determining Hamming distances between the feedback correlithm object and the second correlithm objects in the integrator value table; and
  identifying the second correlithm object in the integrator value table associated with the smallest determined Hamming distance between the feedback correlithm object and the second correlithm objects in the integrator value table.

16. The method of claim 15, wherein determining a third correlithm object in the integrator value table comprises determining an output value from the integrator value table based on the identified first correlithm object and the identified second correlithm object.

17. A computer program comprising executable instructions stored in a non-transitory computer readable medium such that when executed by a processor causes the processor to emulate an integration circuit in a correlithm object processing system configured to:
  store an integrator value table, the integrator value table comprising:
    a plurality of input values represented by first correlithm objects;
    a plurality of feedback values represented by second correlithm objects; and
    a plurality of output values represented by third correlithm objects;
    wherein each output value in the integrator value table is a sum of a corresponding input value and a corresponding feedback value;
  receive an input correlithm object;
  receive a feedback correlithm object;
  determine a first correlithm object in the integrator value table based on the input correlithm object;
  determine a second correlithm object in the integrator value table based on the feedback correlithm object;
  determine a third correlithm object from the integrator value table based on the determined first correlithm object and the determined second correlithm object; and
  output the third correlithm object as an output correlithm object.

18. The computer program of claim 17, wherein each of the correlithm objects comprises an n-bit digital word of binary values.

19. The computer program of claim 17, wherein:
  the input correlithm object comprises a first input correlithm object;
  the feedback correlithm object comprises a first feedback correlithm object;
  the output correlithm object comprises a first output correlithm object;
  and the processor is further configured to:
    receive a second input correlithm object;
    receive the first output correlithm object as a second feedback correlithm object;
    determine a second first correlithm object in the integrator value table based on the second input correlithm object;
    determine a second second correlithm object in the integrator value table based on the second feedback correlithm object;
    determine a second third correlithm object from the integrator value table based on the determined second first correlithm object and the determined second second correlithm object; and
    output the second third correlithm object as a second output correlithm object.

20. The computer program of claim 19, wherein:
  the first input correlithm object and the second input correlithm object comprise a string correlithm object; and
  the first output correlithm object and the second output correlithm object comprise a second string correlithm object.

* * * * *